(12) United States Patent
Tanuma

(10) Patent No.: US 9,202,989 B2
(45) Date of Patent: *Dec. 1, 2015

(54) LIGHT EMITTING DEVICE AND OPTICAL DEVICE

(71) Applicant: ROHM CO., LTD., Kyoto (JP)

(72) Inventor: Yuki Tanuma, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/474,839

(22) Filed: Sep. 2, 2014

(65) Prior Publication Data

US 2014/0374777 A1  Dec. 25, 2014

Related U.S. Application Data

(63) Continuation of application No. 13/300,002, filed on Nov. 18, 2011, now Pat. No. 8,853,725.

(30) Foreign Application Priority Data

Nov. 19, 2010 (JP) .................................. 2010-258531

(51) Int. Cl.

| H01L 33/00 | (2010.01) |
|---|---|
| H01L 33/48 | (2010.01) |
| H01L 33/58 | (2010.01) |
| H01L 33/60 | (2010.01) |
| H01L 33/62 | (2010.01) |
| H01L 31/167 | (2006.01) |
| H01L 33/52 | (2010.01) |
| H01L 25/075 | (2006.01) |

(52) U.S. Cl.
CPC ............ *H01L 33/483* (2013.01); *H01L 31/167* (2013.01); *H01L 33/52* (2013.01); *H01L 33/58* (2013.01); *H01L 33/60* (2013.01); *H01L 33/62* (2013.01); *H01L 25/0753* (2013.01); *H01L 2224/32225* (2013.01); *H01L 2224/48227* (2013.01); *H01L 2224/48465* (2013.01); *H01L 2224/73265* (2013.01)

(58) Field of Classification Search
CPC ......... H01L 33/54; H01L 33/62; H01L 33/58; H01L 33/647
USPC .............................................. 257/98, 99, 100
See application file for complete search history.

(56) References Cited

U.S. PATENT DOCUMENTS

| 6,496,162 B2 | 12/2002 | Kawakami et al. |
|---|---|---|
| 7,491,980 B2 | 2/2009 | Higaki et al. |

(Continued)

FOREIGN PATENT DOCUMENTS

| JP | 11-074420 | 3/1999 |
|---|---|---|
| JP | 2914097 | 6/1999 |

*Primary Examiner* — Tan N Tran

(74) *Attorney, Agent, or Firm* — Hamre, Schumann, Mueller & Larson, P.C.

(57) ABSTRACT

A light emitting device is capable of enhancing the radiant intensity on a single direction. The light emitting device includes a substrate and an LED chip bonded to the substrate, wherein the substrate has a first cavity formed thereon having a first bottom surface for disposing the LED chip and a first lateral connecting to the first bottom surface, and the substrate has a second cavity formed thereon having a second bottom surface for bonding the metal wire and a second lateral connecting to the second bottom surface; and the first lateral has a notch formed thereon, which connects to the second bottom surface and the second lateral, and an area of the second bottom surface of the second cavity is smaller than that of the first bottom surface of the first cavity.

11 Claims, 50 Drawing Sheets

(56) References Cited

U.S. PATENT DOCUMENTS

| | | | |
|---|---|---|---|
| 7,747,111 B2 | 6/2010 | Yanagisawa | |
| 8,853,725 B2 * | 10/2014 | Tanuma | 257/98 |
| 2004/0201987 A1 | 10/2004 | Omata | |
| 2005/0012108 A1 | 1/2005 | Lin et al. | |
| 2010/0090235 A1 | 4/2010 | Wang et al. | |
| 2010/0163890 A1 | 7/2010 | Miskin | |

* cited by examiner

LIGHT EMITTING DEVICE AND OPTICAL DEVICE

BACKGROUND

1. Field

The present disclosure relates to a light emitting device, a manufacturing method of the light emitting device and an optical device.

2. Description of the Related Art

FIG. 49 is a perspective view illustrating an example of the existing light emitting device (with reference to a patent document of Japanese Patent No. 2914097); and FIG. 50 is a sectional view of a main portion of the light emitting device shown in FIG. 49. The light emitting device 900 shown in these figures comprises a substrate 91, a conductor pattern 92 used to die bond, a conductor pattern 93 used to wire bond, a LED (light-emitting diode) chip 94 and a wire 95.

A cavity 911 used to die bond and a cavity 912 used to dispose the LED are formed on a surface 916 of the substrate 91. The cavity 911 used to die bond is formed on a bottom surface 919 of the cavity 912 used to dispose the LED. The cavity 911 and the cavity 912 are turbinate holder in shape. The lateral 918 of the cavity 911 is a reflecting surface used to reflect the light emitting from the LED chip 94. The conductor pattern 92 extends from the surface 916 of the substrate 91 to a bottom surface 917 of the cavity 911. The conductor pattern 93 extends from the surface 916 of the substrate 91 to the bottom surface 919 of the cavity 912. The LED chip 94 is disposed on the bottom surface 917 of the cavity 911 and electrically conducted with one end of the conductor pattern 92. The wire 95 connects to the LED chip 94 and the conductor pattern 93.

In recent years, an urgent demand for enhancing the radiant intensity in a thickness direction of the substrate 91 in the light emitting device 900 has already existed in the field. Therefore, a solution that deepening the depth of the cavity 911 can be considered. However, the depth of the cavity 911 can only range from the bottom surface 917 to the bottom surface 919 since the cavity 911 is formed on the bottom surface 919 of the cavity 912. Consequently, the light emitting device 900 can not meet the urgent demand owing to the fact that the lateral 918 cannot be increased sufficiently.

SUMMARY

The present disclosure has been proposed under the circumstances described above. It is therefore an objective of the present invention to provide a light emitting device which is capable of enhancing the radiant intensity on a single direction.

A light emitting device provided according to a first aspect of the present disclosure includes a substrate, a lens bonded to the substrate, and a LED chip bonded to the substrate and exposed in a gap is clipped between the substrate and the lens, wherein the lens has a light output surface which bulges in a direction that is defined from the substrate toward the LED chip and is contained in a thickness direction of the substrate to transmit the light emitted from the LED chip.

Preferably, the lens has a light incident surface which is spaced apart from the LED chip in the direction that is defined from the substrate toward the LED chip and is contained in the thickness direction of the substrate to receive the light emitted from the LED chip.

Preferably, the substrate includes a first substrate lateral facing one side of an orthogonal direction with respect to the direction that is defined from the substrate toward the LED chip and is contained in the thickness direction of the substrate and a second substrate lateral facing the opposite side as the first substrate lateral; the lens further includes a first lens lateral located on the same plane as the first substrate lateral and a second lens lateral located on the same plane as the second substrate lateral.

Preferably, there is a vent hole formed and located between the lens and the substrate, which communicates with a space corresponding to the gap and the light output surface.

Preferably, the lens has a groove formed thereon for defining the vent hole.

Preferably, the light emitting device according the present disclosure further includes a front conductor layer formed on the substrate, which has a spacing formed thereon for defining the vent hole.

Preferably, the light emitting device according the present disclosure further includes a bonding layer disposed between the substrate and the lens and used to bond the substrate and the lens together.

Preferably, the bonding layer contains bonding sheet material.

Preferably, the bonding layer contains liquid adhesive.

Preferably, the light emitting device according the present disclosure further includes a back conductor layer formed on one side of the substrate that is opposite to the side of the disposing LED chip, which includes an end surface facing the same side as the first substrate lateral and having a portion spaced apart from the first substrate lateral.

Preferably, the end surface includes another portion located on the same plane as the first substrate lateral.

Preferably, the light incident surface is planar in shape.

Preferably, the light incident surface bulges in the direction defined from the LED chip toward the substrate.

Preferably, the light emitting device according to the present disclosure further includes a front conductor layer formed on the substrate, a metal wire bonded to the front conductor layer and the LED chip, and a protective layer covered a bonding position of the metal wire and the front conductor layer.

Preferably, the substrate has a first cavity formed thereon having a first bottom surface for disposing the LED chip and a first lateral connecting to the first bottom surface.

Preferably, the light emitting device according the present disclosure further includes a metal wire connecting to the LED chip; the substrate further has a second cavity formed thereon having a second bottom surface for bonding the metal wire and a second lateral connecting to the second bottom surface; and the first lateral has a notch formed thereon, which connects to the second bottom surface and the second lateral.

Preferably, the lens has a lens cavity formed thereon, which dents in the direction that is defined from the substrate toward the LED chip and is contained in the thickness direction of the substrate to accommodate the LED chip.

Preferably, the lens cavity includes a cavity lateral which is expanded toward an opening.

Preferably, the light emitting device according the present disclosure further includes a metal wire and a front conductor layer formed on the substrate, wherein the metal wire has a first bonding portion connecting to the front conductor layer and a second bonding portion connecting to the LED chip.

An optical device provided according to a second aspect of the present disclosure includes a light emitting device provided according to the first aspect of the present invention, a circuit substrate and a solder layer used to bond the light emitting device and the circuit substrate together.

Preferably, the light emitting device according the present disclosure further includes a light receiving device installed on the circuit substrate.

A manufacturing method of light emitting device according to a third aspect of the present disclosure includes the steps of: disposing a plurality of LED chips on a base material where the base material is strip in shape and extends along a single direction, which are disposed along a length direction extended from the base material; forming a lens base with a plurality of convex parts; bonding the lens base and the base material together under the condition of superimposing each of the convex parts on any of the LED chips and keeping a gap between them; and cutting the lens base and the base material at a time, which performs between adjacent two of the LED chips along a plane intersecting the length direction.

Preferably, the manufacturing method of light emitting device according the present disclosure further includes the steps of forming a plurality of concave parts on the base material, and then disposing any of the LED chips in each of the concave parts while a disposing step is performed.

Preferably, the manufacturing method of the light emitting device according the present disclosure further includes the steps of forming a plurality of lens cavities on the lens base, and then each of the lens cavities covers any of the LED chips while a bonding step is performed.

Other features and advantages of the present disclosure will become more apparent from the detailed descriptions given below with reference to the accompanying drawings.

Figure 1:
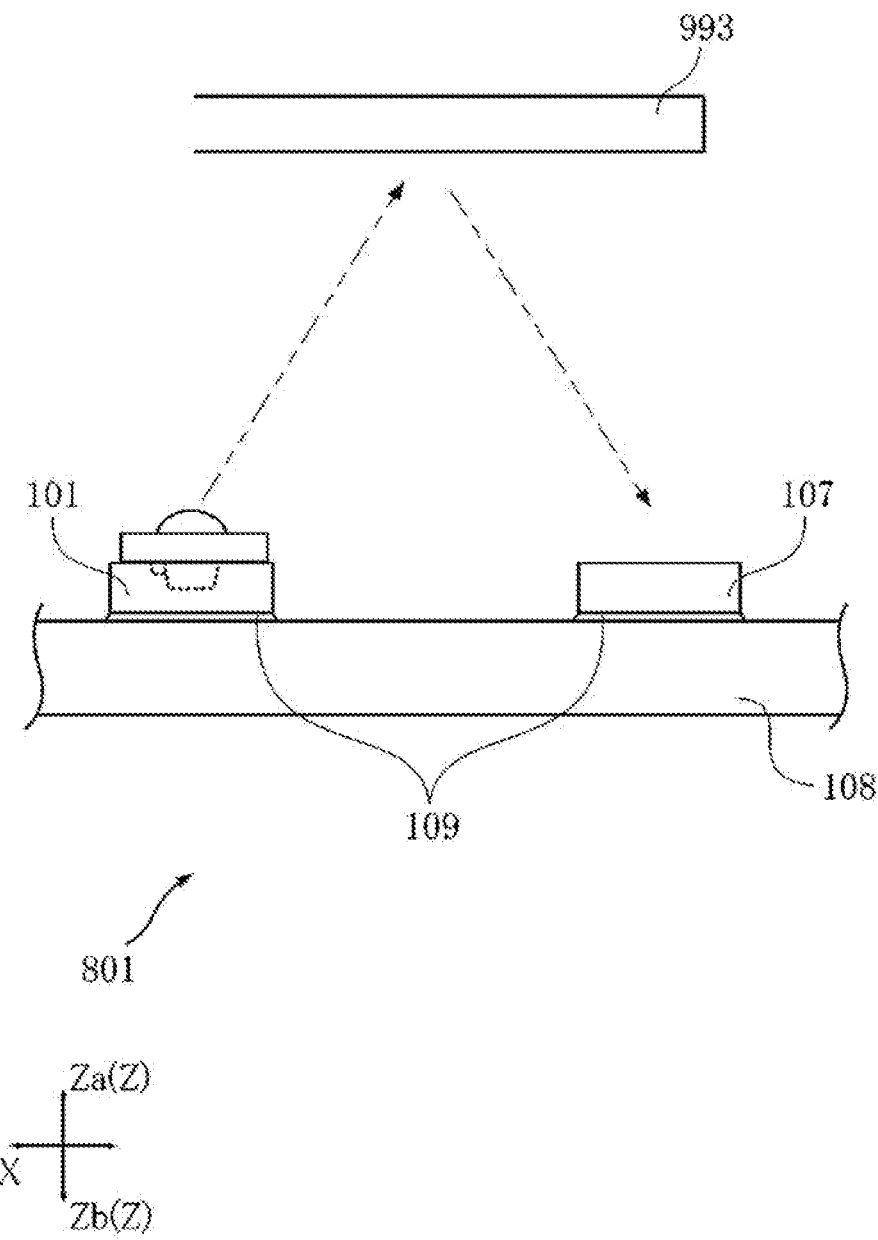
FIG. 1 is a front elevation view of an optical device according to a first embodiment of the present disclosure (local perspective)

Common reference numerals are used throughout the drawings and the detailed description to indicate the same components. The present disclosure will be more apparent from the following detailed descriptions taken in conjunction with the accompanying drawings.

DETAILED DESCRIPTION

First embodiment of the present disclosure is described below with reference to FIGS. 1-23.

FIG. 1 is a front elevation view of an optical device according to a first embodiment of the present disclosure (local perspective). The optical device 801 showing in FIG. 1 is a photointerrupter. The optical device 801 comprises a light emitting device 101, a light receiving device 107, a circuit substrate 108 and a solder layer 109.

The circuit substrate 108 can be a printed circuit board. The circuit substrate 108 comprises an insulation board and a patterned electrode formed on the insulation board. The light emitting device 101 and the light receiving device 107 are installed on the circuit substrate 108. The solder layer 109 is inserted between the light emitting device 101 and the circuit substrate 108 to bond them together, which is also inserted between the light receiving device 107 and the circuit substrate 108 to bond them together.

Figure 2:
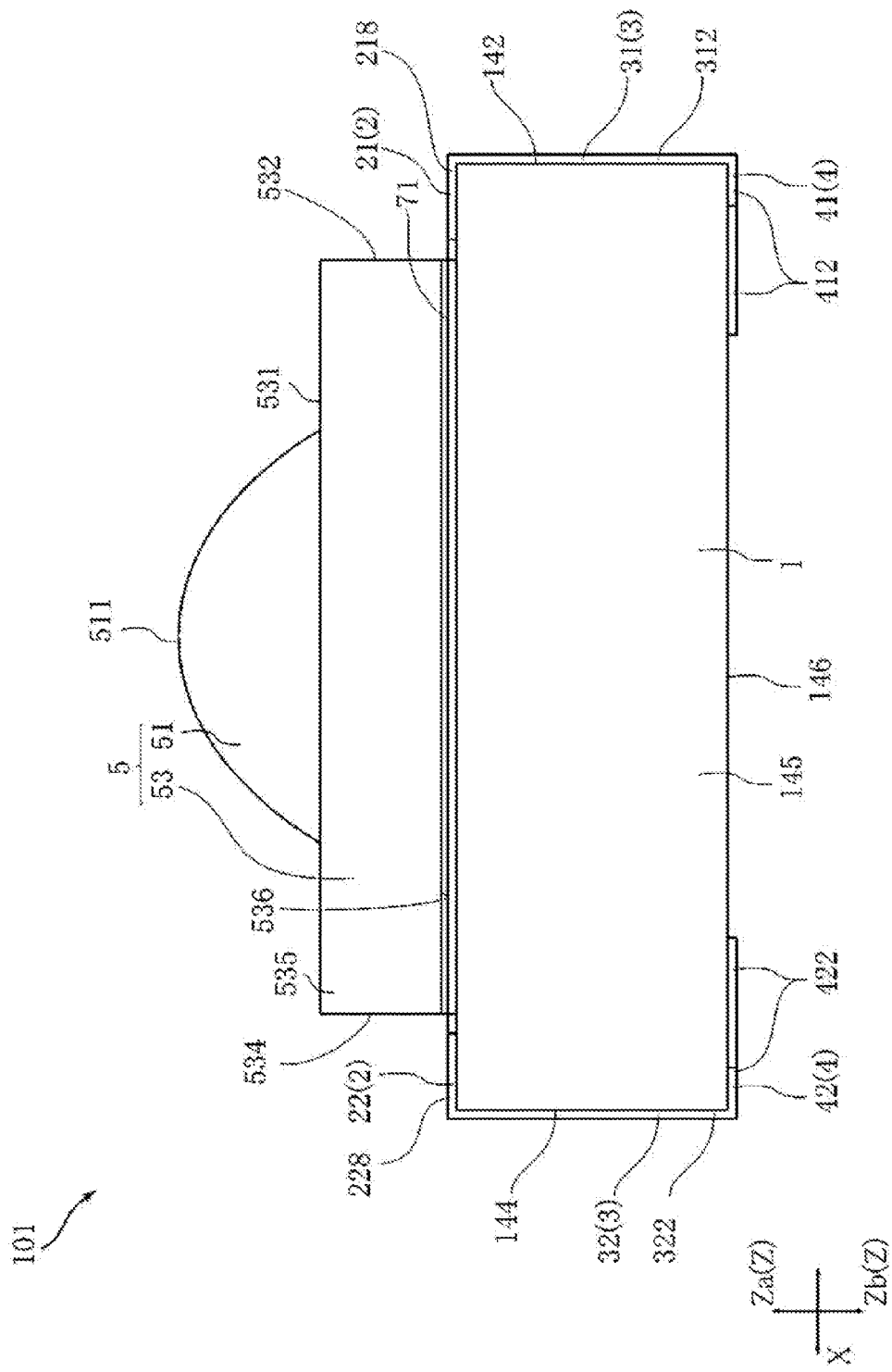
FIG. 2 is a front elevation view of a light emitting device shown in FIG. 1.
Figure 3:
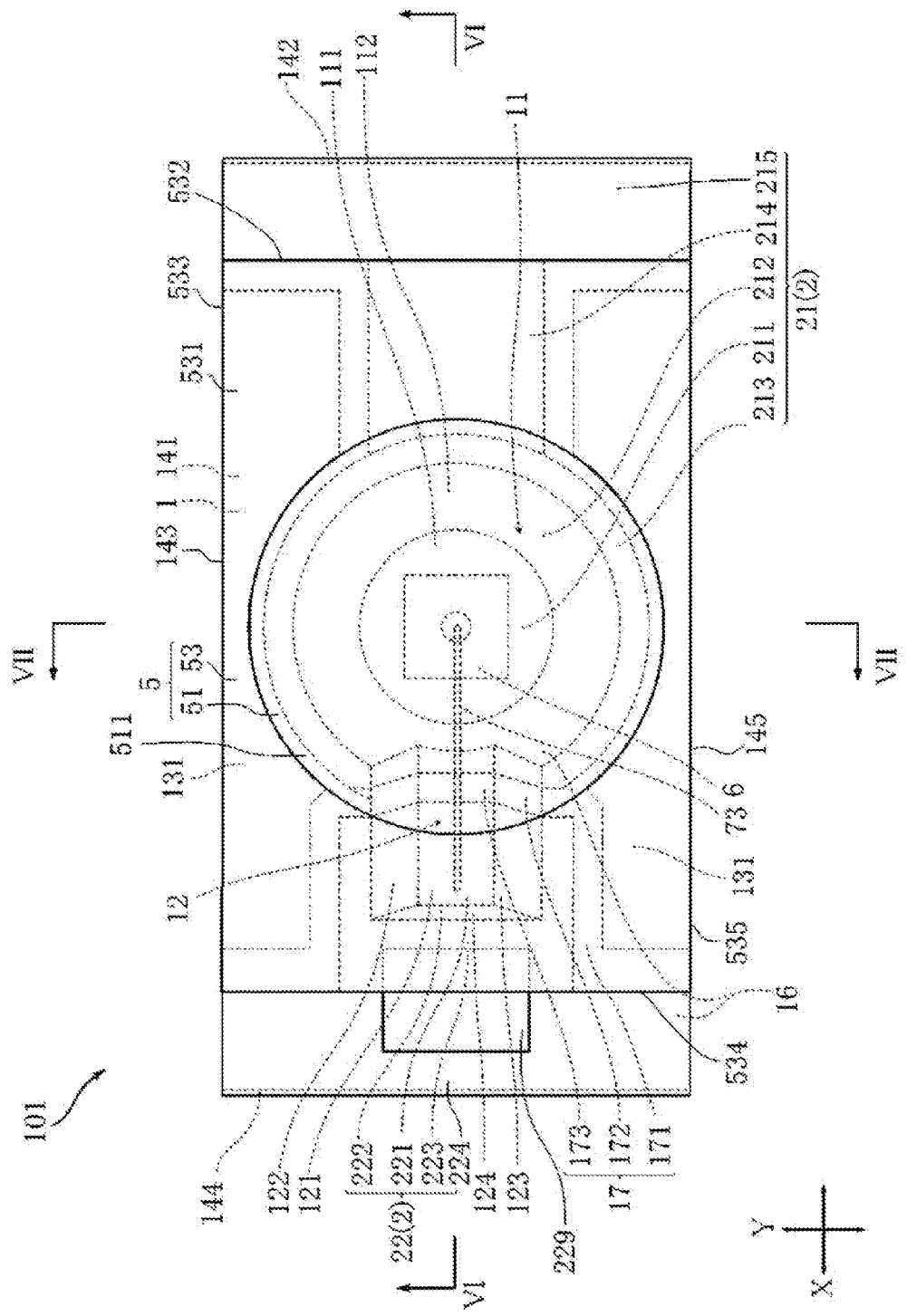
FIG. 3 is a plane view of the light emitting device shown in FIG. 2 (local perspective)
Figure 4:
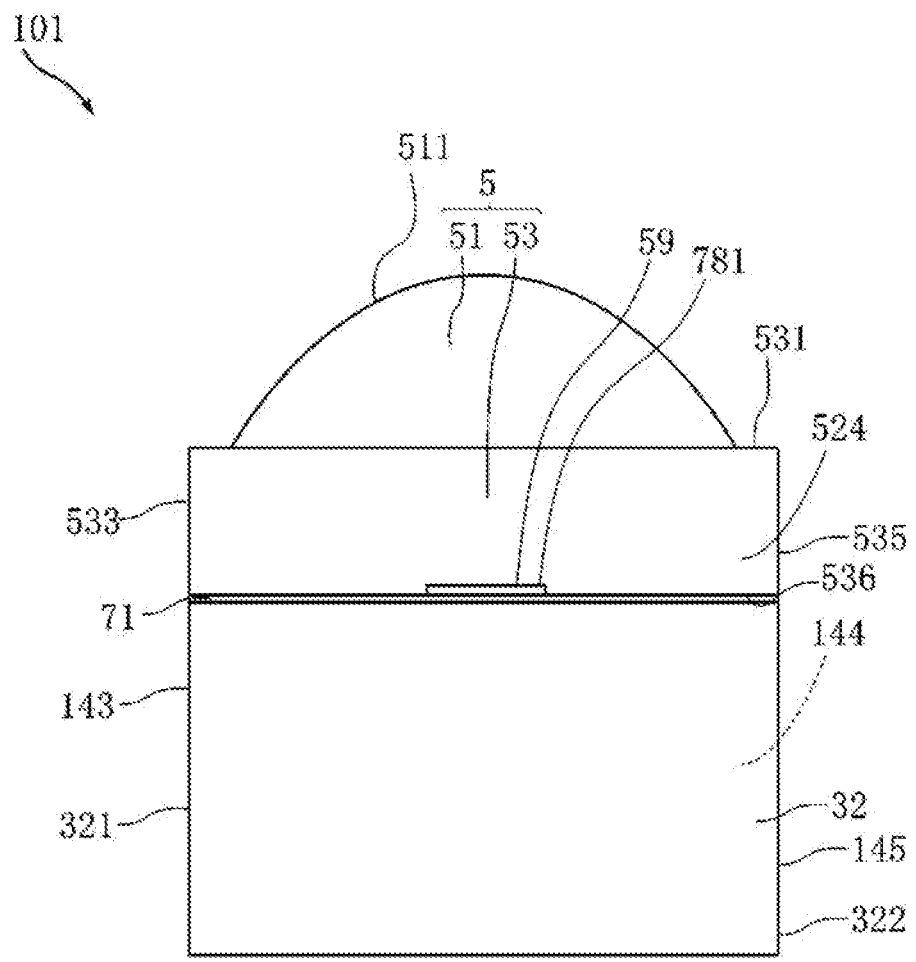
FIG. 4 is a left side view of the light emitting device shown in FIG. 2.
Figure 5:
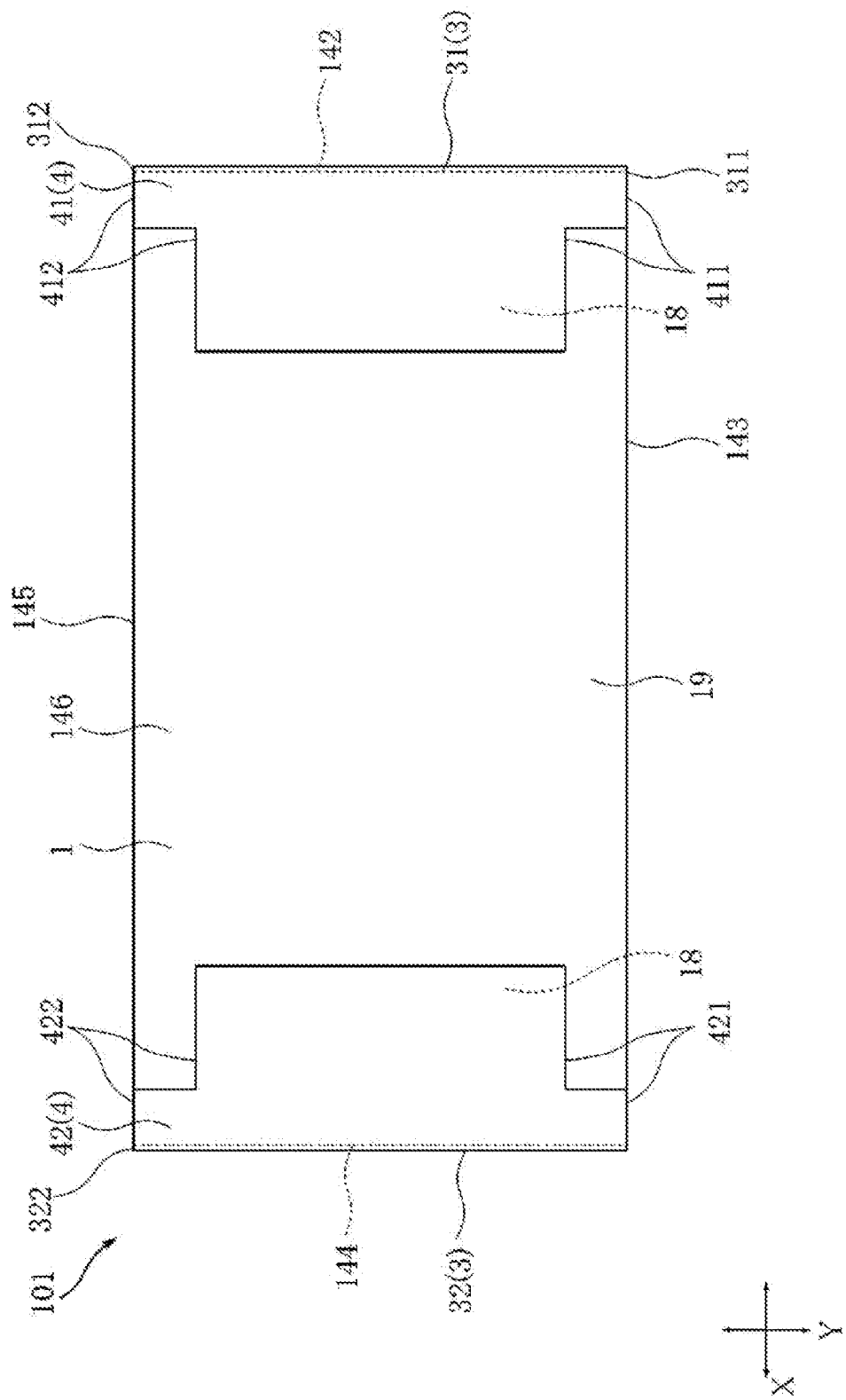
FIG. 5 is a bottom view of the light emitting device shown in FIG. 2.
Figure 6:
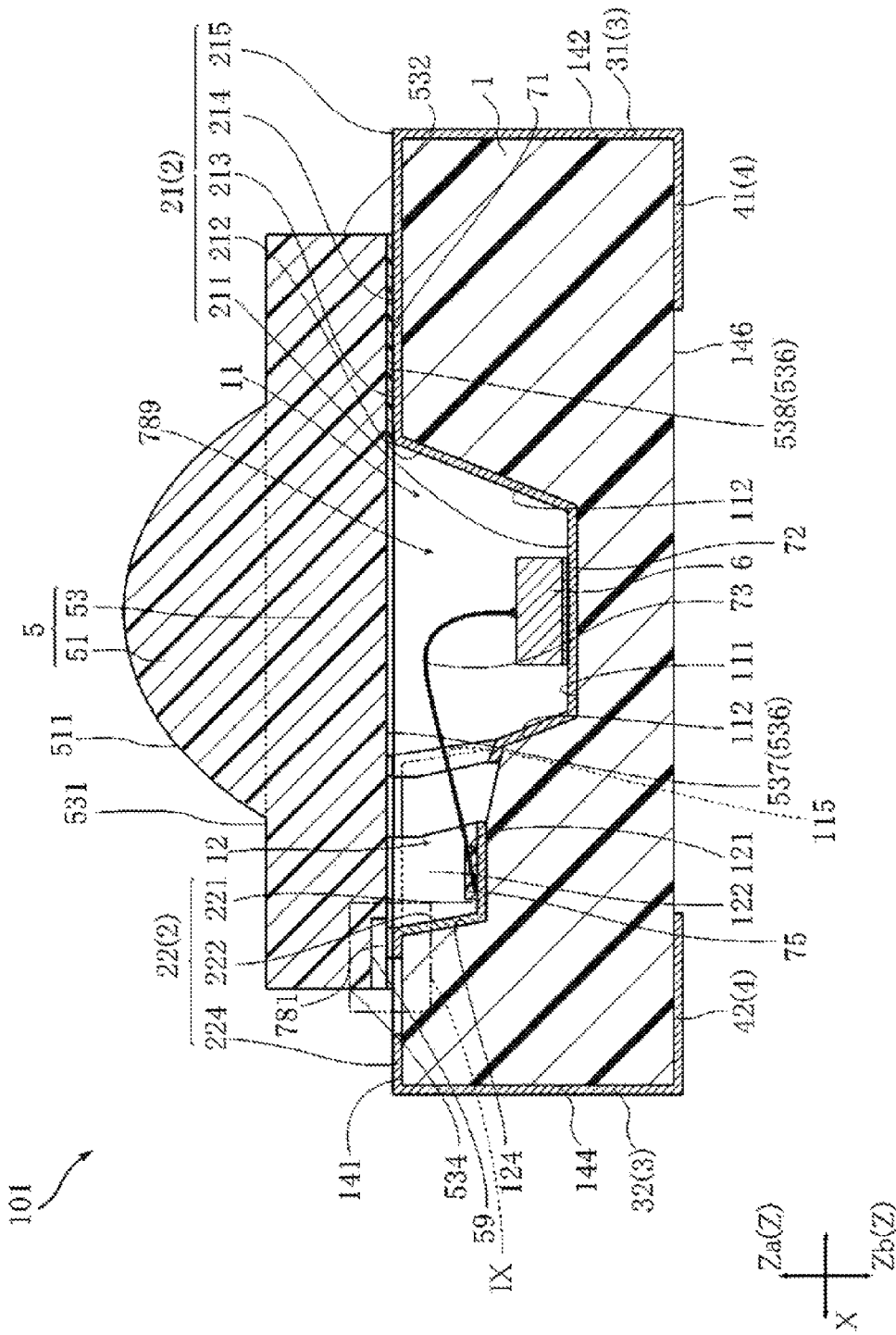
FIG. 6 is a sectional view taken along lines VI-VI of FIG. 3.
Figure 7:
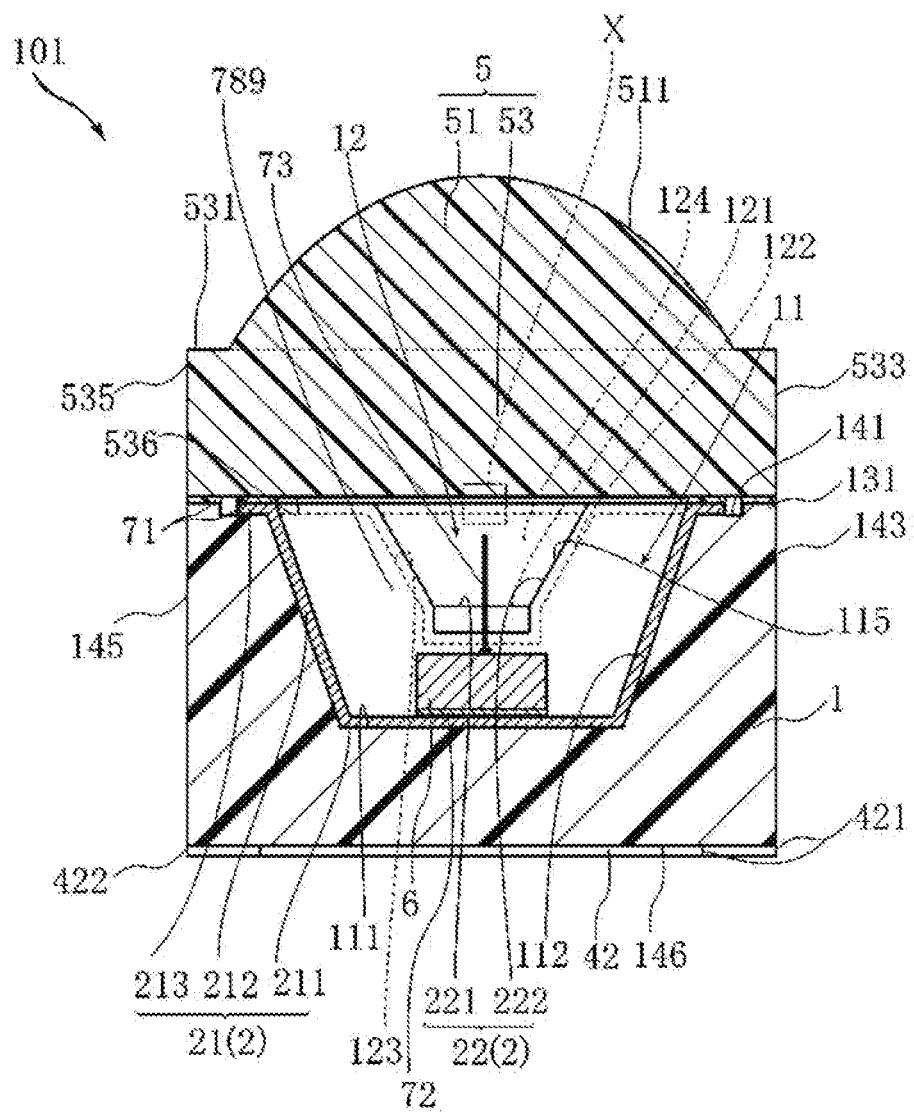
FIG. 7 is a sectional view taken along lines VII-VII of FIG. 3.
Figure 8:
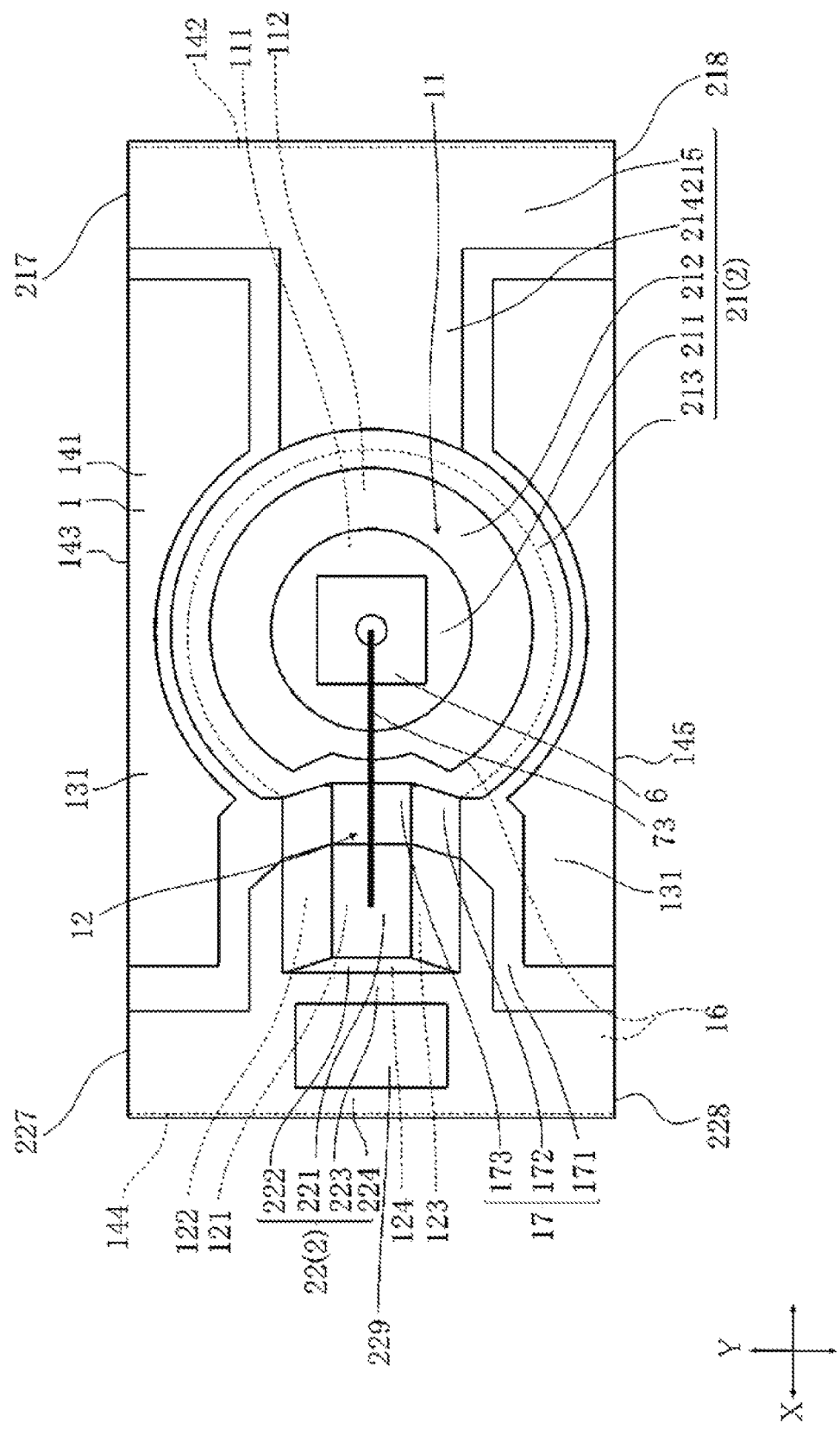
FIG. 8 is a plane view of FIG. 3, with the illustration of the lens and the bonding layer omitted.
Figure 9:
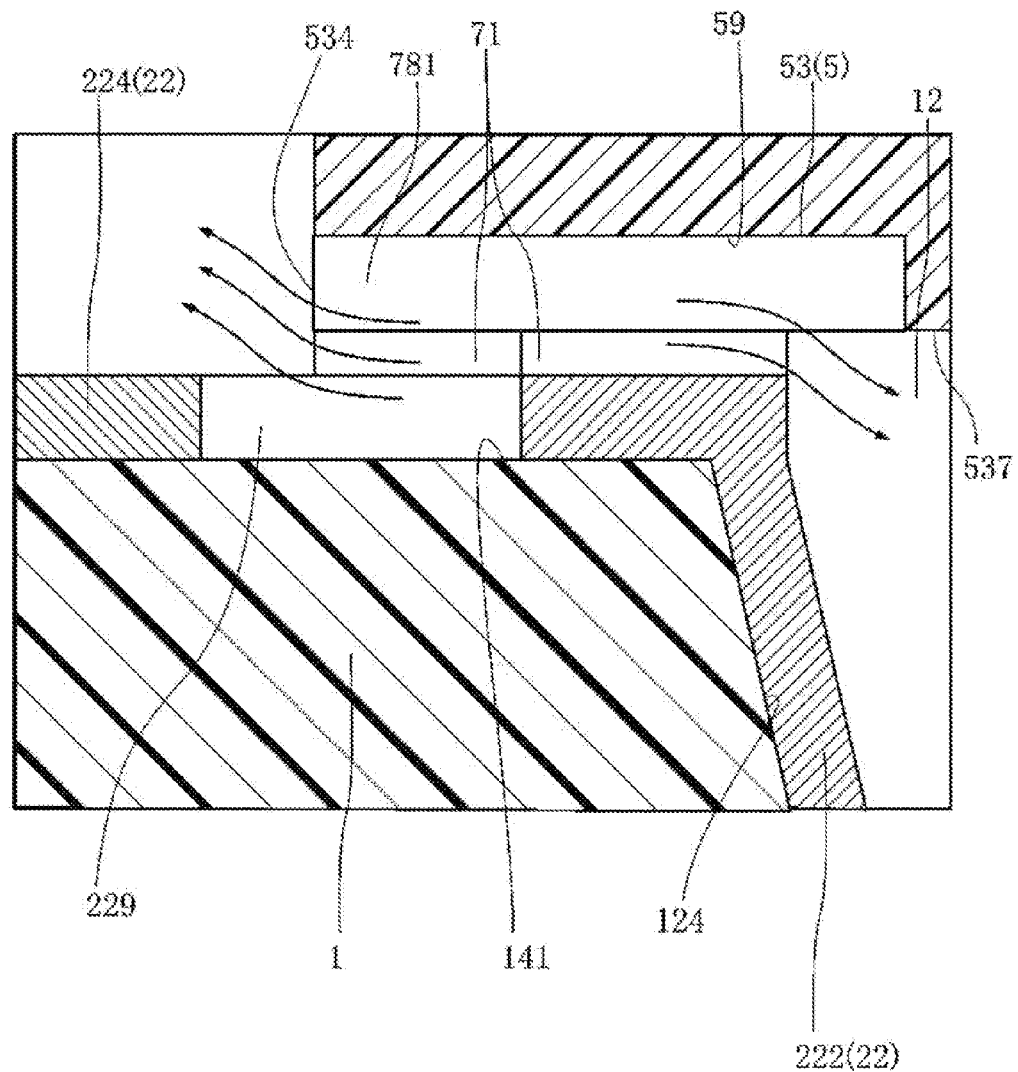
FIG. 9 is an enlarged view illustrating the region IX of FIG. 6.
Figure 10:
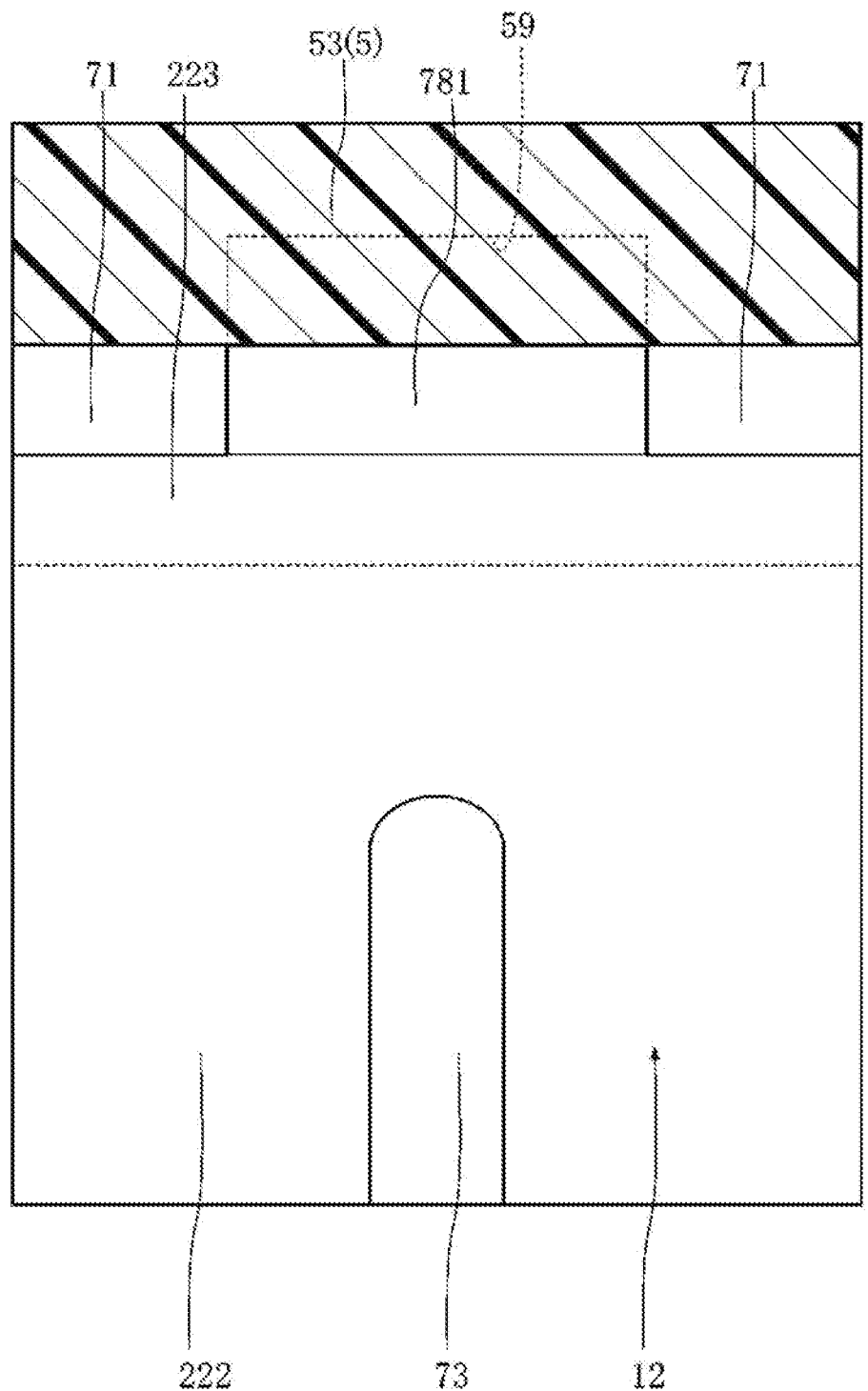
FIG. 10 is an enlarged view illustrating the region X of FIG. 7.
Figure 11:
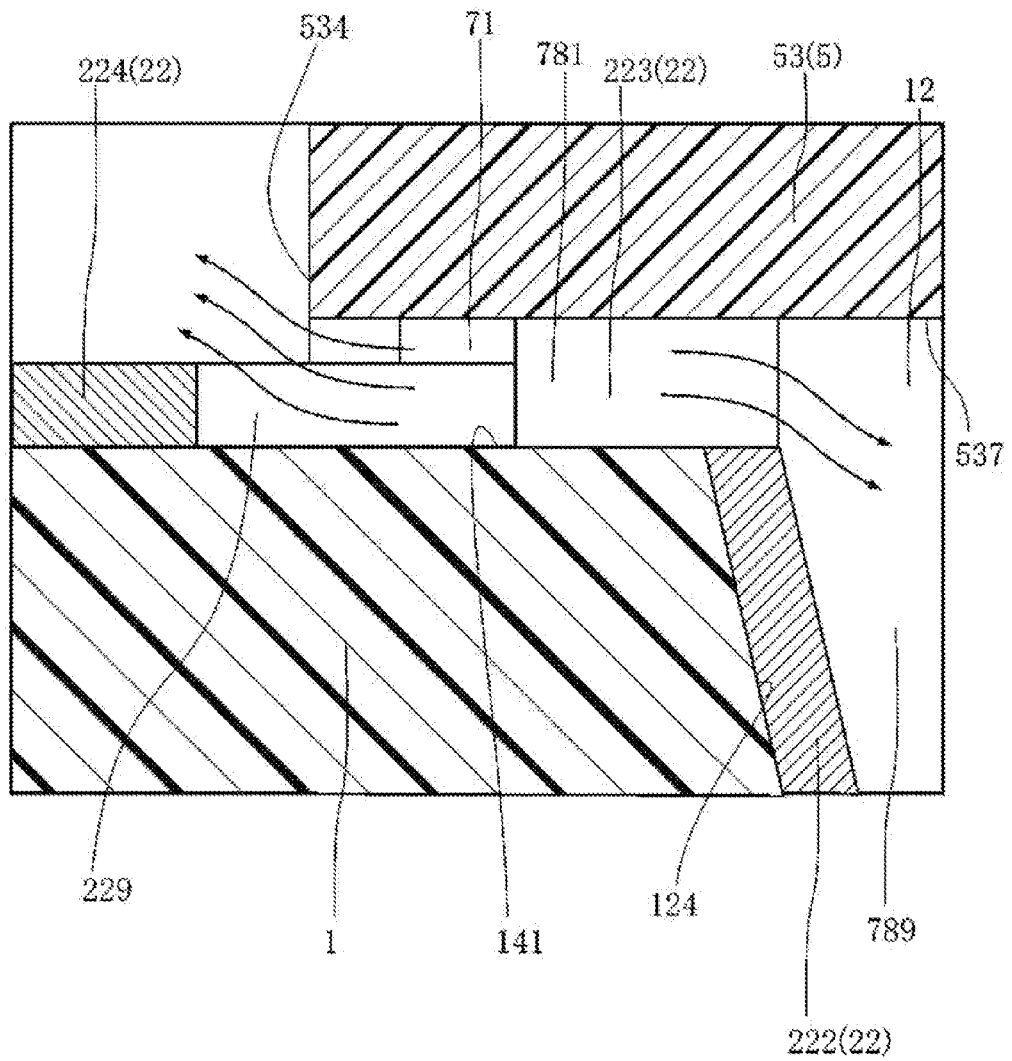
FIG. 11 is a diagram illustrating a special example of the vent hole.

FIG. 2 is a front elevation view of a light emitting device shown in FIG. 1; FIG. 3 is a plane view of the light emitting device shown in FIG. 2 (local perspective); FIG. 4 is a left side view of the light emitting device shown in FIG. 2; FIG. 5 is a bottom view of the light emitting device shown in FIG. 2; FIG. 6 is a sectional view taken along lines VI-VI of FIG. 3; FIG. 7 is a sectional view taken along lines VII-VII of FIG. 3; FIG. 8 is a plane view of FIG. 3 with the illustration of the lens and the bonding layer omitted; FIG. 9 is an enlarged view illustrating the region IX of FIG. 6; and FIG. 10 is an enlarged view illustrating the region X of FIG. 7.

The light emitting device 101 showing in these figures comprises a substrate 1, a front conductor layer 2, a lateral conductor layer 3, a back conductor layer 4, a lens 5, a LED chip 6, a bonding layer 71, a bonding layer 72, a metal wire 73 and a protective layer 75 (only shown in FIG. 6). The light emitting device 101 has a size of around 3.2 mm in X-direction, around 1.6 mm in Y-direction, and around 1.85 mm in Z-direction.

As illustrated in FIGS. 2-8, the substrate 1 is rectangular in shape, which includes an electroplating adhesive resin with insulating property. The electroplating adhesive resin is a resin with electroplating adhesive property, such as liquid crystal polymer. The substrate 1 has a front 141, four substrate laterals 142~145 and a back 146. As illustrated in FIGS. 3, 5 and 8, the substrate 1 has a front covering portion 16, a front exposing portion 17, a back covering portion 18 and a back exposing portion 19. Furthermore, the front covering portion 16 and the front exposing portion 17 will be described after the front conductor layer 2 is described; and the back covering portion 18 and the back exposing portion 19 will be described after the back conductor layer 4 is described.

The front 141 faces one side of a thickness direction Z (an upward-direction as shown in FIG. 6, hereafter as "direction Za"); and the back 146 faces another side of the thickness direction Z (a downward-direction as shown in FIG. 6, hereafter as "direction Zb"). The substrate lateral 142 faces one side of a direction X (a rightward-direction as shown in FIG. 3); and the substrate lateral 144 faces another side of the direction X (a leftward-direction as shown in FIG. 3). The substrate lateral 143 faces one side of a direction Y (an upward-direction as shown in FIG. 3); and the substrate lateral 145 faces another side of the direction Y (a downward-direction as shown in FIG. 3). All of the substrate laterals 142-145 connect to the front 141 and the back 146. Moreover, the substrate lateral 142 connects to the substrate lateral 143, the substrate lateral 143 connects to the substrate lateral 144, the substrate lateral 144 connects to the substrate lateral 145, and the substrate lateral 145 connects to the substrate lateral 142, respectively.

As illustrated in FIGS. 3 and 6-8, the substrate 1 has a first cavity 11 and a second cavity 12, both of which are formed thereon. The first cavity 11 and the second cavity 12 are dented from the front 141. The first cavity 11 can be paraboloidal or pyramidal in shape; it is preferably paraboloidal. The first cavity 11 has a first bottom surface 111 and a first lateral 112, wherein the first bottom surface 111 is circular in shape and has a diameter of around 0.635 mm. As illustrated in FIG. 6, the first lateral 112 connects to the first bottom surface 111 and the front 141. The first lateral 112 has a notch 115 formed thereon and dented from the front 141 (referring to FIGS. 6 and 7). Furthermore, the first lateral 112 includes a part defined from the first bottom surface 111 to the front 141 and a lower part defined from the first bottom surface 111 to a position with a height lower than the front 141.

The second cavity 12 stands side by side with the first cavity 11 along the direction X. In the present embodiment, the second cavity has a shape of pyramidal holder, including but not limited to the use of other shapes, such as conical holder. The second cavity 12 has a second bottom surface 121 and three second lateral 122-124. The second bottom surface 121 is rectangular in shape and has a size of around 0.32 mm in direction X and around 0.26 mm in direction Y. The area of the second bottom surface 121 is smaller than that of the first bottom surface 111. The second bottom surface 121 is located at a position that is closer to the front 141 than the first bottom surface 111 to the front 141. The second bottom surface 121 also connects to the notch 115.

As illustrated in FIGS. 7 and 8, the second laterals 122, 123 face to each other and connect to the notch 115. The second laterals 122, 123 are respectively defined from the edge extended in the direction X of the second bottom surface 121 to the front 141. The figure also shows that there is an included angle of 120 degree formed between the second laterals 122, 123 and the second bottom surface 121. As illustrated in FIGS. 3 and 6-8, the second lateral 124 is defined from the edge extended in the direction Y of the second bottom surface 121 to the front 141. As illustrated in FIG. 6, there is an included angle of 100 degree formed between the second lateral 124 and the second bottom surface 121. The second lateral 124 connects to the second laterals 122, 123.

As illustrated in FIG. 8, the substrate 1 has a bulging portion 131 formed thereon. The bulging portion 131 is formed on the front 141 of the substrate 1 and bulges in the direction Za. The bulging portion 131 can be used as the base served to suitably install the dust-proof sheet on the LED chip 6 and the metal wire 73 in the manufacturing process of the light emitting device 101 mentioned below.

As illustrated in FIG. 8, the front conductor layer 2 is formed on the front 141 of the substrate 1. The front conductor layer 2 is composed of a Cu layer, a Ni layer and an Au layer, which are stacked on the substrate 1 in sequence. The front conductor layer 2 comprises a first front electrode 21 and a second front electrode 22. The first front electrode 21 and the second front electrode 22 are respectively located at the right side and the left side of FIG. 8. Additionally, the first front electrode 21 and the second front electrode 22 are spaced apart from each other and insulated from each other.

As illustrated in FIGS. 6 and 8, the first front electrode 21 has a bottom electrode 211, an inner electrode 212, a frame portion 213, a middle portion 214 and a strip portion 215.

The bottom electrode 211 is formed on the first bottom surface 111 and is circular in shape. The inner electrode 212 is formed on the first lateral 112 and connects to the bottom electrode 211. Additionally, the inner electrode 212 is formed on the location between the second bottom surface 121 and the second laterals 122, 123 and near the first cavity 11. The frame portion 213 is formed and located on the outside of the first cavity 11 shown in the XY vertical view of the front 141 and connects to the inner electrode 212. The middle portion 214 is located between the frame portion 213 and the strip portion 215 and connects to the frame portion 213 and the strip portion 215.

As illustrated in FIG. 8, the strip portion 215 is formed on one end of the front 141 in the direction X and extended along the direction Y. The strip portion 215 has two end surfaces 217, 218. The end surface 217 faces the same side as the substrate lateral 143 and is located on the same plane as the substrate lateral 143. The end surface 218 faces the same side as the substrate lateral 145 and is located on the same plane as the substrate lateral 145.

As illustrated in FIGS. 6 and 8, the second front electrode 22 has a bottom electrode 221, an inner electrode 222, a frame portion 223 and a strip portion 224.

The bottom electrode 221 is formed on the second bottom surface 121 and covers almost the entire second bottom surface 121. The bottom electrode 221 does not connect to the inner electrode 212 and is also spaced apart from the inner electrode 212. The inner electrode 222 is formed on the second laterals 122-124 and covers the entire second lateral 124 and almost the entire second laterals 122, 123, respectively. The inner electrode 222 does not connect to the inner electrode 212 and is also spaced apart from the inner electrode 212. The inner electrode 222 further connects to the bottom electrode 221. The frame portion 223 has a shape of surrounding the second cavity 12 and connects to the inner electrode 222 and to the bottom electrode 221. The frame portion 223 has two parts extended along the direction X and a strip part connected to the two parts and extended along the direction Y.

The strip portion 224 is formed on one end of the substrate 1 in the direction X and extended along the direction Y. The strip portion 224 connects to the frame portion 223 and has two end surfaces 227, 228. The end surface 227 faces the same side as the substrate lateral 143 and is located on the same plane as the substrate lateral 143. The end surface 228 faces the same side as the substrate lateral 145 and is located on the same plane as the substrate lateral 145. Additionally, there is an interval 229 formed between the strip portion 224 and the frame portion 223 (on the front conductor layer 2).

As illustrated in FIG. 8, the front covering portion 16 is a portion of the substrate 1 that covers the front conductor layer 2; and the front exposing portion 17 is a portion of the front 141 that does not cover the front conductor layer 2. The front exposing portion 17 has the same material (electroplating adhesive resin) as the front covering portion 16. As aforementioned, the first front electrode 21 and the second front electrode 22 are insulated through forming the front exposing portion 17. The front exposing portion 17 has a front exposing region 171, an inner exposing region 172 and a bottom exposing region 173.

The front exposing region 171 is a region of the front exposing portion 17 used to construct the front 141. The front exposing region 171 is located at the two sides of the first cavity 11 and the second cavity 12 in the direction Y (the top-side and bottom-side of FIG. 8). Furthermore, the front exposing region 171 has a part exposed in the interval 229.

The inner exposing region 172 is a region of the front exposing portion 17 used to construct the second laterals 122, 123. The inner electrode 222 and the inner electrode 212 are spaced through the inner exposing region 172. The inner exposing region 172 has a shape along the notch 115 and is defined from the front 141 to the second bottom surface 121.

The bottom exposing region 173 is a region of the front exposing portion 17 used to construct the second bottom surface 121. The bottom exposing region 173 is located at one end of the second bottom surface 121 near the first cavity 11. The bottom electrode 221 and the inner electrode 212 are spaced through the bottom exposing region 173. The bottom exposing region 173 is strip in shape and extends along the direction Y. The bottom exposing region 173 connects to the inner exposing region 172.

As illustrated in FIGS. 2 and 4-6, the lateral conductor layer 3 comprises a first lateral electrode 31 and a second lateral electrode 32. The first lateral electrode 31 is formed on the substrate lateral 142 and covers the entire substrate lateral 142. The first lateral electrode 31 connects to the strip portion 215 that allows the first lateral electrode 31 to electrically conduct with the first front electrode 21. The first lateral electrode 31 has two end surfaces 311, 312. The end surface 311 faces the same side as the substrate lateral 143 and is located on the same plane as the substrate lateral 143. The end surface 312 faces the same side as the substrate lateral 145 and is located on the same plane as the substrate lateral 145.

The second lateral electrode 32 is formed on the substrate lateral 144 and covers the entire substrate lateral 144. The second lateral electrode 32 connects to the strip portion 224 that allows the second lateral electrode 32 to electrically conduct with the second front electrode 22. The second lateral electrode 32 has two end surfaces 321, 322. The end surface 321 faces the same side as the substrate lateral 143 and is located on the same plane as the substrate lateral 143. The end surface 322 faces the same side as the substrate lateral 145 and is located on the same plane as the substrate lateral 145.

As illustrated in FIG. 5, the back conductor layer 4 is formed on the back 146 of the substrate 1. The back conductor layer 4 comprises a first back electrode 41 and a second back electrode 42.

The first back electrode 41 connects to the first lateral electrode 31 that allows the first back electrode 41, the first lateral electrode 31 and the first front electrode 21 to electrically conduct with each other. On the other hand, the second back electrode 42 connects to the second lateral electrode 32 that allows the second back electrode 42, the second lateral electrode 32 and the second front electrode 22 to electrically conduct with each other.

The first back electrode 41 and the second back electrode 42 have a shape of protruding toward the center of the back 146. Specifically, the first back electrode 41 has two end surfaces 411, 412. The end surface 411 faces the same side as the substrate lateral 143 of the substrate 1. The end surface 411 has a portion spaced apart from the substrate lateral 143 and another portion located on the same plane as the substrate lateral 143 and at one end of the back 146 in the direction X. On the other hand, the end surface 412 faces the same side as the substrate lateral 145 of the substrate 1. The end surface 412 has a portion spaced apart from the substrate lateral 145 and another portion located on the same plane as the substrate lateral 145 and at one end of the back 146 in the direction X.

Correspondingly, the second back electrode 42 also has two end surfaces 421, 422. The end surface 421 faces the same side as the substrate lateral 143 of the substrate 1. The end surface 421 has a portion spaced apart from the substrate lateral 143 and another portion located on the same plane as the substrate lateral 143 and on one end of the back 146 in the direction X. On the other hand, the end surface 422 faces the same side as the substrate lateral 145 of the substrate 1. The end surface 422 has a portion spaced apart from the substrate lateral 145 and another portion located on the same plane as the substrate lateral 145 and on one end of the back 146 in the direction X.

The lateral conductor layer 3 and the back conductor layer 4 are the same as the front conductor layer 2 that is composed of a Cu layer, a Ni layer and an Au layer, which are stacked on the substrate 1 in sequence.

As illustrated in FIG. 5, the back covering portion 18 is a portion of the substrate 1 that covers the back conductor layer 4; the back exposing portion 19 is a portion of the back 146 that does not cover the back conductor layer 4. The back exposing portion 19 has the same material (electroplating adhesive resin) as the back covering portion 18.

As illustrated in FIG. 6, the LED chip 6 is bonded to the substrate 1. Specifically, the LED chip 6 is disposed on the first bottom surface 111 of the first cavity 11 via the front conductor layer 2 (it is the bottom electrode 211 in the present embodiment). The LED chip 6 comprises an n-type semiconductor layer, a p-type semiconductor layer, an active layer clipped between the semiconductor layers and emitting the light, a partial electrode and an entire electrode. The LED chip 6 is rectangular in shape showing in XY vertical view and emits much light from the lateral and the upper surface as shown in FIG. 6. The LED chip 6 emits infrared light in the present embodiment. One side of the LED chip 6 is around 0.3 mm. The entire electrode is located at a side of the LED chip 6 near the bottom electrode 211. On the other hand, the partial electrode is located at other side of the LED chip 6 opposite to the side near the bottom electrode 211. The LED chip 6 of the present embodiment is a 1-wire chip that connects to a metal wire 73. The LED chip 6 also can be a 2-wire chip that connects to two metal wires or a wire-free flip chip type.

The bonding layer 72 is disposed between the LED chip 6 and the front conductor layer 2 (and it is the bottom electrode 211 in the present embodiment). The bonding layer 72 is used to bond the LED chip 6 and the substrate 1 together that allows the LED chip 6 to be fixed with respect to the substrate 1. The bonding layer 72 contains conductive material, such as silver paste. Therefore, the LED chip 6 electrically conducts with the bottom electrode 211 via the bonding layer 72.

The metal wire 73 connects to the LED chip 6 and the bottom electrode 221 and allows the LED chip 6 to electrically conduct with the bottom electrode 221. The protective layer 75 covers a bonding position of the metal wire 73 and the front conductor layer 2. The protective layer 75 is used to protect the bonding position of the metal wire 73 and the front conductor layer 2 from damage and it contains silicone or epoxy resin.

As illustrated in FIG. 6, the lens 5 is disposed on the front 141 of the substrate 1. The lens 5 contains thermosetting epoxy resin or black resin capable of preventing the transmission of the visible light. In the present embodiment, the lens 5 allows the light (and it is the infrared light in the present embodiment) emitted from the LED chip 6 to transmit. The lens 5 has a refractive index of 1.3~1.7 and comprises a convex part 51 and a base part 53.

The convex part 51 has a light output surface 511 which bulges in the direction Za (upward-direction of FIG. 6) that is defined from the substrate 1 toward the LED chip 6 and is contained in the thickness direction Z of the substrate 1. The light output surface 511 transmits the light emitted from the LED chip 6 while the light emitting device 101 is used. As illustrated in FIG. 3, the light output surface 511 overlaps the first cavity 11 when viewed from the direction Z. In the present embodiment, the light output surface 511 is circular in shape when viewed from the direction Z. The lens 5 defines a line extended along the direction Z as an optical axis. Therefore, the light output surface 511 is rotationally symmetrical in shape while the line extended along the direction Z is used as the axis. Furthermore, the light output surface 511 is a mirror-like surface (a smooth surface without forming concave or convex shape), thereby restraining diffuse reflection or scattering from occurring on the light output surface 511. The curvature of the convex part 51 is confirmed as an anticipated value according to the shape of the first cavity 11.

As illustrated in FIGS. 2-4, 6 and 7, the base part 53 is platy in shape and covers the first cavity 11. The base part 53 is located between the first cavity 11 and the light output surface 511 and has a first surface 531, four lens laterals 532~535 and a second surface 536.

The first surface 531 faces the direction Za (upward-direction of FIG. 6) that is defined from the substrate 1 toward the LED chip 6 and is contained in the thickness direction Z. The lens lateral 532 faces the same direction as the substrate lateral 142 of the substrate 1. The lens lateral 534 faces the same direction as the substrate lateral 144 of the substrate 1. The lens lateral 533 faces the same direction as the substrate lateral 143 of the substrate 1 and is located on the same plane as the substrate lateral 143. The lens lateral 535 faces the same direction as the substrate lateral 145 of the substrate 1 and is located on the same plane as the substrate lateral 145. The entire lens laterals 532-535 connect to the first surface 531 and the second surface 536. Moreover, the lens lateral 532 connects to the lens lateral 533; the lens lateral 533 connects to the lens lateral 534; the lens lateral 534 connects to the lens lateral 535; and, the lens lateral 535 connects to the lens lateral 532, respectively.

The first surface 531 and the lens laterals 532, 534 are a rough surface (after satin finishing) with tiny concave-convex shape. The lens laterals 532, 534 also can be the mirror-like surfaces. The first surface 531 and the lens laterals 532, 534 become the rough surfaces to enable a lens base 86 (as mentioned below) that is used to form the lens 5 to be removed easily from the mold that is used to form the lens base 86. The height difference between the tiny concave and convex (ten-point mean roughness Rz) on each of the surfaces is 1~2 μm.

The second surface 536 faces the opposite side as the first surface 531. In the present embodiment, the second surface 536 is planar in shape that extends toward the XY plane. Furthermore, the second surface 536 is a mirror-like surface and has a light incident surface 537 and a bonding surface 538. The light incident surface 537 is a surface of the second surface 536 facing the first cavity 11 and the second cavity 12. The light incident surface 537 receives the light emitted from the LED chip 6 and is located between the light output surface 511 and the LED chip 6. In the present embodiment, the light incident surface 537 is spaced apart from the LED chip 6 in the direction Za that is defined from the substrate 1 toward the LED chip 6 and is contained in the thickness direction Z. A gap 789 is formed between the light incident surface 537 and the first cavity 11 or the second cavity 12, which is clipped between the lens 5 and the substrate 1. The light incident surface 537, the LED chip 6, the metal wire 73, the bottom electrode 211, the inner electrode 212, the bottom electrode 221 and the inner electrode 222 are exposed in the gap 789. The bonding surface 538 is a surface of the second surface 536 connecting to a bonding layer 71 (as mentioned below). In the present embodiment, the lens 5 has a groove 59 formed thereon, which dents from the bonding surface 538 toward the direction Za.

The bonding layer 71 is located between the lens 5 and the substrate 1 and is used to fix the lens 5 to the substrate 1. Specifically, the bonding layer 71 is used to bond the bonding surface 538 of the lens 5 and the front conductor layer 2 or the bulging portion 131. The bonding layer 71 contains bonding sheet material or liquid adhesive. The bonding sheet material can be an epoxy sheet material, a thermosetting sheet material or a thermoplastic sheet material. The liquid adhesive can be an UV-curable adhesive or an acrylic adhesive.

As illustrated in FIG. 9, there is a vent hole 781 formed on the light emitting device 101. The vent hole 781 communicates with a space (the exterior space of the light emitting device 101) corresponding to the gap 789 and the light output surface 511. Therefore, the air can pass the vent hole 781 and flow between the gap 789 and the exterior space of the light emitting device 101. Furthermore, the vent hole 781 is formed and located between the lens 5 and the substrate 1. In the present embodiment, the vent hole is defined by the groove 59. In another embodiment, the vent hole 781 can be defined without the use of the groove 59. For example, without forming the groove on the lens 5, a spacing formed on the front conductor layer 2 can be used to define the vent hole 781 (referring to FIG. 11).

The manufacturing method of the light emitting device 101 is described below with reference to FIGS. 12-23.

Figure 17:
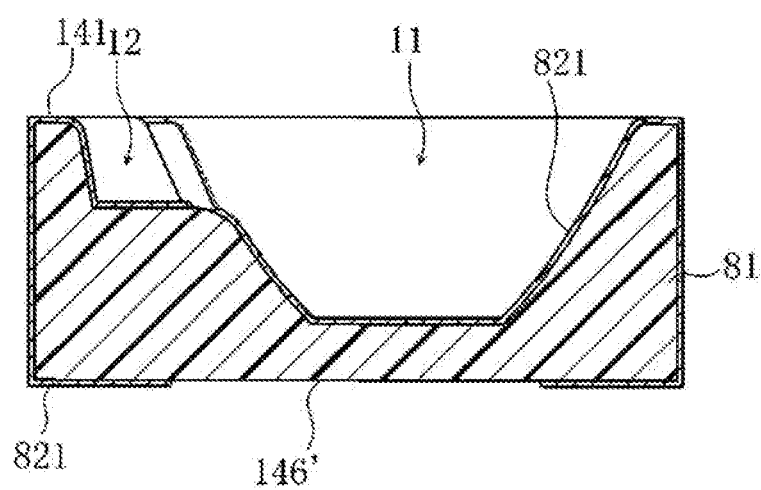
FIG. 17 is a sectional view taken along lines α-α of FIG. 16.
Figure 18:
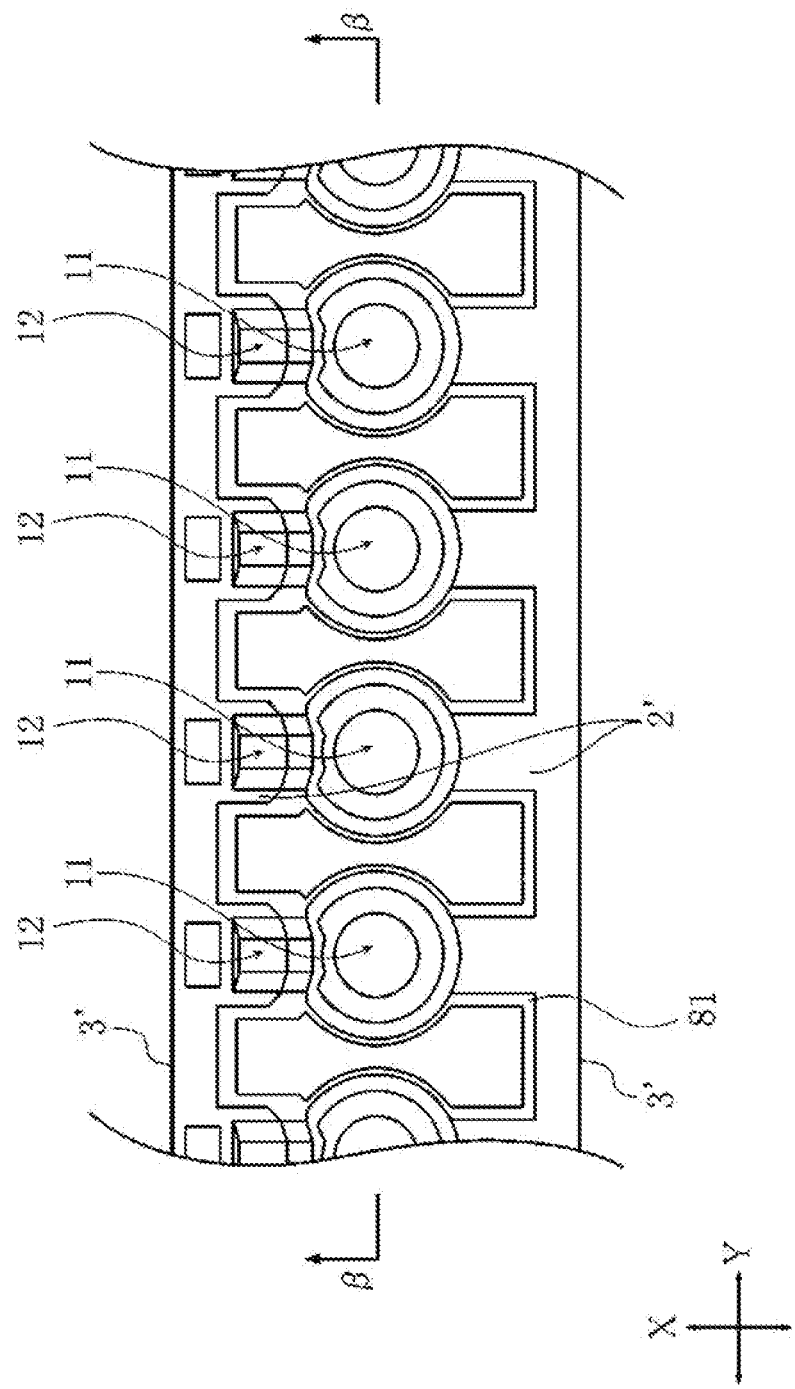
FIG. 18 is a plane view illustrating a main portion in a step of a manufacturing method of the light emitting device according to the first embodiment of the present disclosure.
Figure 19:
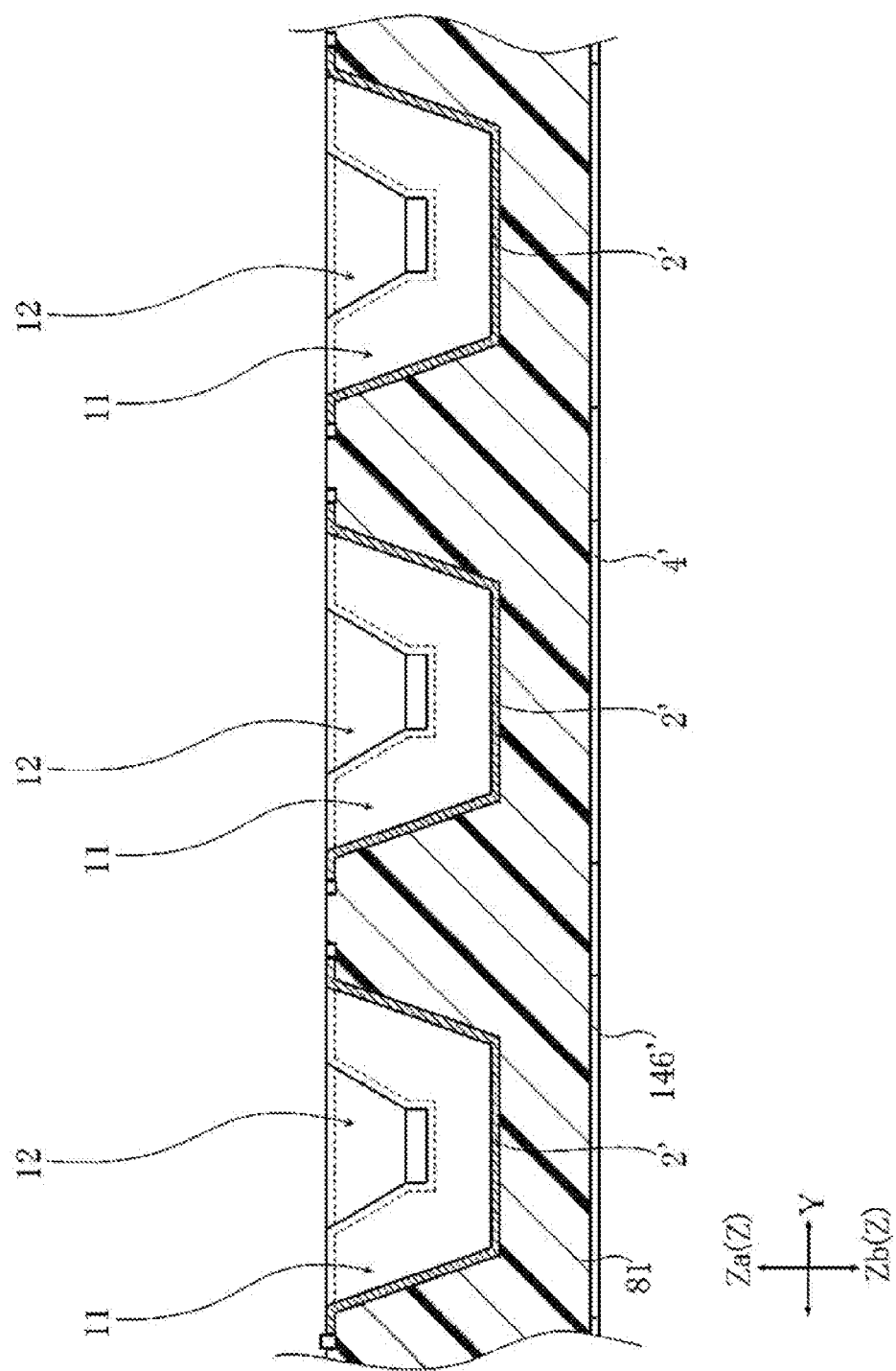
FIG. 19 is a sectional view of the main portion taken along lines β-β of FIG. 18.

As illustrated in FIGS. 18 and 19, a front conductor layer 2', a lateral conductor layer 3' and a back conductor layer 4' are formed on a base material 81 that forms a plurality of the first cavity 11. In the present embodiment, a laser patterning method is used to form the front conductor layer 2', the lateral conductor layer 3' and the back conductor layer 4' on the base material 81. First, the steps of forming the front conductor layer 2' and so forth on the base material 81 by using the laser patterning method and manufacturing the structure shown in FIGS. 18 and 19 are described with reference to FIGS. 12-17. Moreover, FIGS. 12-17 are used to illustrate the laser patterning method. The shape of the base material 81 shown in FIGS. 12-17 is different from that shown in FIG. 23.

Figure 12:
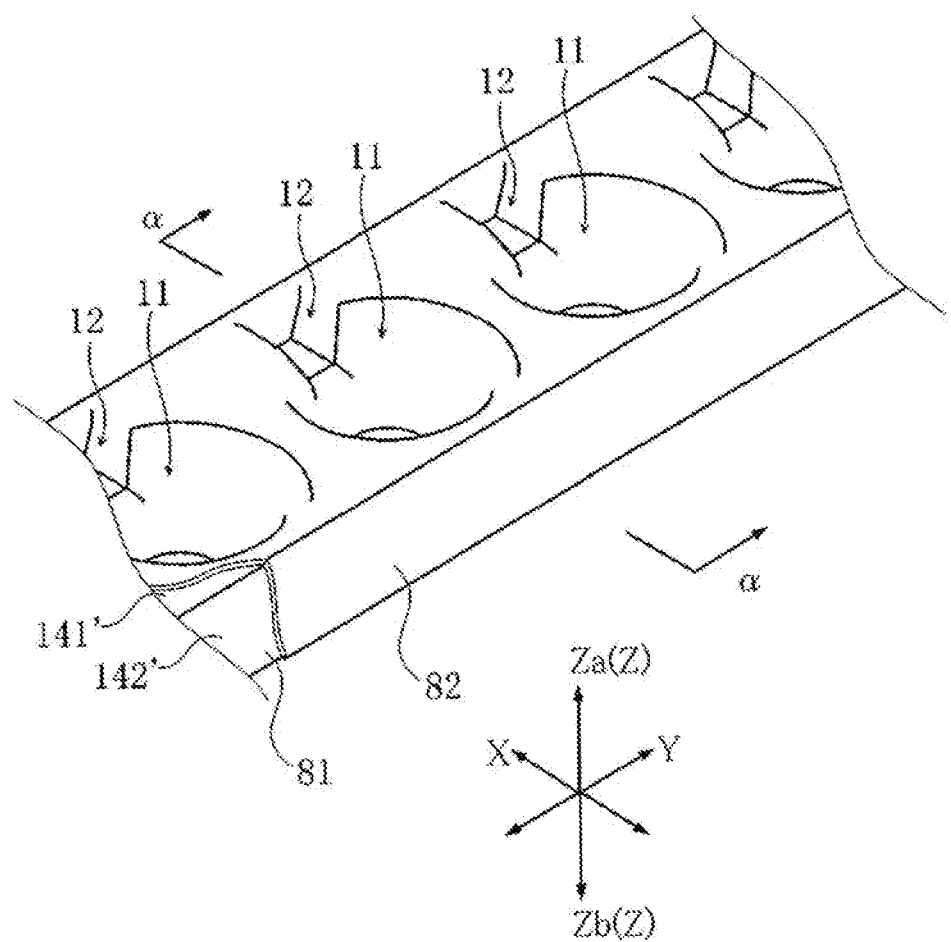
FIG. 12 is a perspective view illustrating a main portion in a step of a manufacturing method of the light emitting device according to the first embodiment of the present v.
Figure 13:
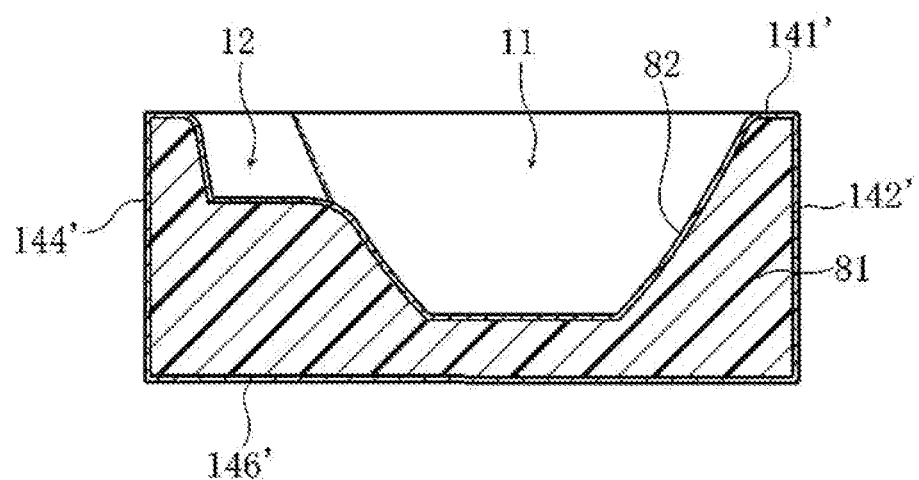
FIG. 13 is a sectional view taken along lines α-α of FIG. 12.
Figure 13:
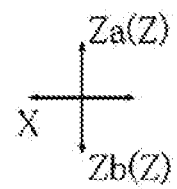

As illustrated in FIGS. 12 and 13, the base material 81 extended in the direction Y is prepared. Then a plurality of the first cavities 11 and a plurality of the second cavities 12 are formed on the base material 81 along the direction Y. Next, a metallizing step is performed. A conductor film 82 is formed on the exposing surfaces of the front 141', the laterals 142', 144', the back 146', the first cavities 11 and the second cavities 12 of the base material 81 in the metallizing step. For example, the conductor film 82 contains Cu.

Figure 14:
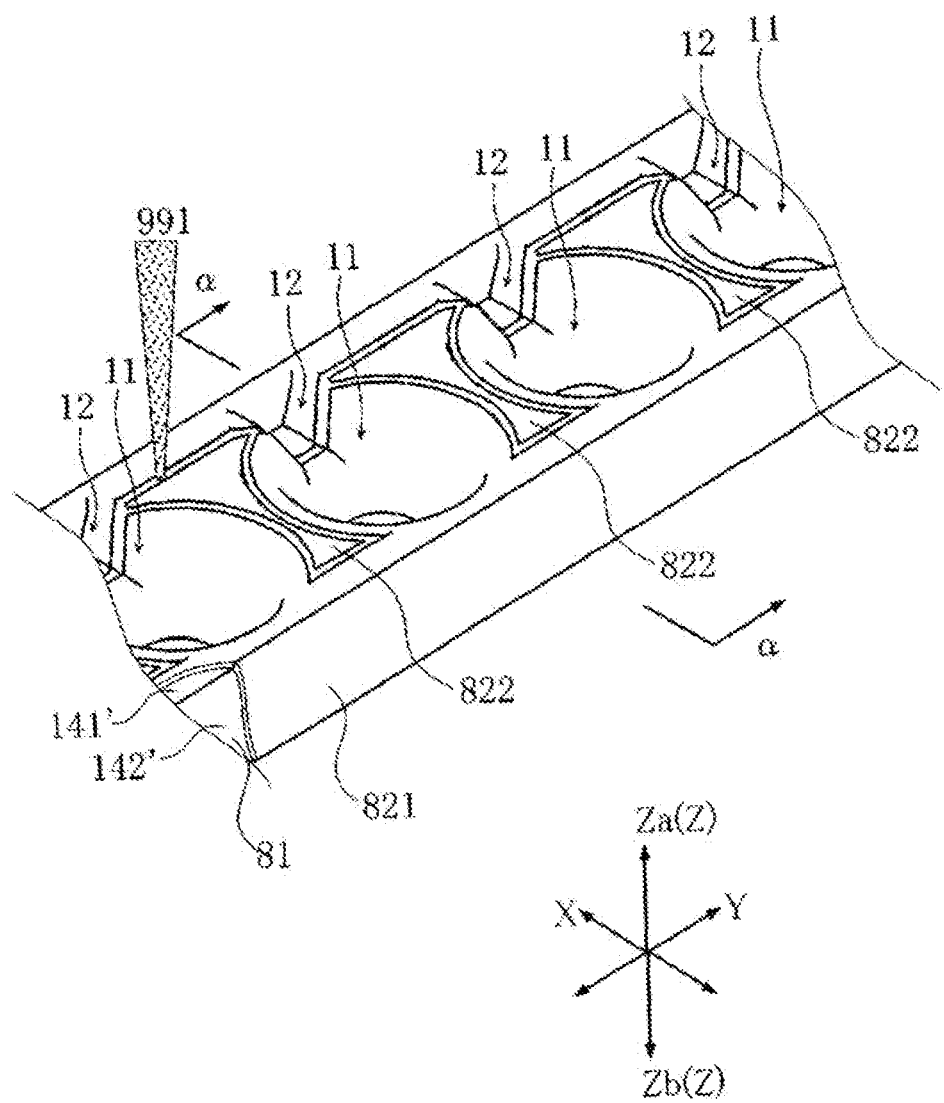
FIG. 14 is a perspective view illustrating a main portion in the step after the step shown in FIG. 12.
Figure 15:
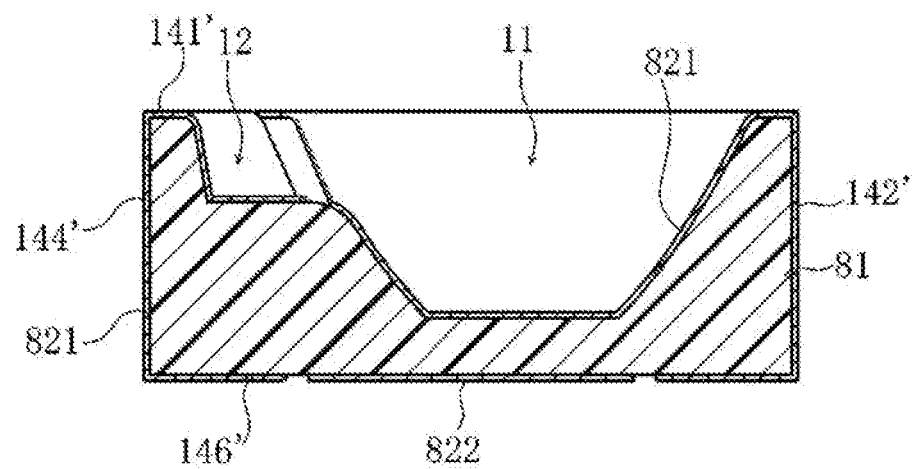
FIG. 15 is a sectional view taken along lines α-α of FIG. 14.
Figure 15:
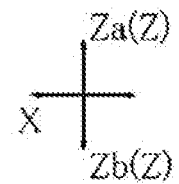

As illustrated in FIGS. 14 and 15, a patterning step is performed. A laser 991 illuminates the front 141' and the back 146' of the base material 81. Therefore, a part of the conductor film 82 can be removed along the outline of the front conductor layer 2 and the back conductor layer 4 shown in FIGS. 6-8 via the illumination of the laser 991. The conductor film 82 can be divided into a circuit portion 821 and a non-circuit portion 822 via removing the part of the conductor film 82. The circuit portion 821 becomes the front conductor layer 2, the lateral conductor layer 3 and the back conductor layer 4 as shown in FIGS. 3-5. Next, an electroplating step of electrolytic Cu is performed that allows the Cu to be precipitated only on the circuit portion 821. The non-circuit portion 822 is the part outside the circuit portion 821 after removing a part of the conductor film 82 via the illumination of the laser 991.

Figure 16:
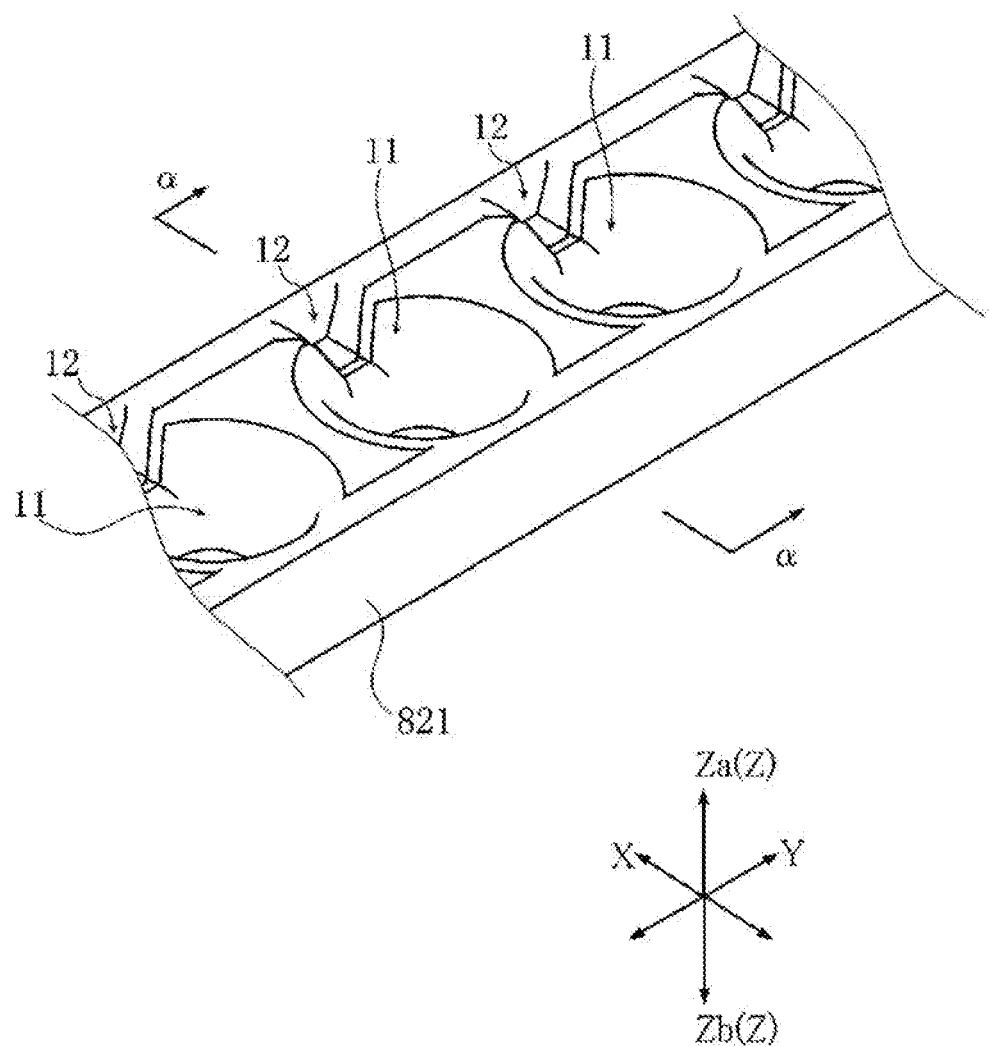
FIG. 16 is a perspective view illustrating a main portion in the step after the step shown in FIG. 14.

As illustrated in FIGS. 16 and 17, a soft etching step is performed to remove the non-circuit portion 822 from the base material 81. Next, a Ni plating step and an Au plating step are performed on the circuit portion 821 that allows a Ni layer and an Au layer to be stacked on the circuit portion 821. Then the structure of forming the front conductor layer 2' and so forth on the base material 81, shown in FIGS. 18 and 19, is manufactured.

Figure 20:
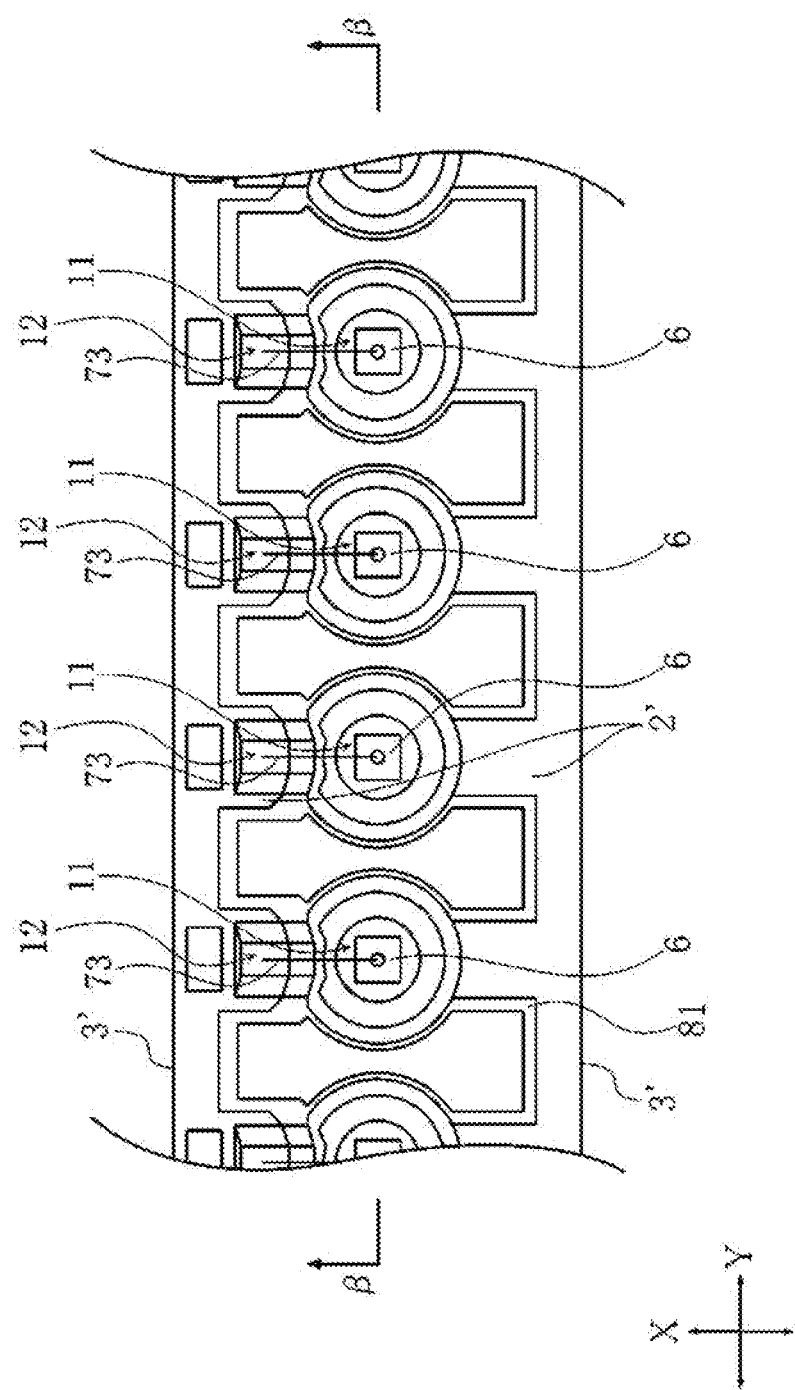
FIG. 20 is a plane view illustrating a main portion in the step after the step shown in FIG. 18.
Figure 21:
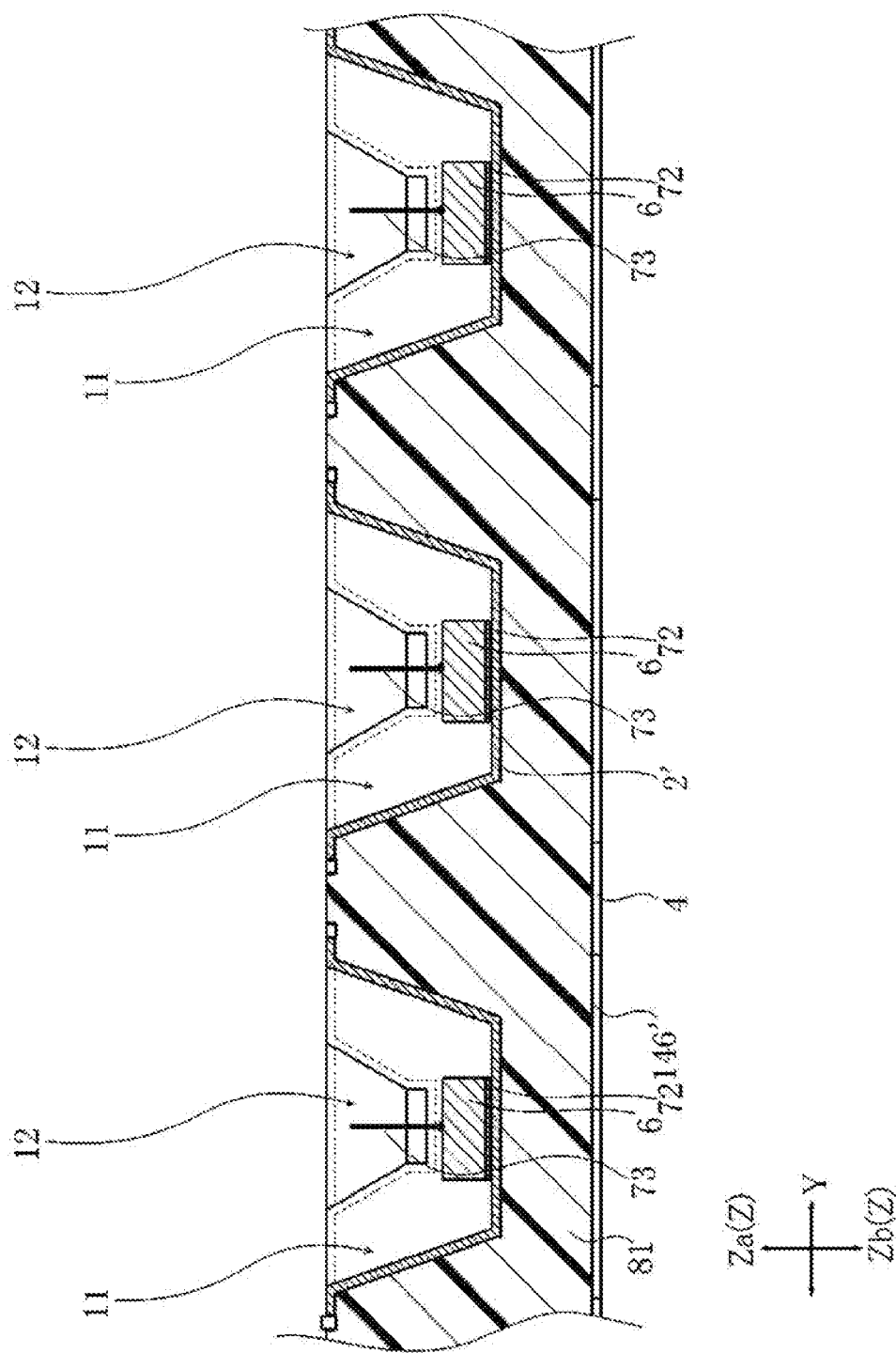
FIG. 21 is a sectional view of the main portion taken along lines β-β of FIG. 20.

As illustrated in FIGS. 20 and 21, pluralities of the LED chip 6 are respectively disposed in each of the first cavities 11. The LED chips 6 are bonded to the base material 81 via the bonding layers 72. The LED chips 6 are arranged on the base material 81 along the direction Y. Then the metal wire 73 connects to the LED chip 6.

Figure 22:
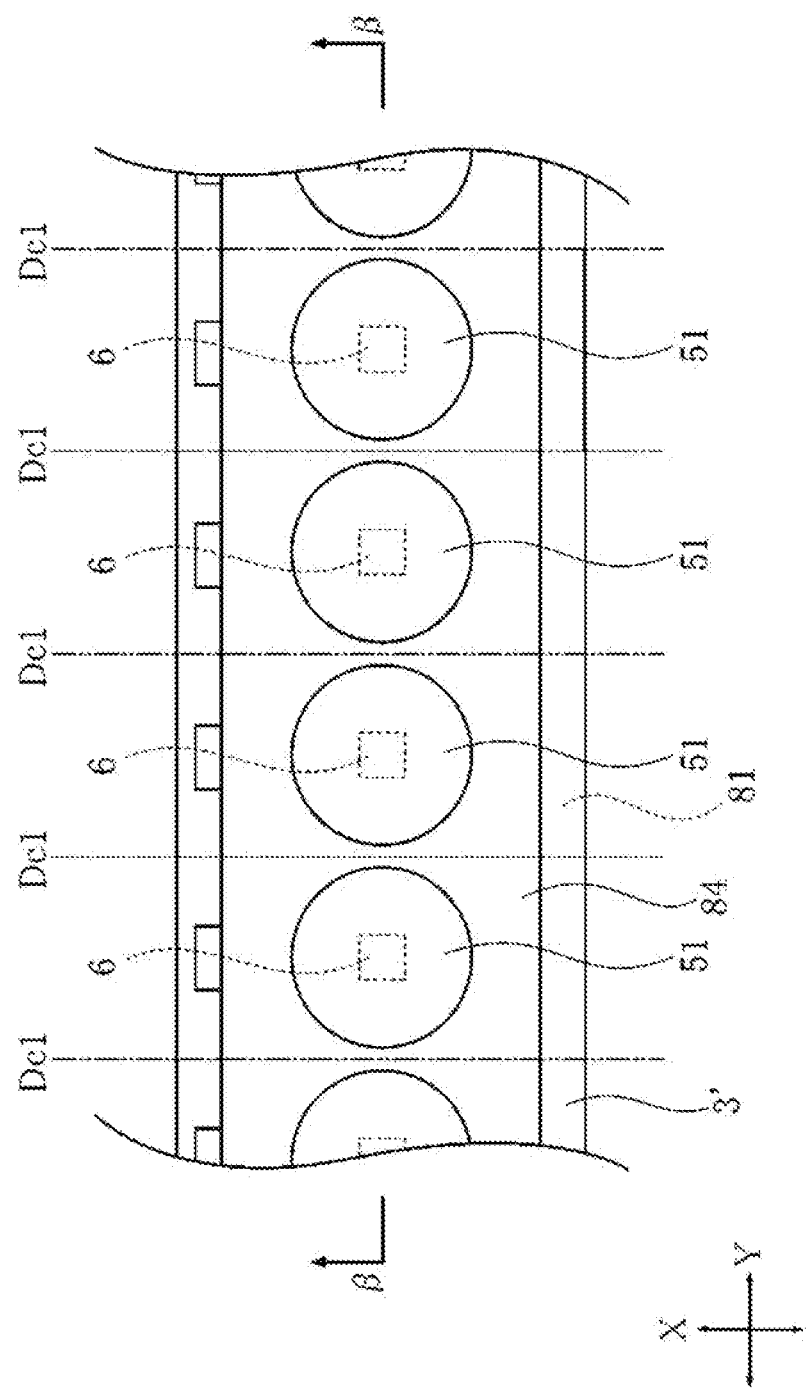
FIG. 22 is a plane view illustrating a main portion in the step after the step shown in FIG. 20.
Figure 23:
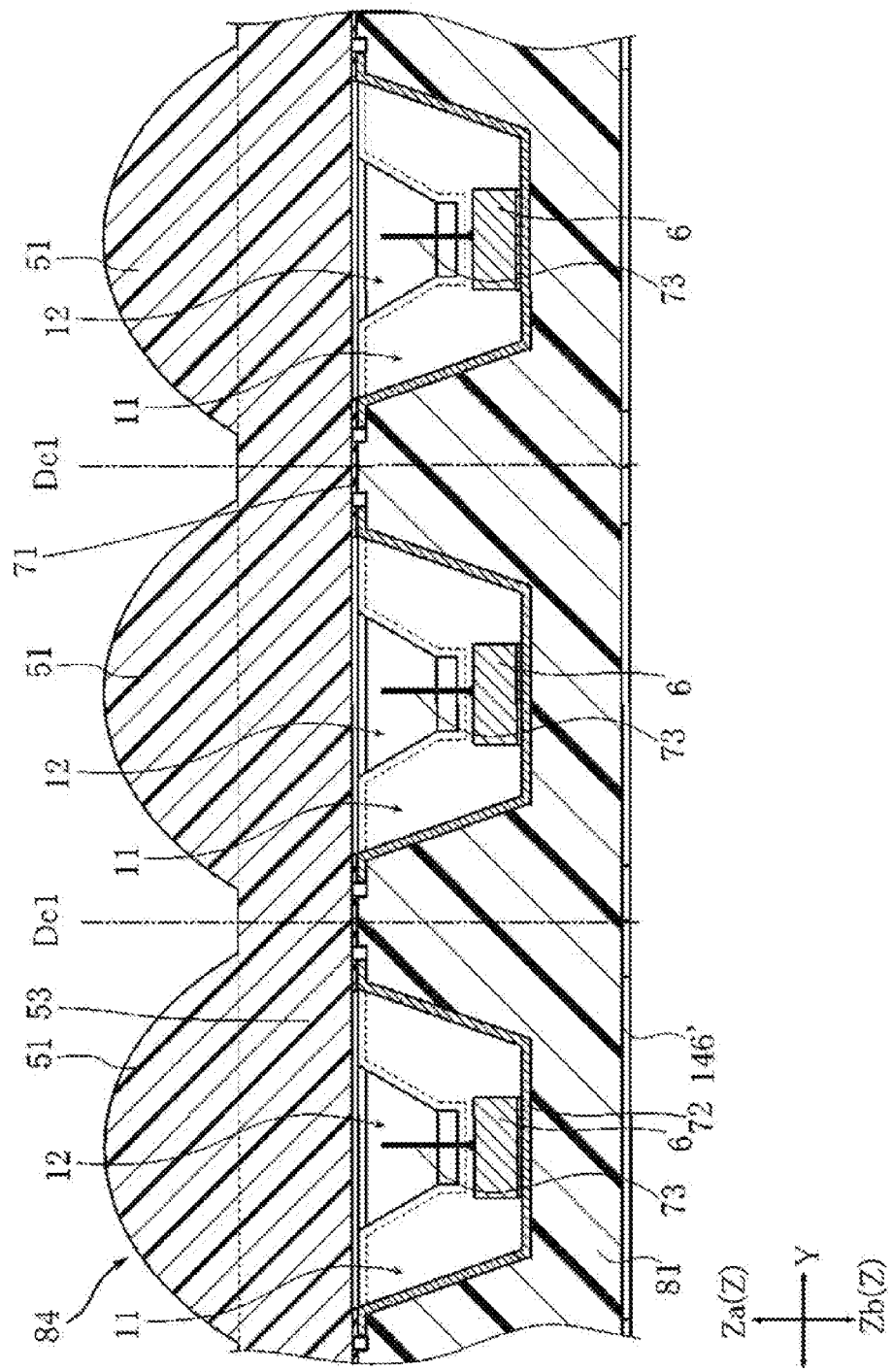
FIG. 23 is a sectional view of the main portion taken along lines β-β of FIG. 22.

As illustrated in FIGS. 22 and 23, a lens base 84 with a plurality of convex parts 51 is formed in advance. Then the lens base 84 is bonded to the base material 81 via the bonding layer 71. The bonding of the lens base 84 and the base material 81 is performed under the condition of superimposing each of the convex parts 51 on any of the first cavities 11 in XY vertical view and keeping a gap between each of the LED chips 6 and the lens base 84.

Next, the base material 81, the circuit portion 821 and the lens base 84 are cut at a time along a cutting surface Dc1 intersecting the direction Y to complete the manufacture of the light emitting device 101. By cutting the base material 81, the circuit portion 821 and the lens base 84, the laterals 143 and 145 of the substrate 1, the end surfaces 217, 218, 227, 228 of the front conductor layer 2, the end surfaces 311, 312, 321, 322 of the lateral conductor layer 3 and the end surfaces 411, 412, 421, 422 of the back conductor layer 4 can be formed, respectively.

The operating method of the optical device 801 (referring to FIG. 1) with the light emitting device 101 is described below.

The LED chip 6 shown in FIG. 6 emits the light (and it is the infrared light in the present embodiment) while running the optical device 801, wherein the light passes the gap 789 and enters the light incident surface 537. Then the light entering the light incident surface 537 passes the inside of the lens 5 and refracts out from the light output surface 511. While the infrared light emitting from the light output surface 511 reflects from a sensing target 993 toward the light receiving device 107, the reflected light is received by a light detecting component (not shown in the drawings) of the light receiving device 107. The light detecting component generates an electromotive force output signal according to the intensity of the received light. The sensing target 993 can be sensed according to the value of the output signal. On the other hand, the light detecting component of the light receiving device 107 does not receive the light emitted from the LED chip 6 and sense the sensing target 993 while the light emitting from the light output surface 511 does not reflect from the sensing target 993. In this way, the optical device 801 can obtain the information about whether the sensing target 993 is opposite to the optical device 801. Furthermore, the spacing distance between the light emitting device 101 and the light receiving device 107 with respect to that between the optical device 801 and the sensing target 993 is tiny (e.g., the spacing distance between the light emitting device 101 and the light receiving device 107 ranges between 2 and 50 mm; on the other hand, the spacing distance between the optical device 801 and the sensing target 993 ranges between 5 and 200 mm). Therefore, the light emitting from the light emitting device 101 and reflecting from the sensing target 993 toward the light receiving device 107 travels almost along the direction Z.

The effect of the present embodiment is described below.

The light emitting device 101 comprises a lens 5. The lens 5 has a light output surface 511 which bulges in the direction Za that is defined from the substrate 1 toward the LED chip 6 and is contained in the thickness direction Z of the substrate 1 to transmit the light emitted from the LED chip 6. Accordingly, this enables the light emitted from the LED chip 6 to refract through the light output surface 511, allowing the radiant intensity in the direction Za can be enhanced and the angle of spread of the light emitted from the light emitting device 101 can be reduced.

If the radiant intensity in the direction Za is enhanced or the angle of spread of the light emitted from the light emitting device 101 is reduced, the intensity of the light reflected from the sensing target 993 and received by the light detecting component of the light receiving device 107 will be increased. Therefore, the sensing target 993 can be sensed factually while the sensing target 993 is opposite to the optical device 801. In this way, it can accurately know about whether the sensing target 993 is opposite to the optical device 801.

As illustrated in FIG. 6, in the light emitting device 101, the LED chip 6 is exposed in the gap 789 and is clipped between the substrate 1 and the lens 5. This way is suitable to reduce the contact area of the LED chip 6 and the lens 5. If the contact area of the LED chip 6 and the lens 5 can be reduced, the stress on the LED chip 6 induced by the lens 5 can be decreased. Therefore, the light emitting device 101 can prevent the LED chip 6 from being damaged due to the stress induced by the lens 5.

In the light emitting device 101, the light incident surface 537 is spaced apart from the LED chip 6 in the direction Za (upward-direction of FIG. 6) that is defined from the substrate 1 toward the LED chip 6 and is contained in the thickness direction Z. In this way, the LED chip 6 is not experiencing stress induced by the lens 5. Therefore, the light emitting device 101 can further prevent the LED chip 6 from being damaged due to the stress induced by the lens 5.

In the light emitting device 101, the lens 5 has a light incident surface 537 which is located between the light output surface 511 and the LED chip 6 to receive the light emitted from the LED chip 6. The light incident surface 537 is planar in shape that extends toward the XY plane (perpendicular to the optical axis of the lens 5). In this way, the light emitting from the LED chip 6 and entering the light incident surface 537 at an incident angle of $\theta 1$ (it is not shown in the drawings and is formed with the direction Z in the present embodiment) refracts through the light incident surface 537 and travels at an angle of refraction $\theta 2$ smaller than the incident angle of $\theta 1$ in the lens 5 toward the direction Za. Consequently, by enabling the light emitted from the LED chip 6 to refract through the light incident surface 537, the radiant intensity in the direction Za can be enhanced and the angle of spread of the light emitted from the light emitting device 101 can be reduced.

The light emitting device 101 forms a vent hole 781 which communicates with a space (the exterior space of the light emitting device 101) corresponding to the gap 789 and the light output surface 511. In the step performed under the high temperature environment, such as the reflow step, the thermal expansion gas can pass the vent hole 781 and flow into the exterior space of the light emitting device 101 even if the gas inside the gap 789 is experiencing a thermal expansion. Since the pressure inside the gap 789 is difficult to rise rapidly, the light emitting device 101 is suitable to restrain a breakdown induced by the lens 5 separating from the substrate 1 due to the pressure inside the gap 789 when risen.

If the inner electrode 212 is covered by the bonding layer 71, it is possible to induce a decrease of the radiant intensity in the direction Za. While the bonding layer 71 contains bonding sheet material, it is not likely to have a situation that the bonding layer 71 covers a part of the inner electrode 212 since the liquid adhesive drops on the inner electrode 212 owing to the bonding sheet material has a regular shape. Therefore, while the bonding layer 71 contains bonding sheet material, the light emitting device 101 can restrain the radiant intensity in the direction Za from being reduced and can easily dispose the lens 5 on the substrate 1.

A reflow step is performed to install the light emitting device 101 on the circuit substrate 108. The reflow step is performed under a high temperature environment of about 260 degree Celsius. While the bonding layer 71 uses the thermosetting sheet material, the bonding force of the bonding layer 71 is unlikely to weaken in the reflow step. In the reflow step, a breakdown induced by the lens 5 is separated from the substrate 1 can be restrained while the bonding layer 71 uses the thermosetting sheet material.

While the bonding layer 71 contains liquid adhesive, an anchor effect can be used to bond the front conductor layer 2 or the bulging portion 131 and the lens 5 tightly.

In the light emitting device 101, the substrate lateral 143 showing in FIG. 5 is the cutting surface formed after cutting the base material 81 (referring to FIGS. 22 and 23). The end surface 411 has a portion spaced apart from the substrate lateral 143 and the dicing blade used to cut the base material 81 does not come in contact with the portion. Therefore, the position of the end surface 411 does not produce a deckle edge. The light emitting device 101 is suitable to restrain the deckle edge on the end surface 411 from being produced. Correspondingly, light emitting device 101 is also suitable to restrain the deckle edge on the end surfaces 412, 421, 422 from being produced.

In the light emitting device 101, the end surface 411 is located on one end of the back 146 in the direction X and has another portion located on the same plane as the substrate lateral 143. In order to form the first back electrode 41 (back conductor layer 4) with the end surface 411, the laser 991 only illuminates the back 146' of the base material 81 and does no need to illuminate the lateral 142' of the base material 81. Therefore, the light emitting device 101 is suitable to reduce the manufacturing steps. Similarly, in the light emitting device 101, the end surface 412 is located on one end of the back 146 in the direction X and has a portion located on the same plane as the substrate lateral 145. Similarly, in the light emitting device 101, the end surface 421 is located on one end of the back 146 in the direction X and has a portion located on the same plane as the substrate lateral 143. Similarly, in the light emitting device 101, the end surface 422 is located on one end of the back 146 in the direction X and has a portion located on the same plane as the substrate lateral 145. Consequently, it enables the light emitting device 101 to reduce the manufacturing steps suitably.

In the light emitting device 101, the second surface 536 is planar in shape. Assuming the second surface 536 is convex, the second surface 536 may contact with the metal wire 73. If the second surface 536 contacts with the metal wire 73, it is possible to produce a breakdown induced by the displacement of the LED chip 6. In the present embodiment, the second surface 536 is difficult to come in contact with the metal wire 73 since the second surface 536 is planar in shape, and it is unlikely to produce the breakdown induced by the displacement of the LED chip 6.

In the light emitting device 101, the substrate 1 has a first cavity 11 formed thereon. The first cavity 11 has a first bottom surface 111 for disposing the LED chip 6 and a first lateral 112 connecting to the first bottom surface 111. This allows the light emitted from the LED chip 6 to reflect from the bottom electrode 211 formed at the first bottom surface 111 or the inner electrode 212 formed at the first lateral 112 and to enter the light incident surface 537. Then the light entering the light incident surface 537 is transmitted from the light output surface 511 toward the direction Za. The radiant intensity in the direction Za can be enhanced and the angle of spread of the light emitted from the light emitting device 101 can be reduced.

First special example of the light emitting device according to the first embodiment is described below with reference to FIG. 24.

Figure 24:
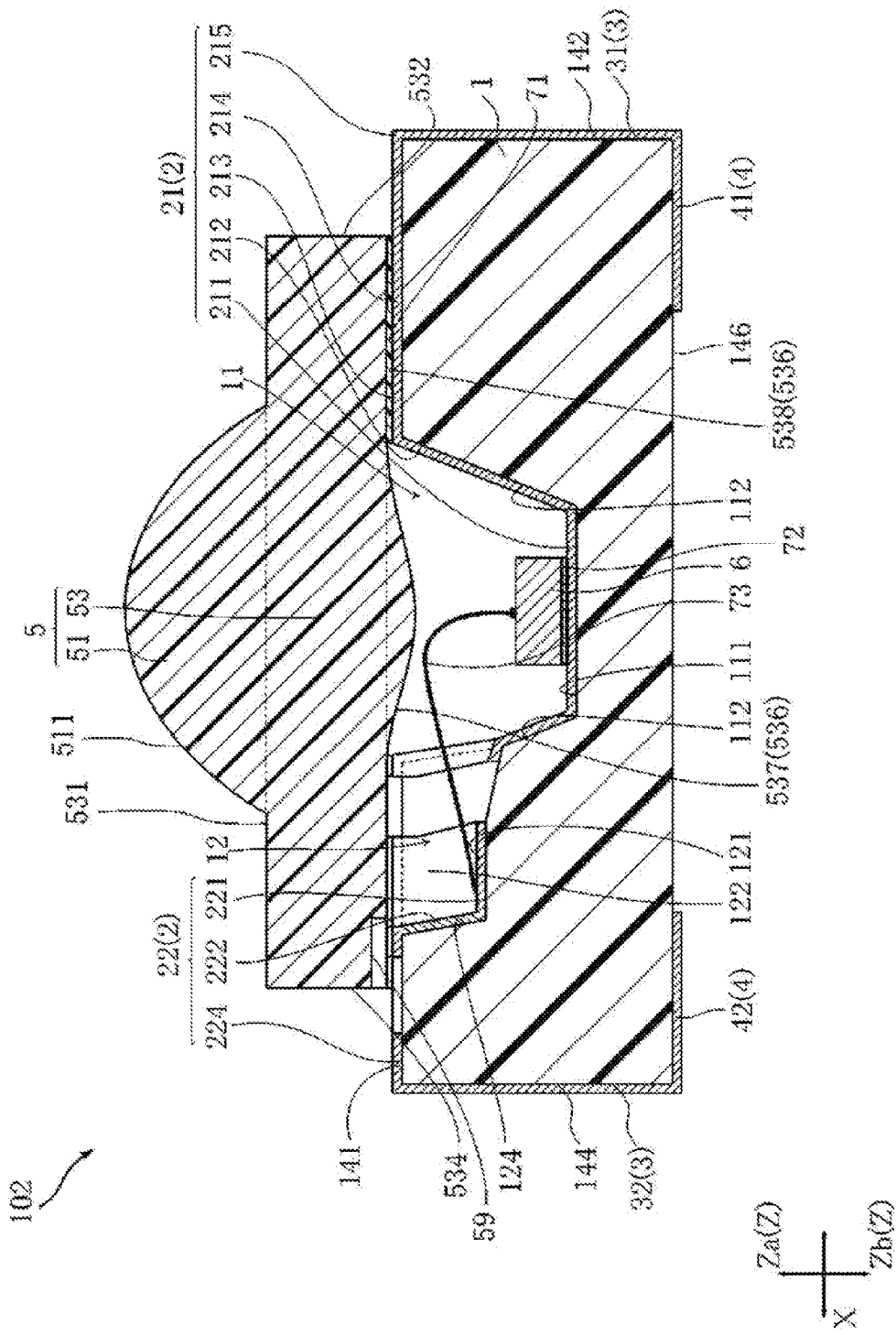
FIG. 24 is a sectional view illustrating a first special example of the light emitting device according to the first embodiment of the present disclosure.

FIG. 24 is a sectional view illustrating a first special example of the light emitting device according to the first embodiment of the present disclosure.

The difference between the light emitting device 102 showing in FIG. 24 and the light emitting device 101 mentioned above is that the light incident surface 537 becomes a convex surface which bulges in the opposite side (the same applies to the first cavity 11 in the present embodiment) as the direction Za. The light incident surface 537 is rotationally symmetrical in shape while the line extended along the direction Z is used as the axis. According to the light emitting device 102, by enabling the light emitted from the LED chip 6 to refract through the light incident surface 537 as a convex surface, the radiant intensity in the direction Za can be enhanced and the angle of spread of the light emitted from the light emitting device 102 can be reduced.

Second special example of the light emitting device according to the first embodiment is described below with reference to FIGS. 25-30.

Figure 25:
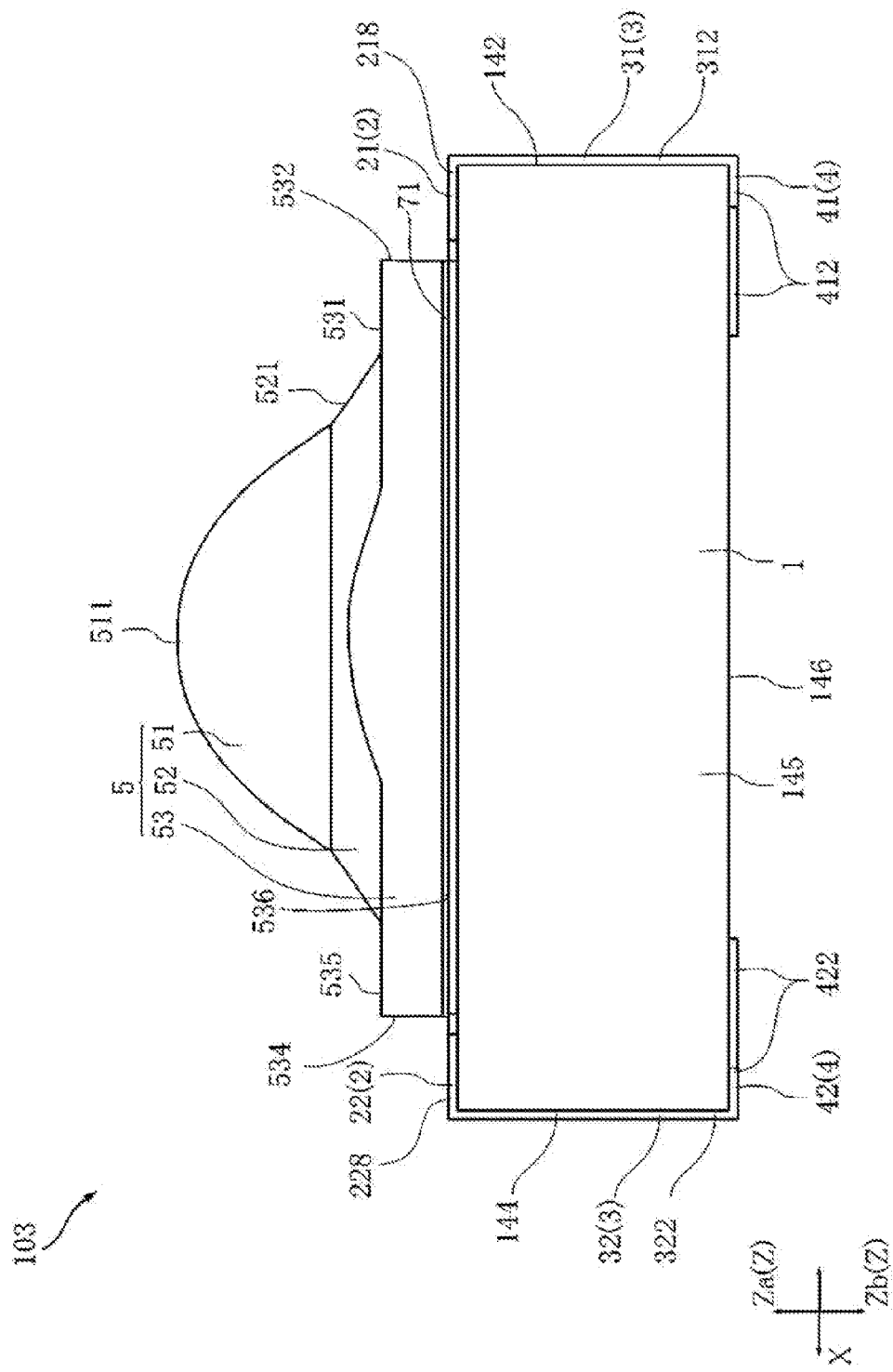
FIG. 25 is a front elevation view illustrating a second special example of the light emitting device according to the first embodiment of the present disclosure.
Figure 26:
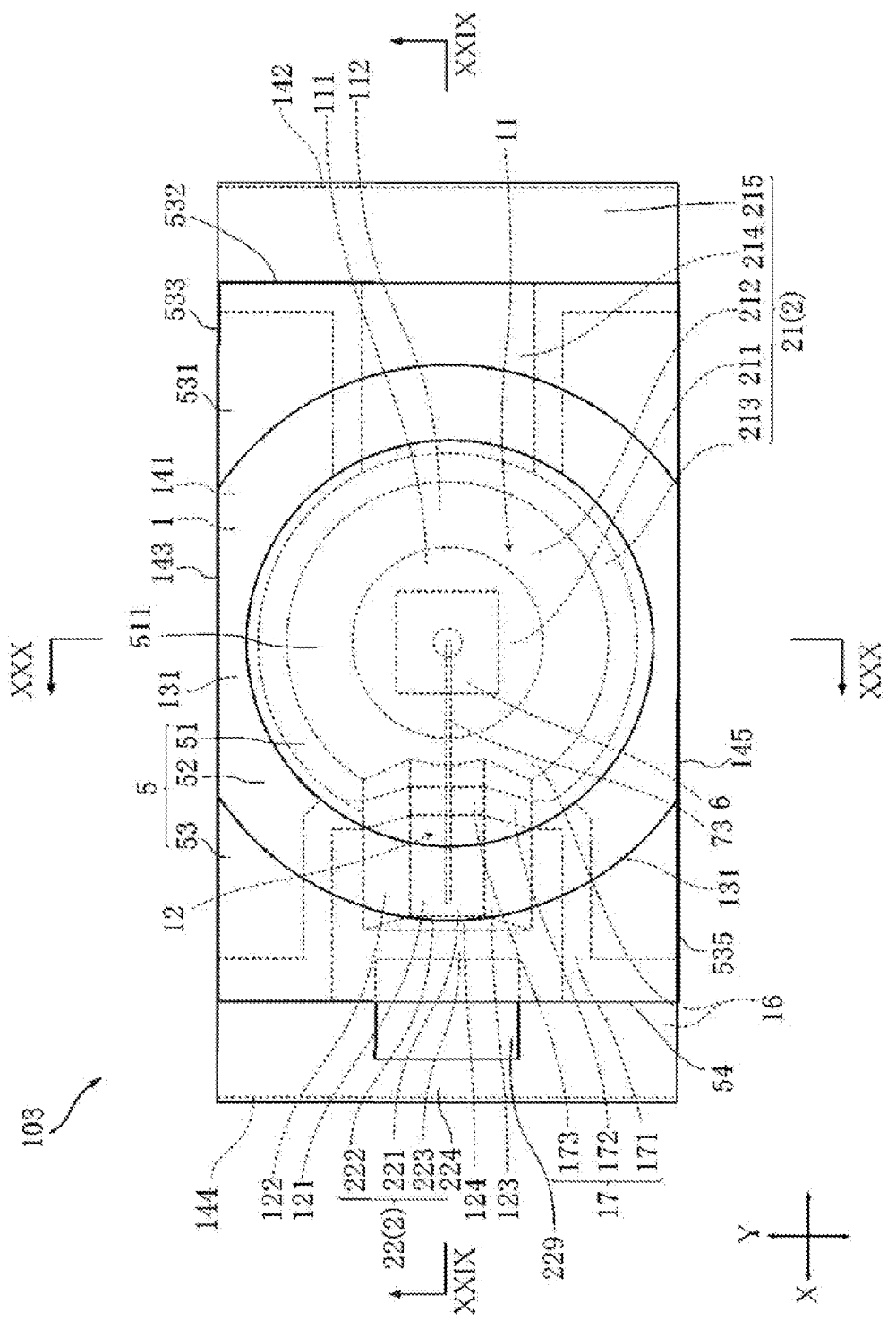
FIG. 26 is a plane view of the light emitting device shown in FIG. 25 (local perspective)
Figure 27:
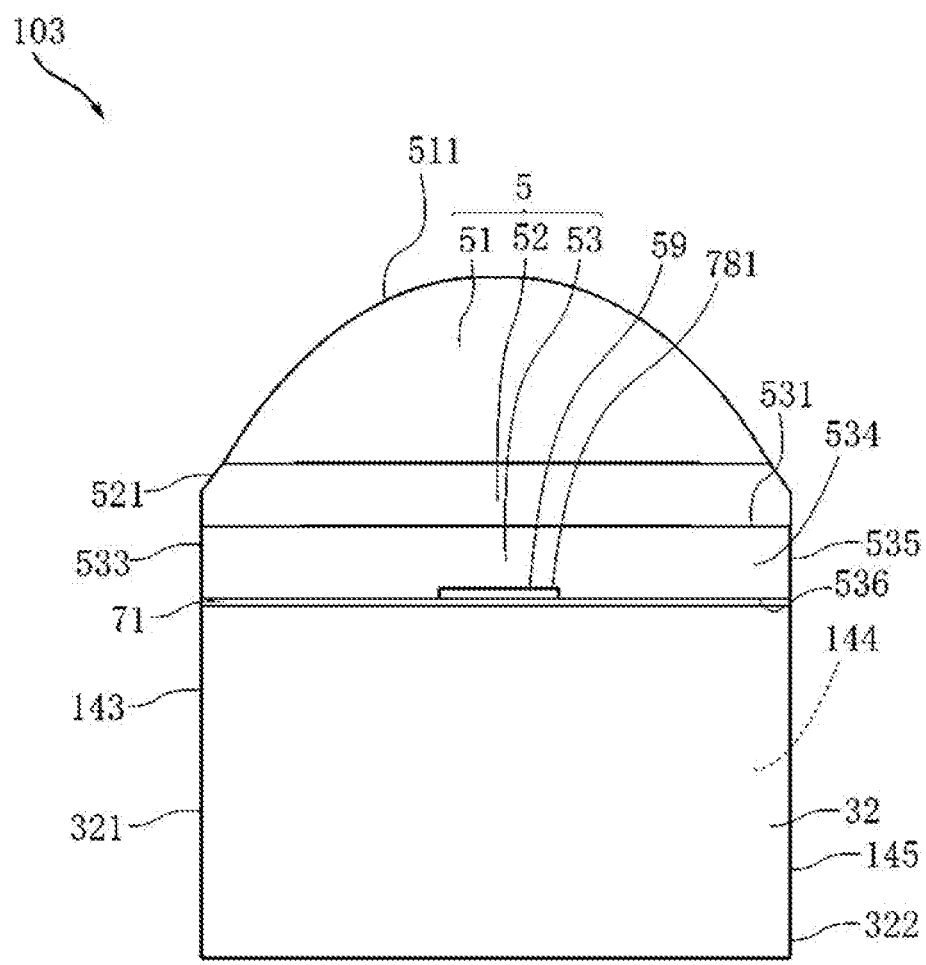
FIG. 27 is a left side view of the light emitting device shown in FIG. 25.
Figure 27:
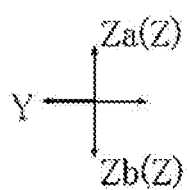
Figure 28:
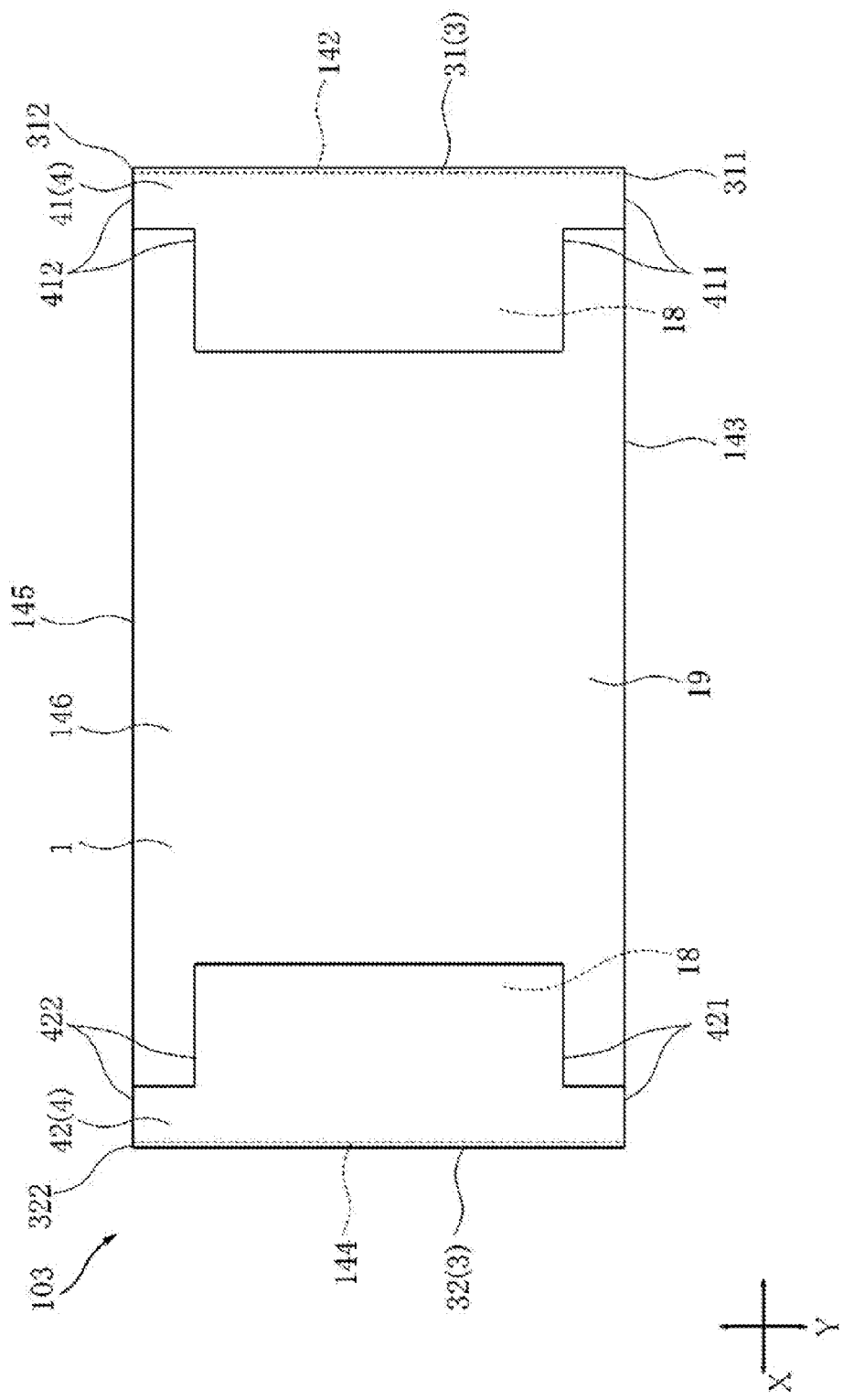
FIG. 28 is a bottom view of the light emitting device shown in FIG. 25.
Figure 29:
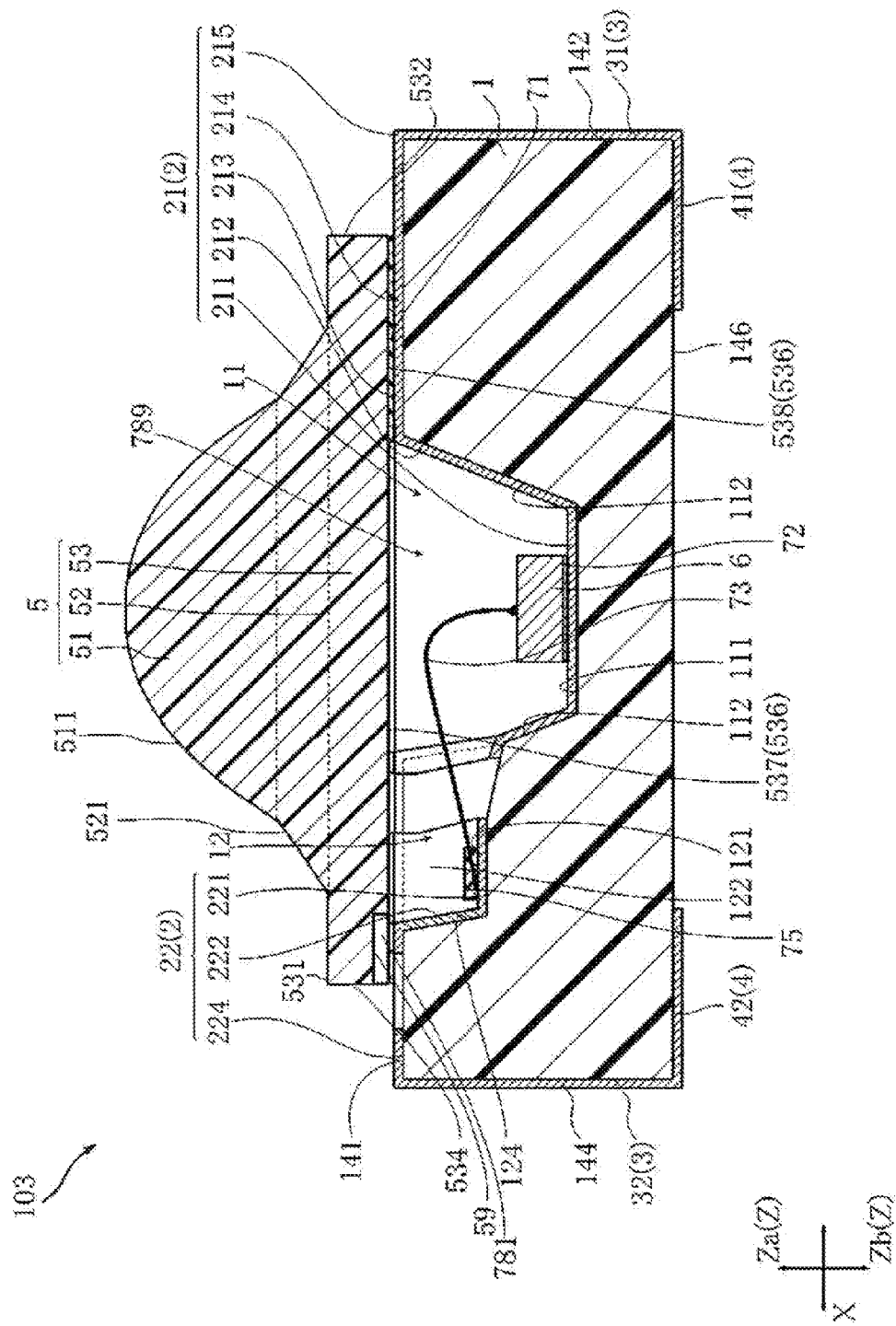
FIG. 29 is a sectional view taken along lines XXIX-XXIX of FIG. 26.
Figure 30:
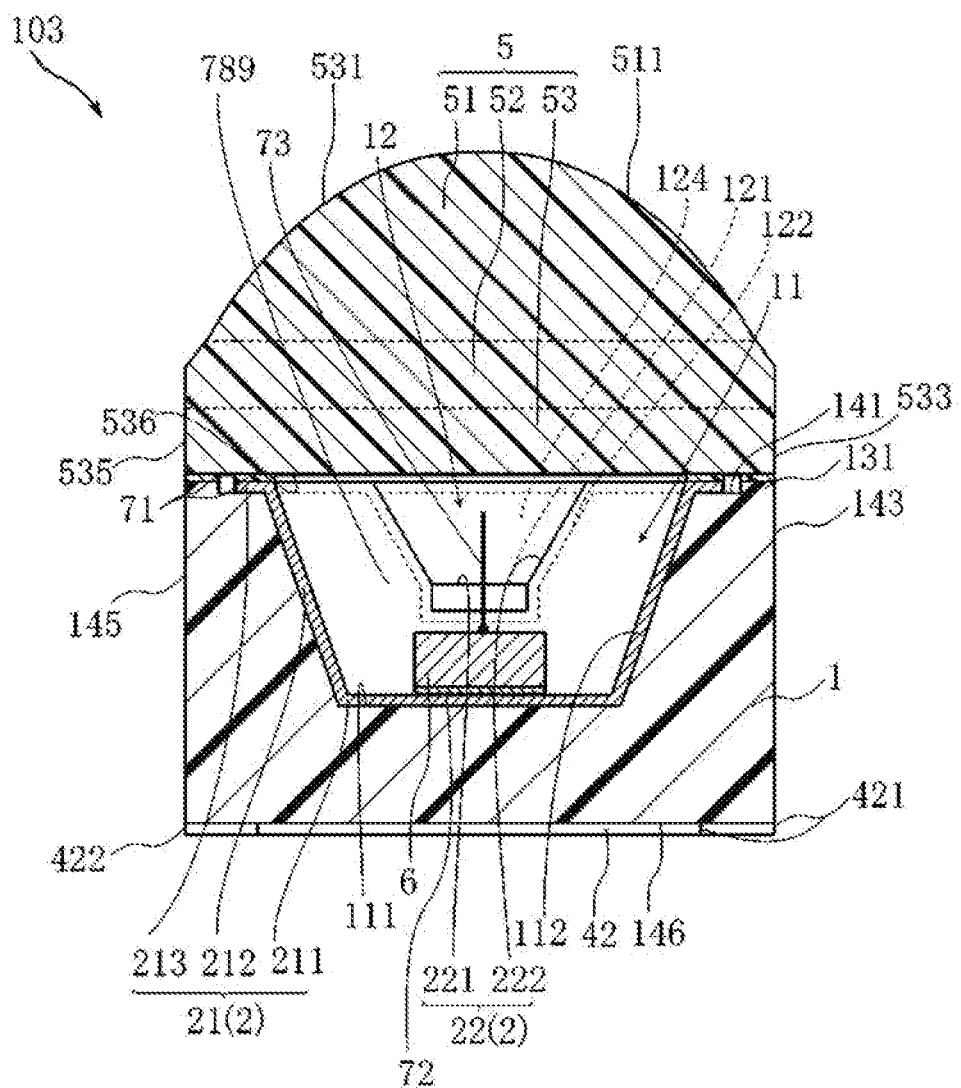
FIG. 30 is a sectional view taken along lines XXX-XXX of FIG. 26.

FIG. 25 is a front elevation view illustrating a second special example of the light emitting device according to the first embodiment of the present disclosure; FIG. 26 is a plane view of the light emitting device shown in FIG. 25 (local perspective); FIG. 27 is a left side view of the light emitting device shown in FIG. 25; FIG. 28 is a bottom view of the light emitting device shown in FIG. 25; FIG. 29 is a sectional view taken along lines XXIX-XXIX of FIG. 26; and FIG. 30 is a sectional view taken along lines XXX-XXX of FIG. 26.

The difference between the light emitting device 103 showing in these figures and the light emitting device 101 mentioned above is that the lens 5 has a conical portion 52.

The conical portion 52 is a portion of the lens 5 that connects to the convex part 51 and the base part 53. The conical portion 52 is formed to enable the lens base 84 that is used to form the lens 5 to be removed easily from the mold after forming the lens base 84. The conical portion 52 has a conical surface 521 connecting to the light output surface 511. As illustrated in FIG. 26, the conical surface 521 has a shape of surrounding the light output surface 511 in view of the direction Z. In the present embodiment, the shape of the conical surface 521 is radially expanded toward the downward-direction of FIG. 29. The conical surface 521 is a mirror-like surface. The mold used to form the lens base 84 can be designed easily while the conical surface 521 is a mirror-like surface. The conical surface 521 is a rough surface with tiny concave-convex shape which is the same as the first surface 531 or the lens laterals 532, 534. While the conical surface 521 is the rough surface, it is not easy to remove the lens base 84 from the mold after forming the lens base 84.

Second embodiment of the present disclosure is described below with reference to FIGS. 31-45.

Figure 31:
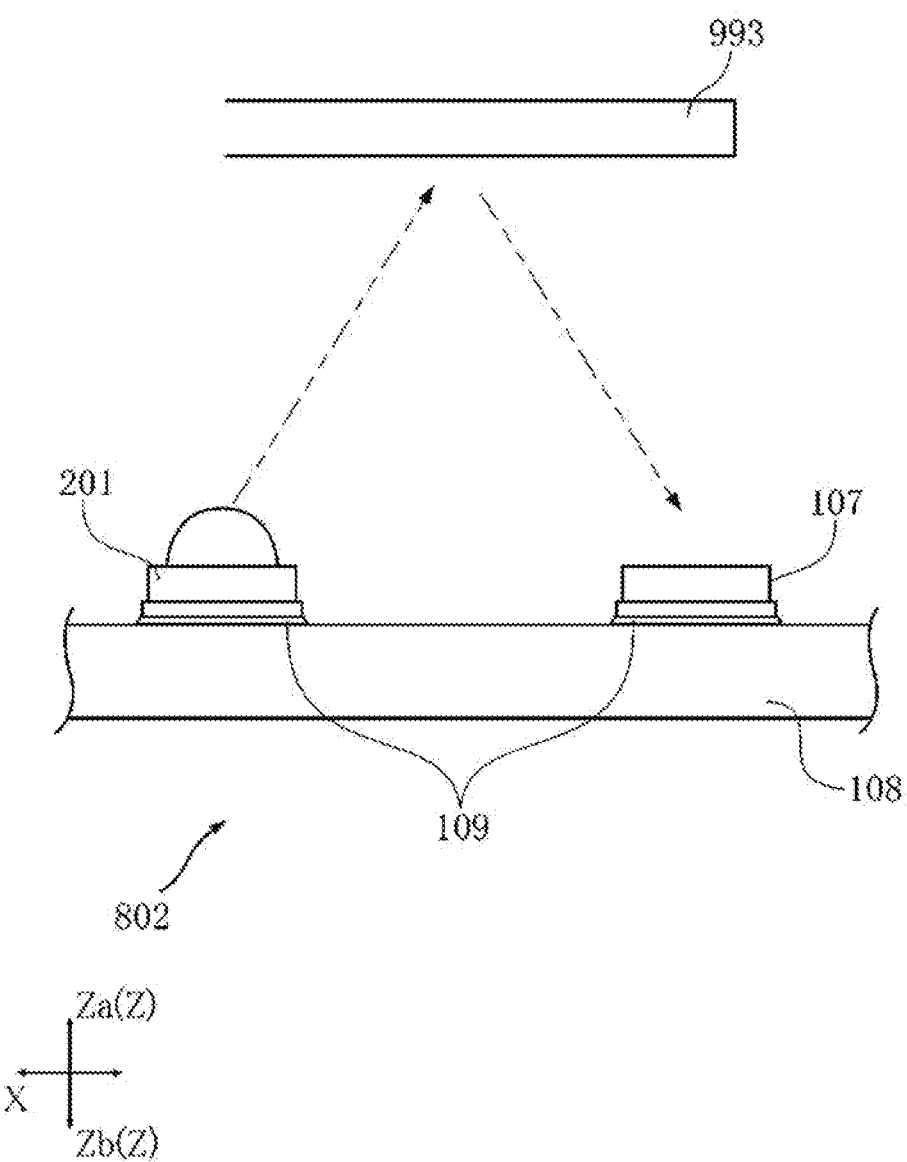
FIG. 31 is a front elevation view of an optical device according to a second embodiment of the present invention.

FIG. 31 is a front elevation view of an optical device according to a second embodiment of the present disclosure. The optical device 802 shown in FIG. 31 comprises a light emitting device 201, a light receiving device 107, a circuit substrate 108 and a solder layer 109. The light receiving device 107, the circuit substrate 108 and the solder layer 109 are the same as the first embodiment, thereby omitting their descriptions.

Figure 32:
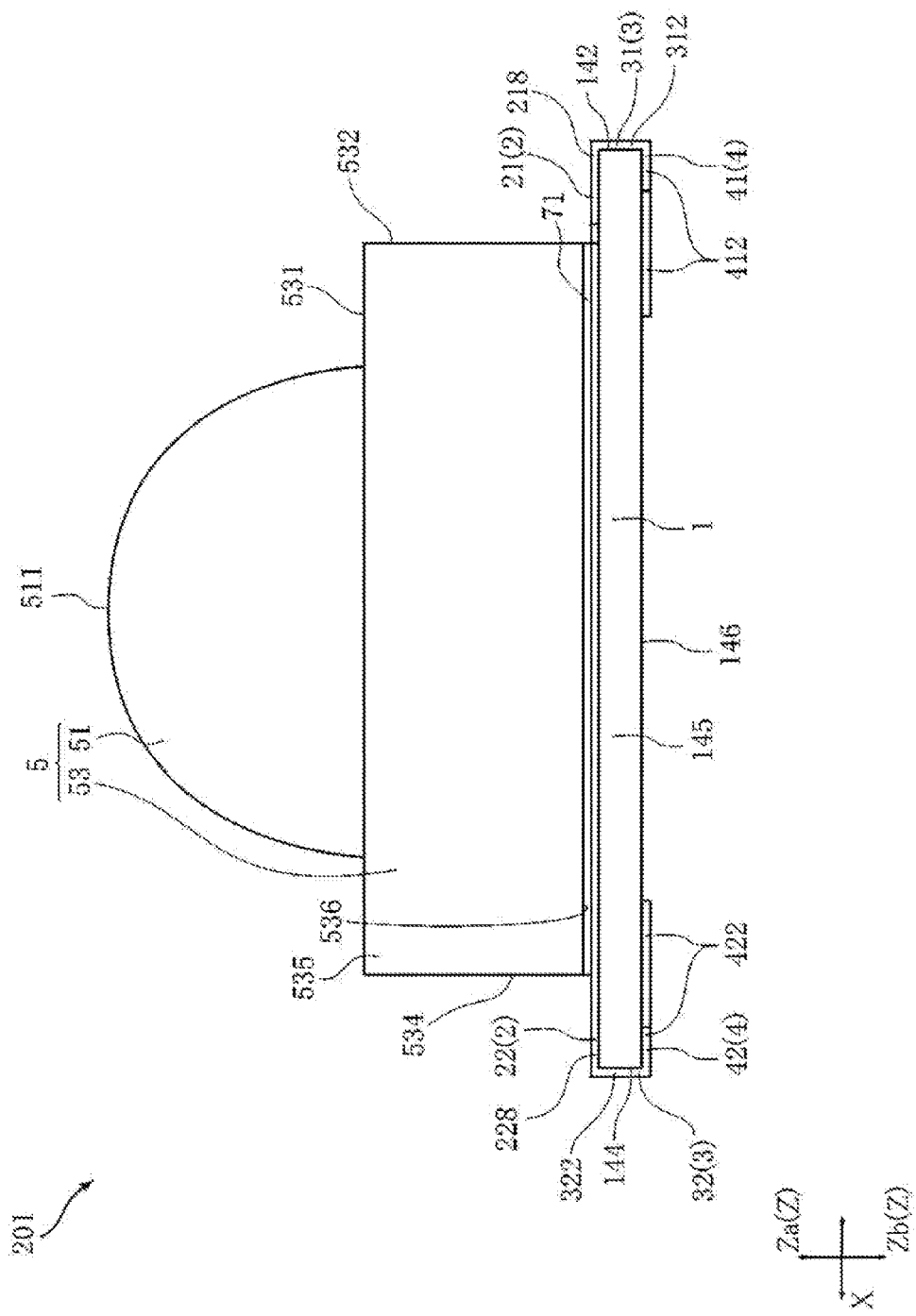
FIG. 32 is a front elevation view of a light emitting device shown in FIG. 31.
Figure 33:
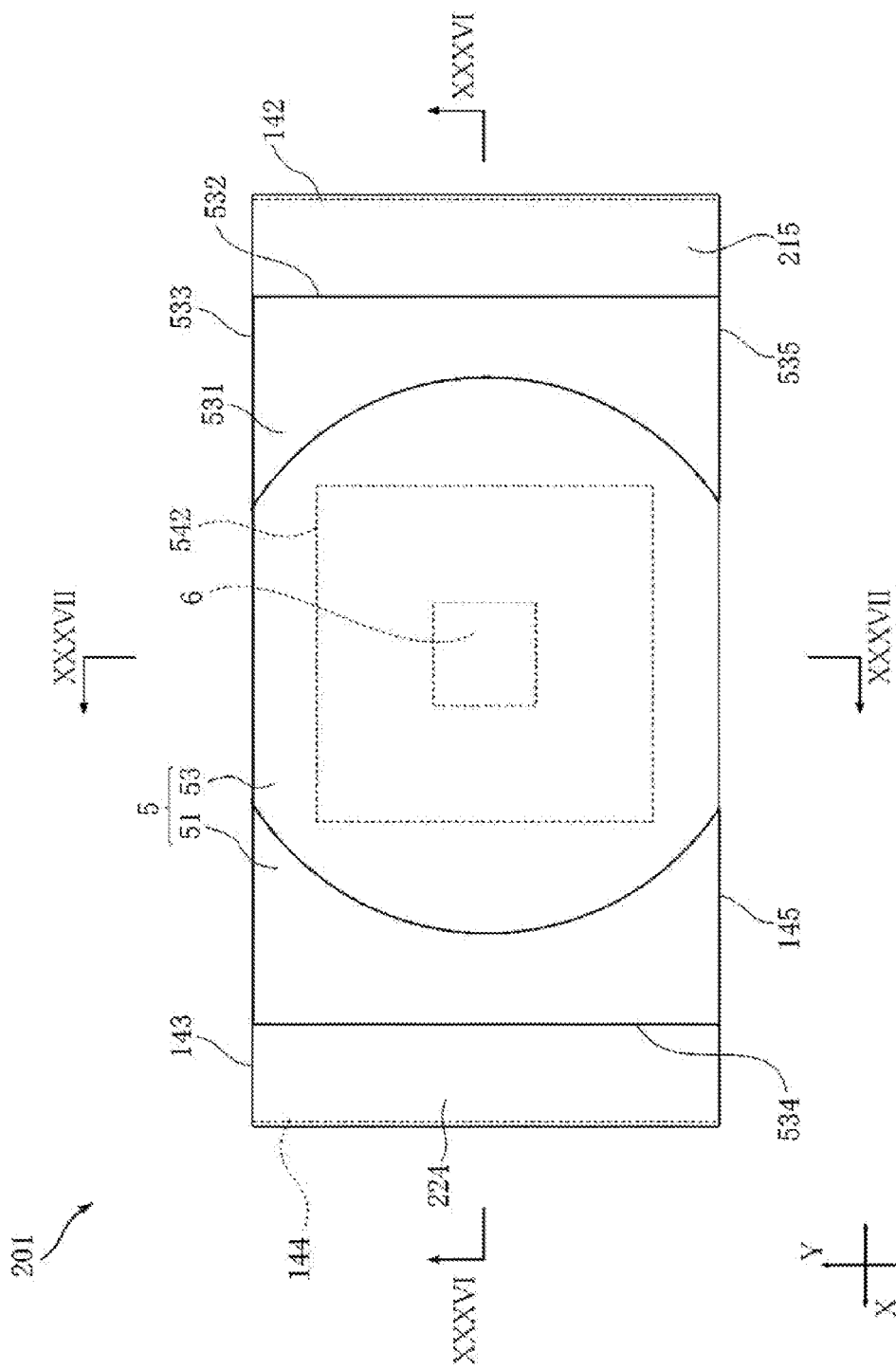
FIG. 33 is a plane view of the light emitting device shown in FIG. 32 (local perspective)
Figure 34:
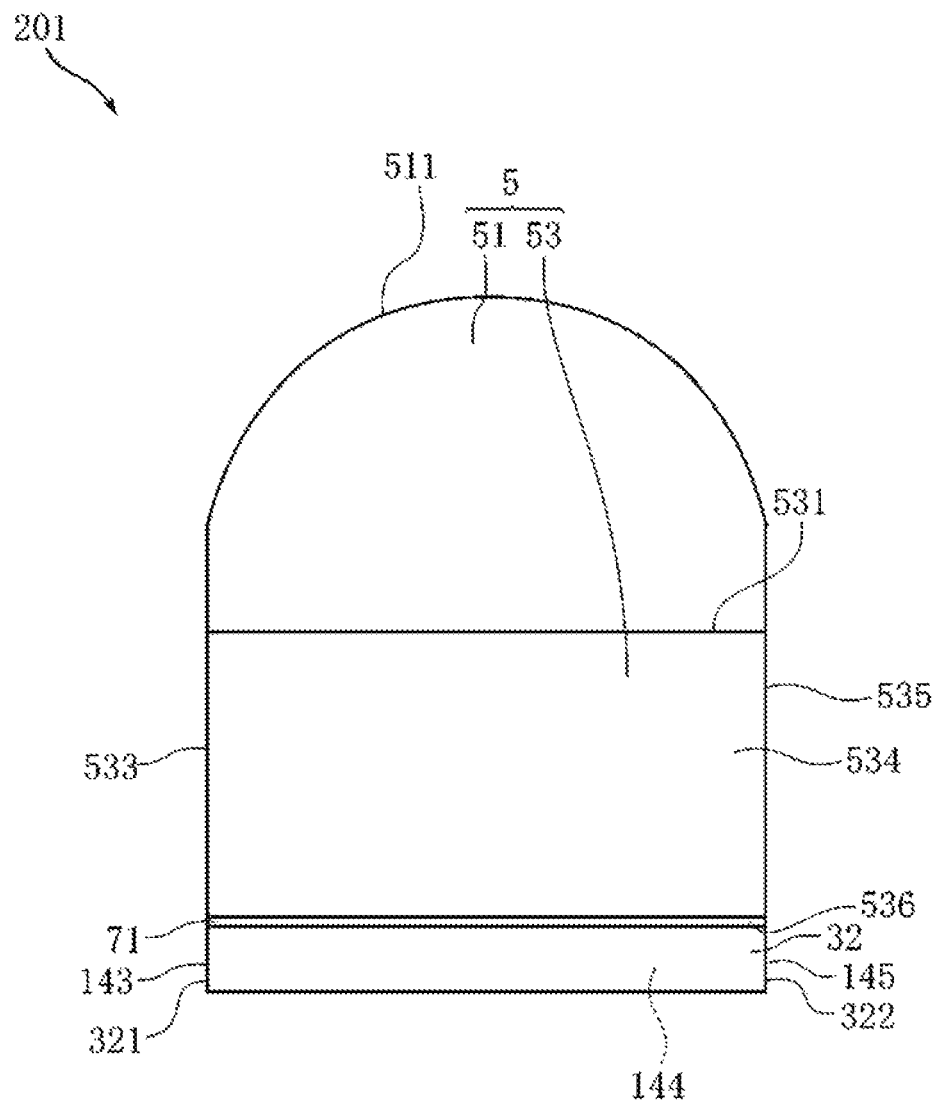
FIG. 34 is a left side view of the light emitting device shown in FIG. 32.
Figure 35:
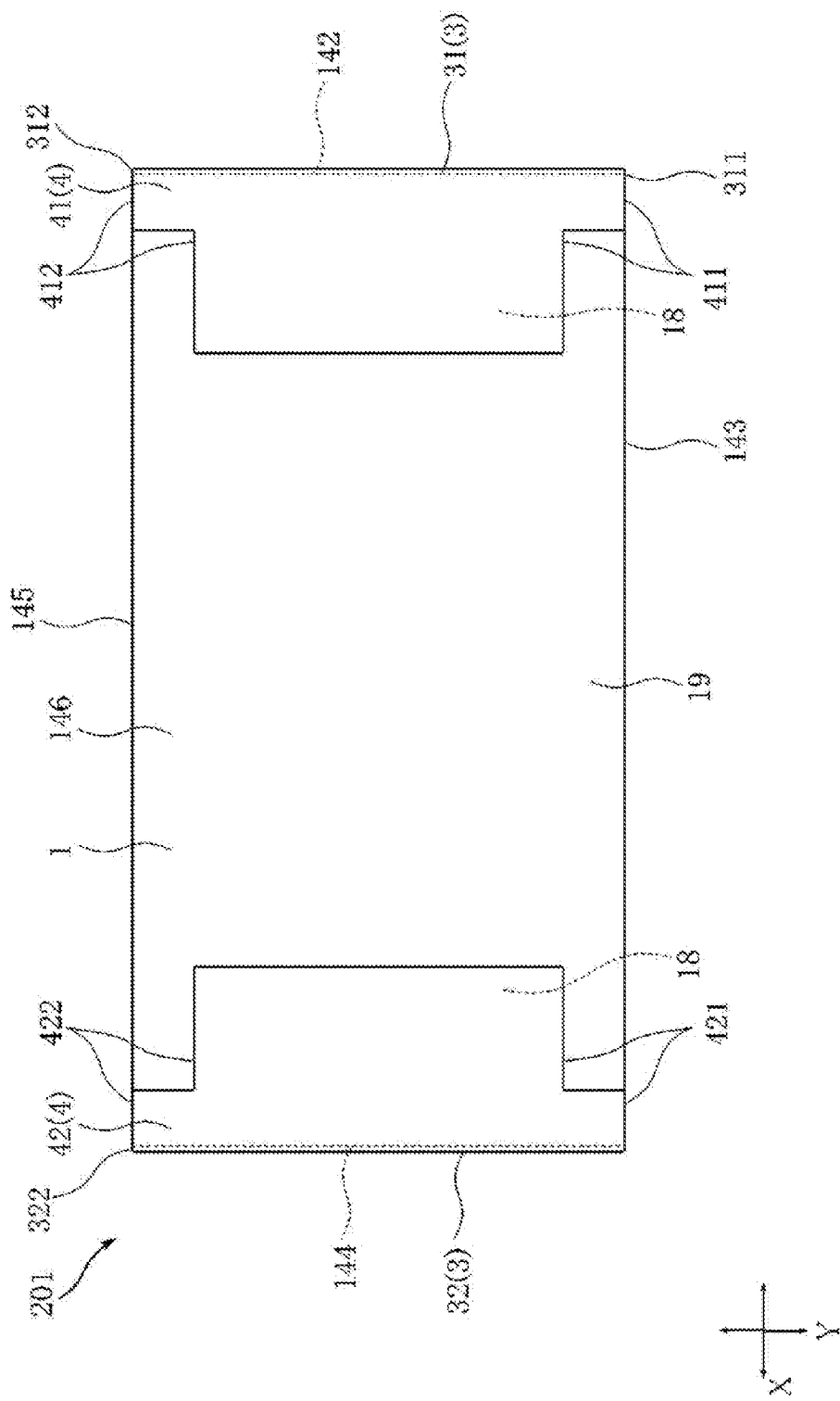
FIG. 35 is a bottom view of the light emitting device shown in FIG. 32.
Figure 36:
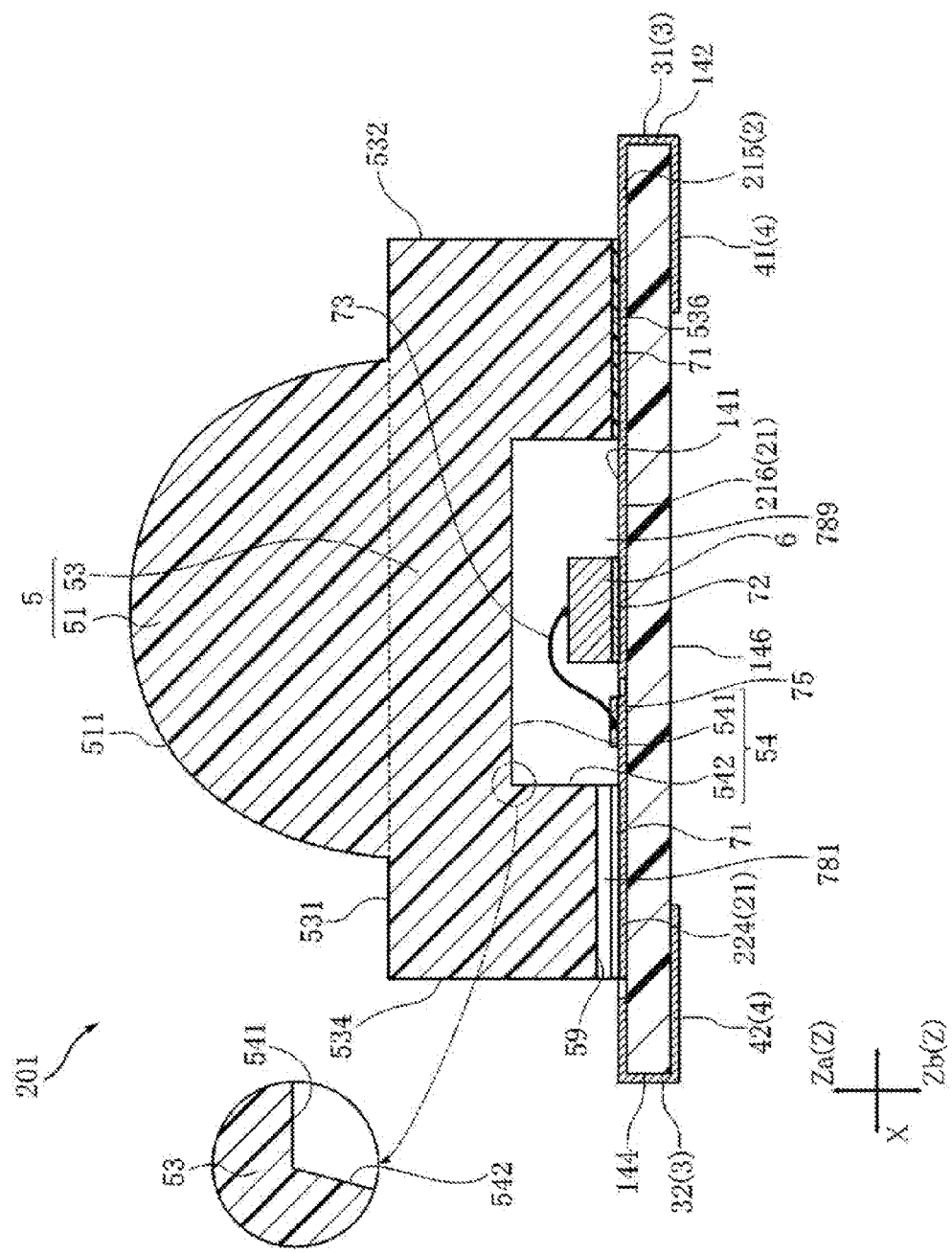
FIG. 36 is a sectional view taken along lines XXXVI-XXXVI of FIG. 33.
Figure 37:
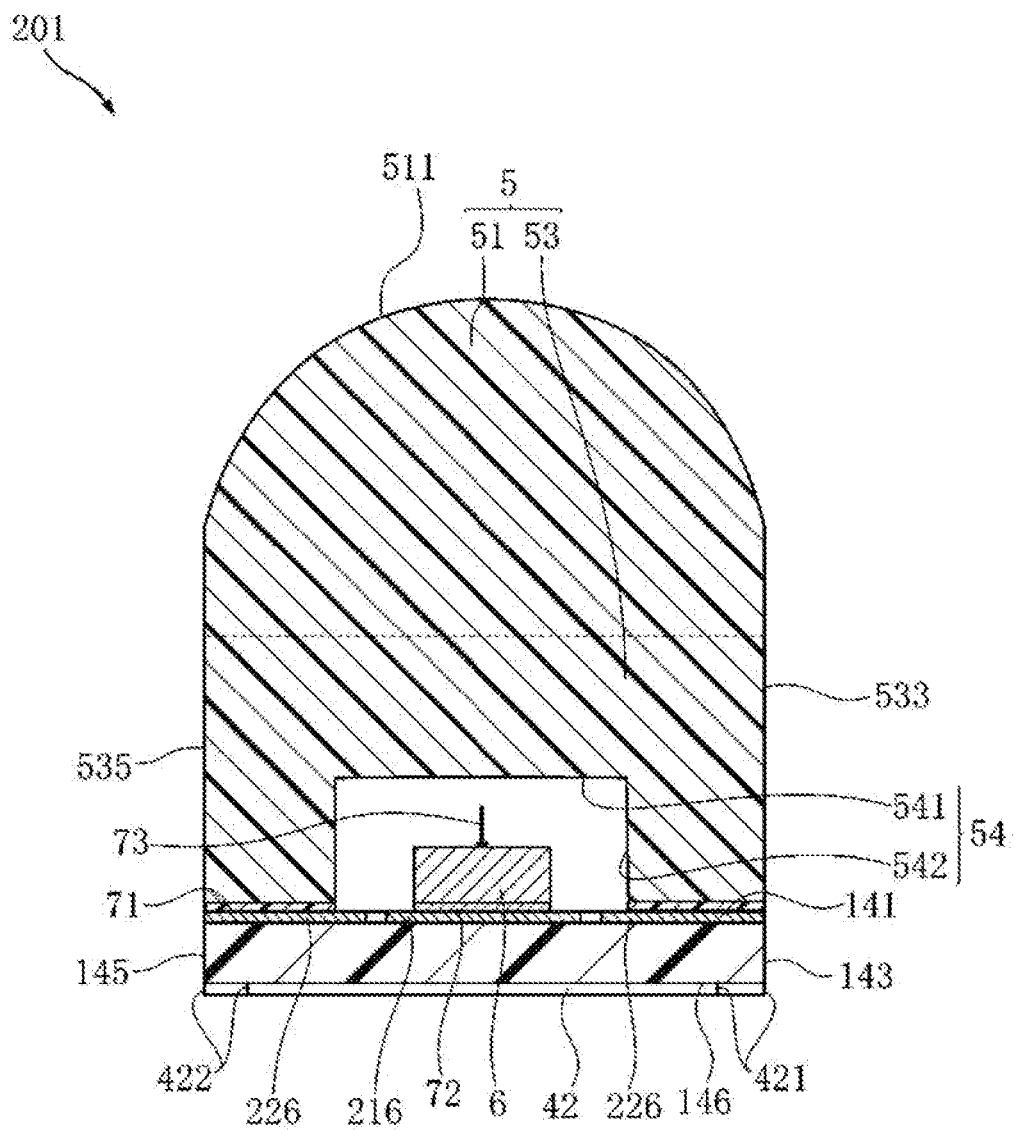
FIG. 37 is a sectional view taken along lines XXXVII-XXXVII of FIG. 33.

FIG. 32 is a front elevation view of a light emitting device shown in FIG. 31; FIG. 33 is a plane view of the light emitting device shown in FIG. 32 (local perspective); FIG. 34 is a left side view of the light emitting device shown in FIG. 32; FIG. 35 is a bottom view of the light emitting device shown in FIG. 32; FIG. 36 is a sectional view taken along lines XXXVI-XXXVI of FIG. 33; FIG. 37 is a sectional view taken along lines XXXVII-XXXVII of FIG. 33; and FIG. 38 is a plane view of FIG. 33 with the illustration of the lens and the bonding layer omitted.

The light emitting device 201 shown in these figures comprises a substrate 1, a front conductor layer 2, a lateral conductor layer 3, a back conductor layer 4, a lens 5, a LED chip 6, a bonding layer 71, a bonding layer 72 and a protective layer 75 (only shown in FIG. 36). The substrate 1, the front conductor layer 2 and the lens 5 are not the same as the first embodiment. The lateral conductor layer 3, the back conductor layer 4, the LED chip 6, the bonding layers 71, the bonding layer 72 and the protective layer 75 are the same as the first embodiment, thereby omitting their descriptions. The light emitting device 201 has a size of around 3.2 mm in direction X, around 1.6 mm in direction Y, and around 1.85 mm in direction Z.

As illustrated in FIGS. 32-38, the substrate 1 is platy in shape. In the present embodiment, the first cavity 11 and the second cavity 12 are not formed on the substrate 1 hence different from the first embodiment. The thickness of the substrate 1 ranges between 0.2 and 1.5 mm. The substrate 1 contains glass epoxy resin and has a front 141, four substrate laterals 142-145 and a back 146. The front 141, the substrate laterals 142-145 and the back 146 are the same as the first embodiment, thereby omitting their descriptions.

Figure 38:
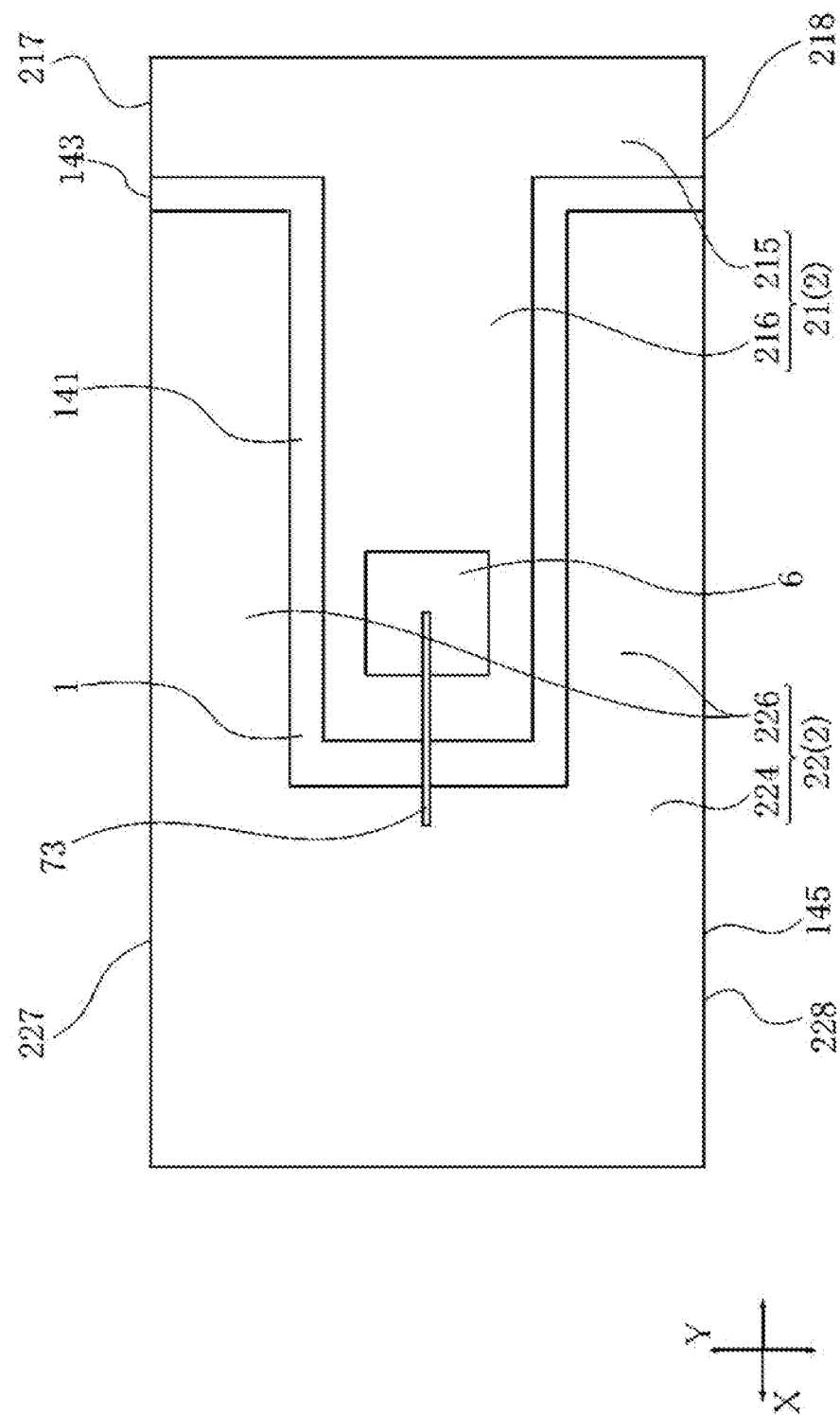
FIG. 38 is a plane view of FIG. 33, with the illustration of the lens and the bonding layer omitted.
Figure 39:
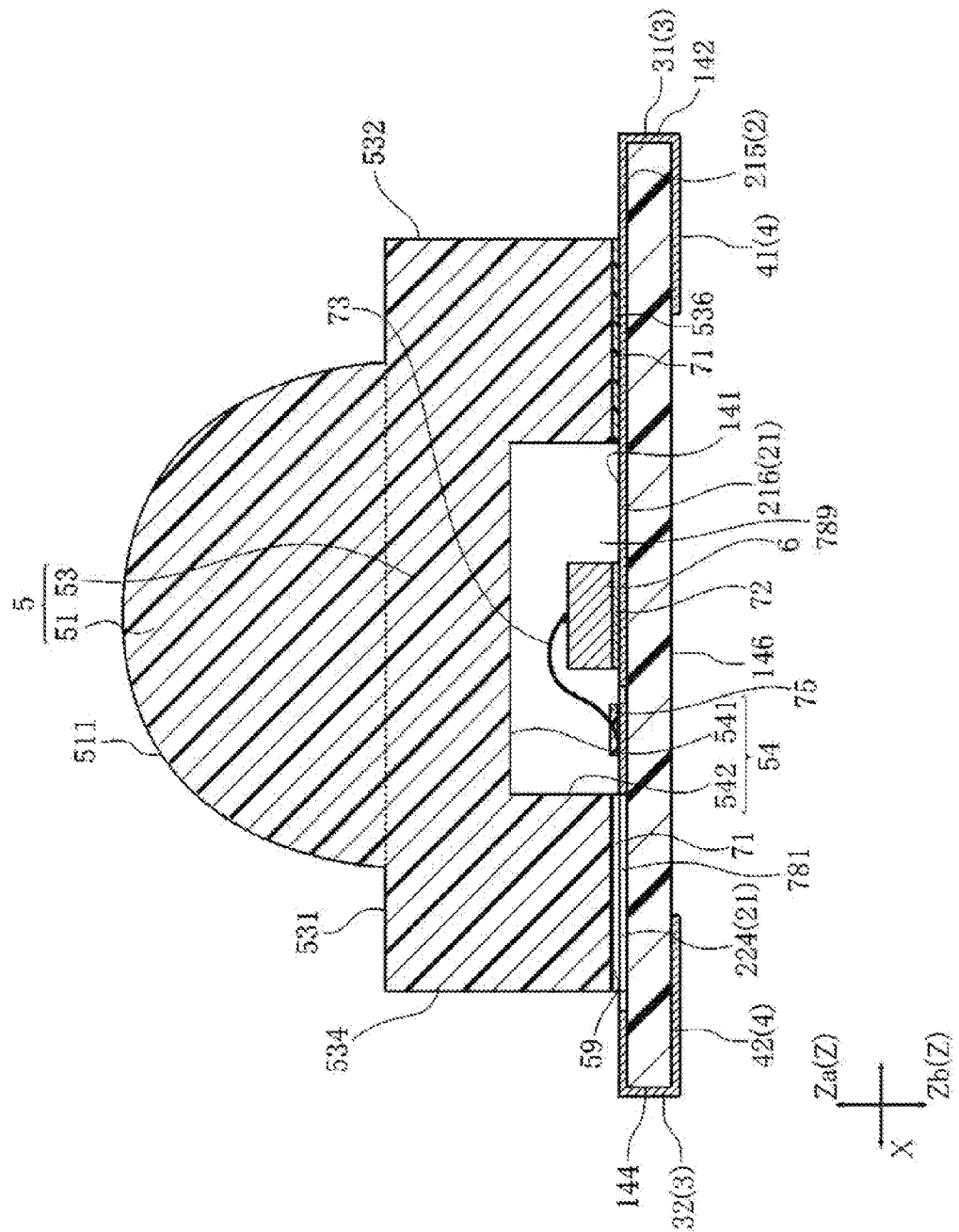
FIG. 39 is a diagram illustrating a special example of the vent hole.

As illustrated in FIG. 38, the front conductor layer 2 is formed on the front 141 of the substrate 1. The front conductor layer 2 is composed of a Cu layer, a Ni layer and an Au layer, which are stacked on the substrate 1 in sequence. The front conductor layer 2 comprises a first front electrode 21 and a second front electrode 22. The first front electrode 21 and the second front electrode 22 are respectively located at the right side and the left side of FIG. 38. Additionally, the first front electrode 21 and the second front electrode 22 are spaced apart from each other and insulated from each other.

The first front electrode 21 has a bonding pad portion 216 and a strip portion 215. The bonding pad portion 216 is rectangular in shape shown in the vertical view. The LED chip 6 is bonded on the bonding pad portion 216 via the bonding layer 72. The strip portion 215 is formed on one end of the front 141 in the direction X and extended along the direction Y. The strip portion 215 connects to the bonding pad portion 216 and the first lateral electrode 31.

The second front electrode 21 has a strip portion 224 and two extending portions 226. The strip portion 224 is formed on one end of the substrate 1 in the direction X and extended along the direction Y. The strip portion 224 connects to the second lateral electrode 32. The metal wire 73 is bonded onto the strip portion 224. Each of the extending portions 226 is extended from the strip portion 224 toward the direction X and disposed in a position spaced apart from the bonding pad portion 216 in the direction Y.

In the present embodiment, the front conductor layer 2, the lateral conductor layer 3 and the back conductor layer 4 are composed of a Cu layer, a Ni layer and an Au layer, which are stacked on the substrate 1 in sequence hence the same as the first embodiment. Furthermore, the front conductor layer 2, the lateral conductor layer 3 and the back conductor layer 4 are formed by printing on the substrate 1, which is different from the use of the laser patterning method in the first embodiment.

The lens 5 comprises a convex part 51 and a base part 53. The convex part 51 is the same as the first embodiment, thereby omitting its descriptions. The base part 53 has a first surface 531, four lens laterals 532-535 and a second surface 536. The first surface 531 and the lens laterals 532-535 are the same as the first embodiment, thereby omitting their descriptions. The base part 53 has a lens cavity 54 formed thereon, which dents from the second surface 536 toward the direction Za that is defined from the substrate 1 toward the LED chip 6 and is contained in the thickness direction Z of the substrate 1 to accommodate the LED chip 6.

The second surface 536 faces the opposite side as the first surface 531. The second surface 536 is planar in shape and also has a frame shape showing in the vertical view. The second surface 536 is a bonding surface connecting to the bonding layer 71. In the present embodiment, the lens 5 has a groove 59 formed thereon, which dents from the second surface 536 toward the direction Za.

The lens cavity 54 has a light incident surface 541 and a cavity lateral 542. The light incident surface 541 faces the LED chip 6 and is planar in shape that extends toward the XY plane (perpendicular to the optical axis of the lens 5). The light incident surface 541 receives the light emitted from the LED chip 6 and is located between the light output surface 511 and the LED chip 6. The light incident surface 541 is spaced apart from the LED chip 6 in the direction Za that is defined from the substrate 1 toward the LED chip 6 and is contained in the thickness direction Z. The cavity lateral 542 has a shape of surrounding the LED chip 6. The cavity lateral 542 inclines opposite to the direction Z (as shown in a zoom view of FIG. 36) and expands toward an opening of the lens cavity 54. A gap 789 is formed among the light incident surface 541, the cavity lateral 542 and the substrate 1, which is clipped between the lens 5 and the substrate 1. The light incident surface 541, the LED chip 6 and the metal wire 73 are exposed in the gap 789. Moreover, the depth of the lens cavity 54 (as the spacing distance between the first surface 536 and the light incident surface 541 in the direction Z) ranges between 0.5 and 1.5 mm.

As illustrated in FIG. 36, there is a vent hole 781 formed on the light emitting device 201. The vent hole 781 communicates with a space (the exterior space of the light emitting device 201) corresponding to the gap 789 and the light output surface 511. Therefore, the air can pass the vent hole 781 and flow between the gap 789 and the exterior space of the light emitting device 201. Furthermore, the vent hole 781 is formed and located between the lens 5 and the substrate 1. In the present embodiment, the vent hole is defined by the groove 59. In another embodiment, the vent hole 781 can be defined without the use of the groove 59. For example, without forming the groove on the lens 5, a spacing formed on the front conductor layer 2 can used to define the vent hole 781 (referring to FIG. 39).

The manufacturing method of the light emitting device 201 is described below with reference to FIGS. 40-45.

Figure 40:
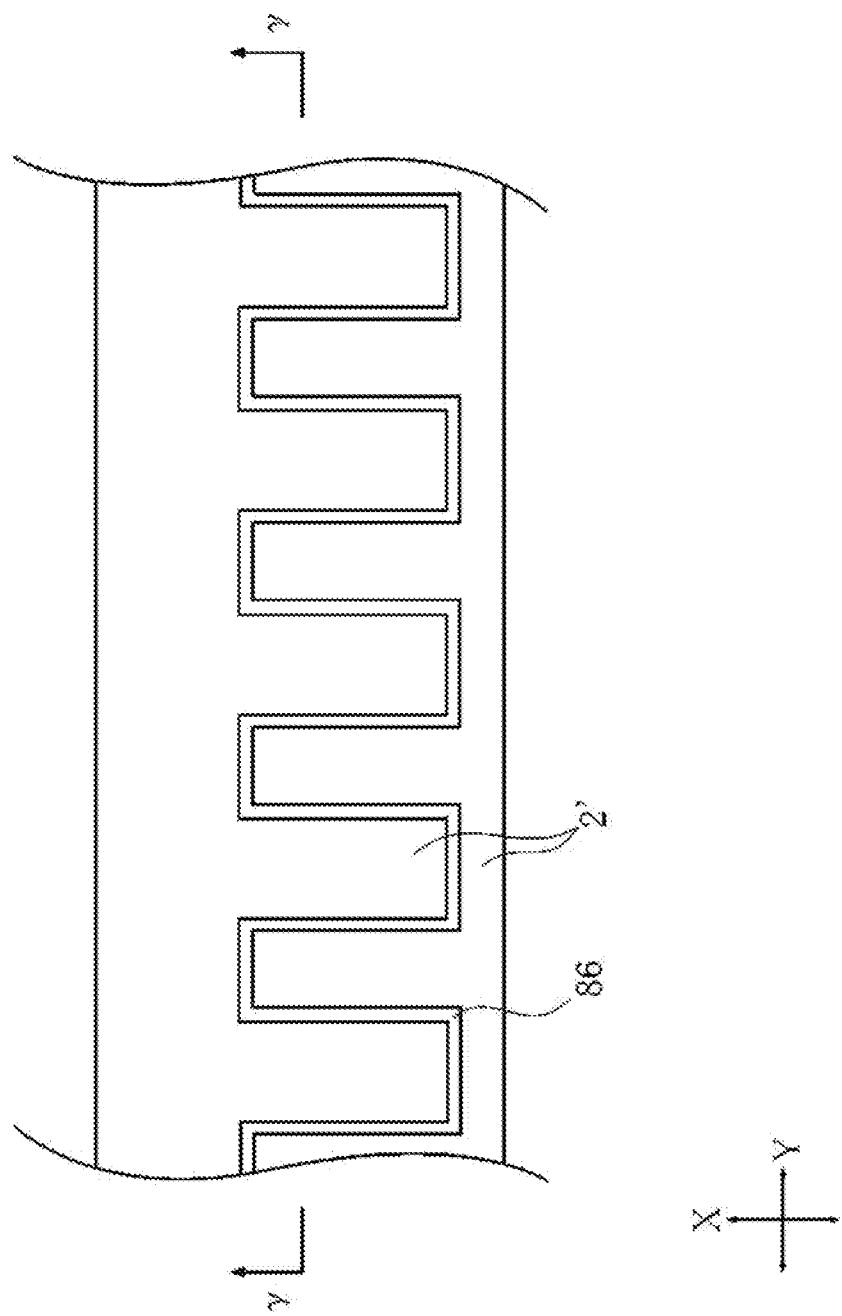
FIG. 40 is a plane view illustrating a main portion in a step of a manufacturing method of the light emitting device according to the second embodiment of the present disclosure.
Figure 41:
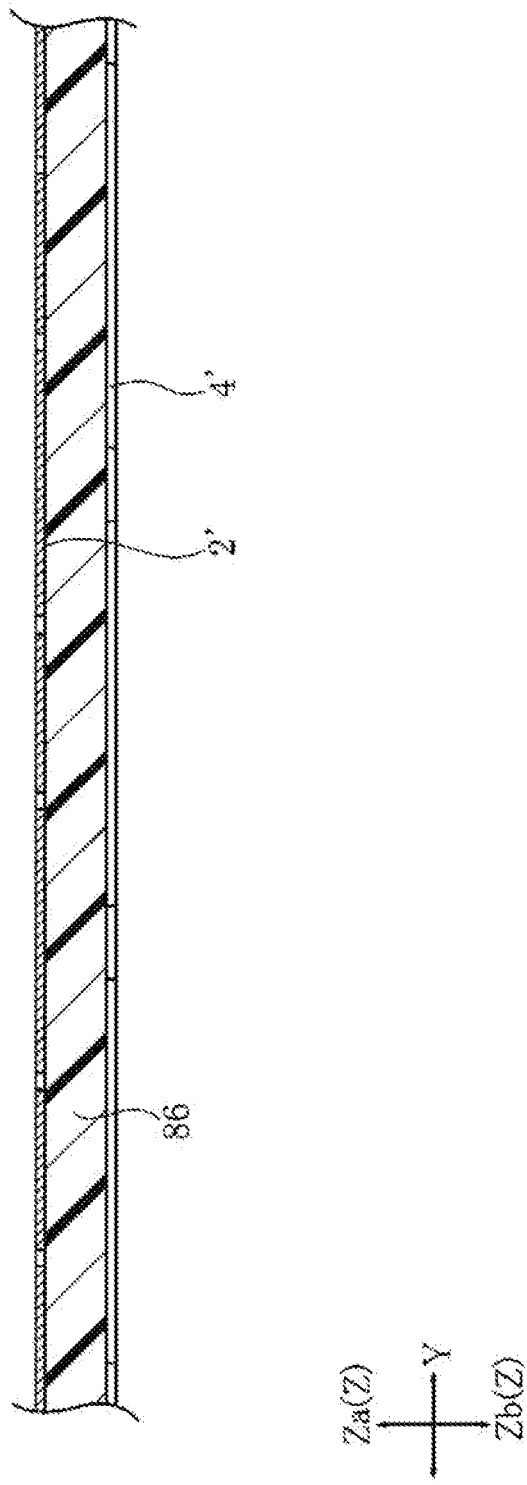
FIG. 41 is a sectional view of the main portion taken along lines γ-γ of FIG. 40.

As illustrated in FIGS. 40 and 41, a base material 86 extended in the direction Y is prepared. Then a front conductor layer 2', a lateral conductor layer 3' and a back conductor layer 4' are formed on the base material 86 by printing.

Figure 42:
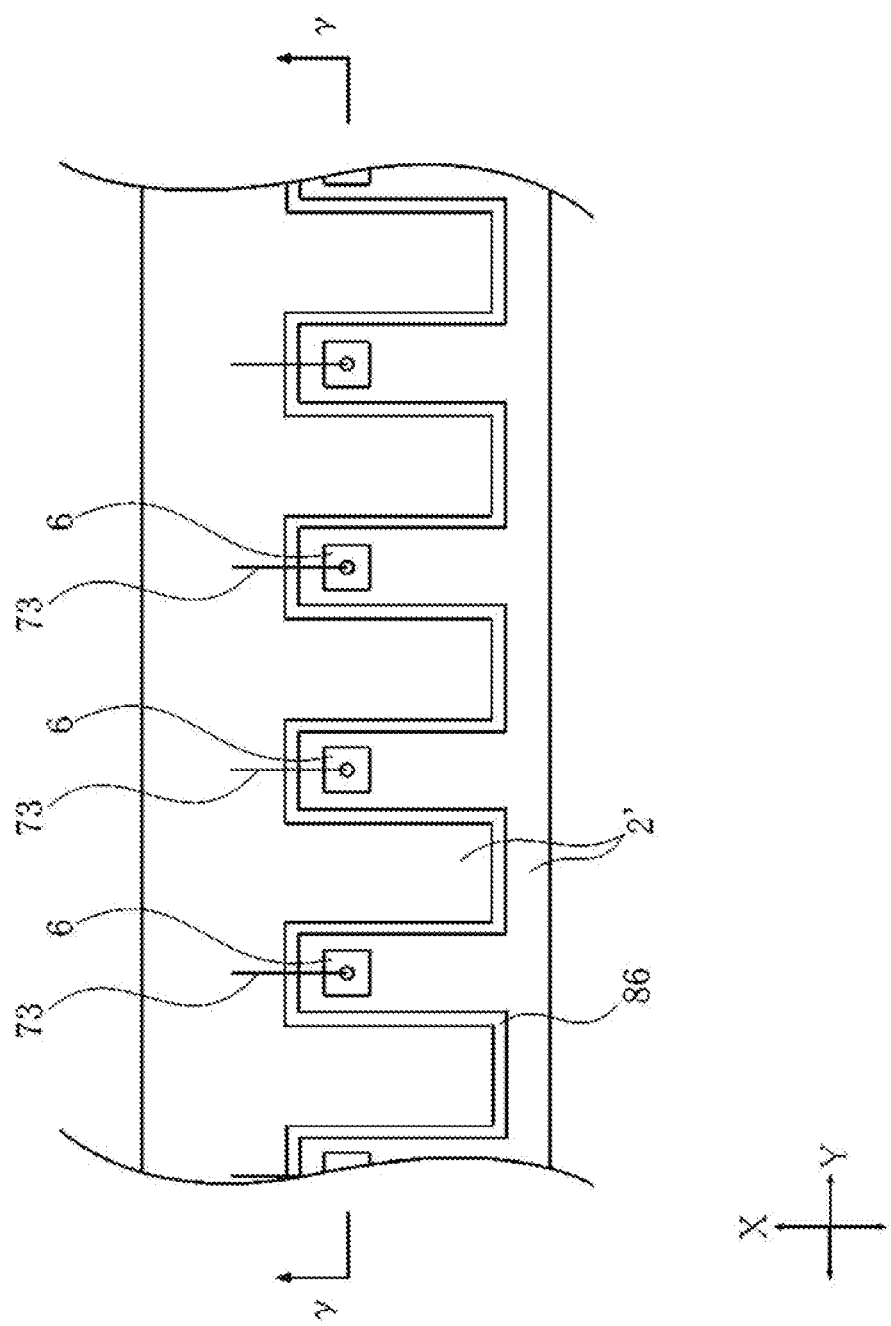
FIG. 42 is a plane view illustrating a main portion in the step after the step shown in FIG. 40.
Figure 43:
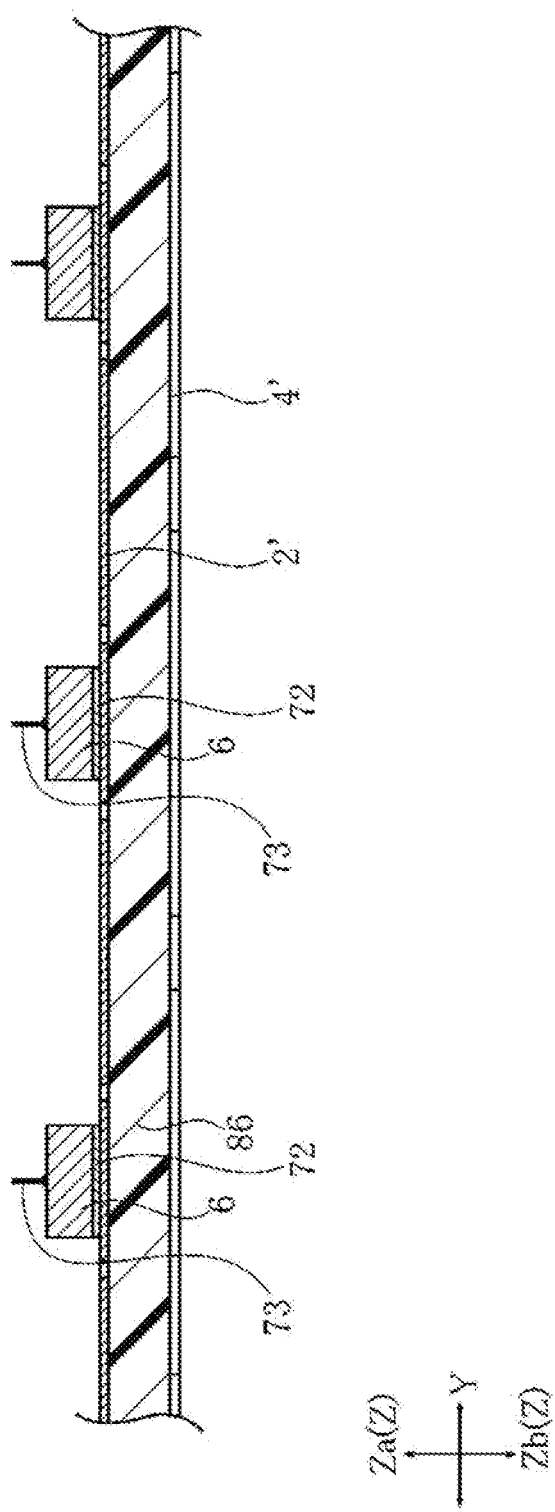
FIG. 43 is a sectional view of the main portion taken along lines γ-γ of FIG. 42.

As illustrated in FIGS. 42 and 43, pluralities of the LED chip 6 are bonded to the base material 86 via the front conductor layer 2'. The LED chips 6 are arranged on the base material 86 along the direction Y. Then the metal wire 73 connects to the LED chip 6.

Figure 44:
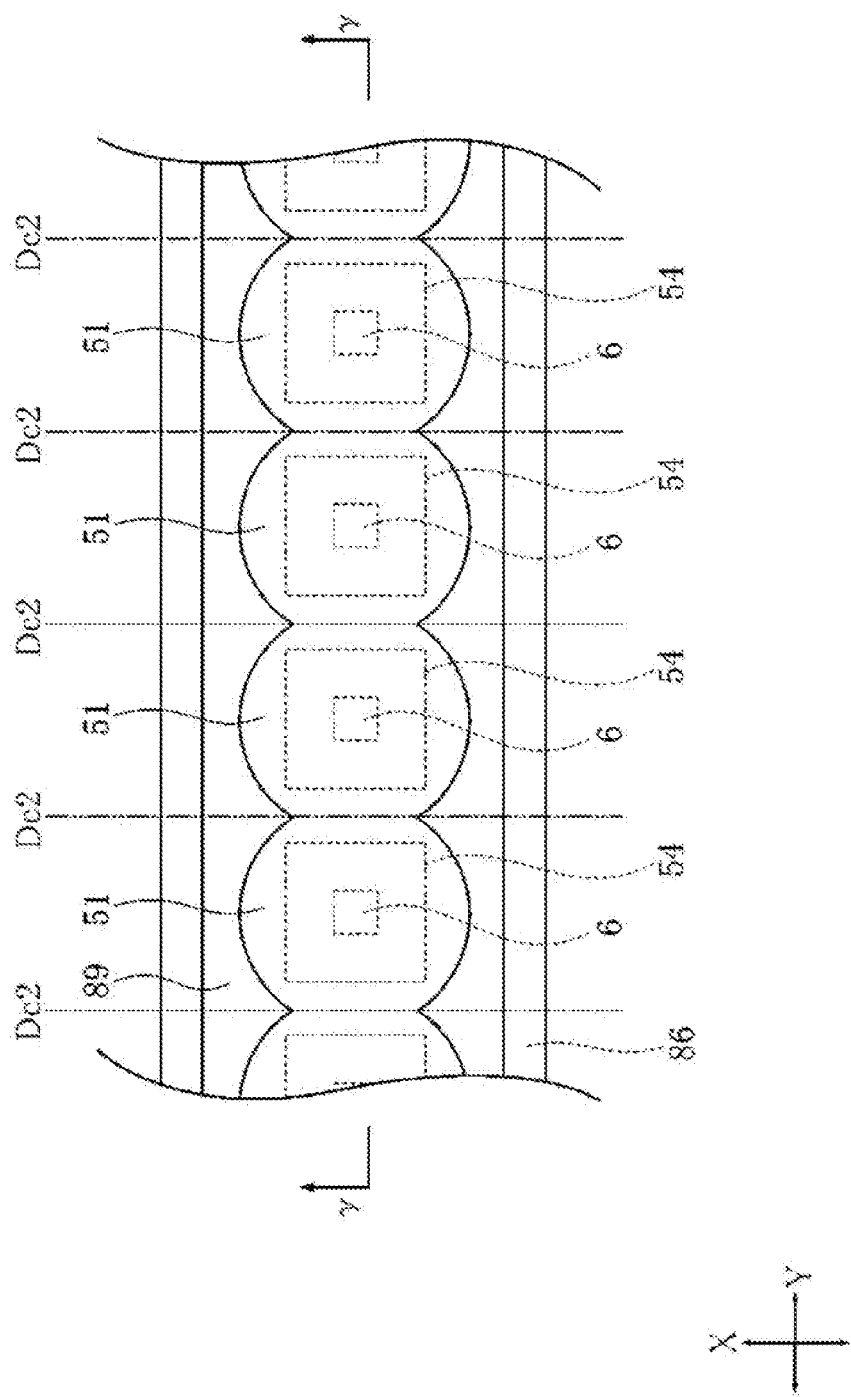
FIG. 44 is a plane view illustrating a main portion in the step after the step shown in FIG. 42.
Figure 45:
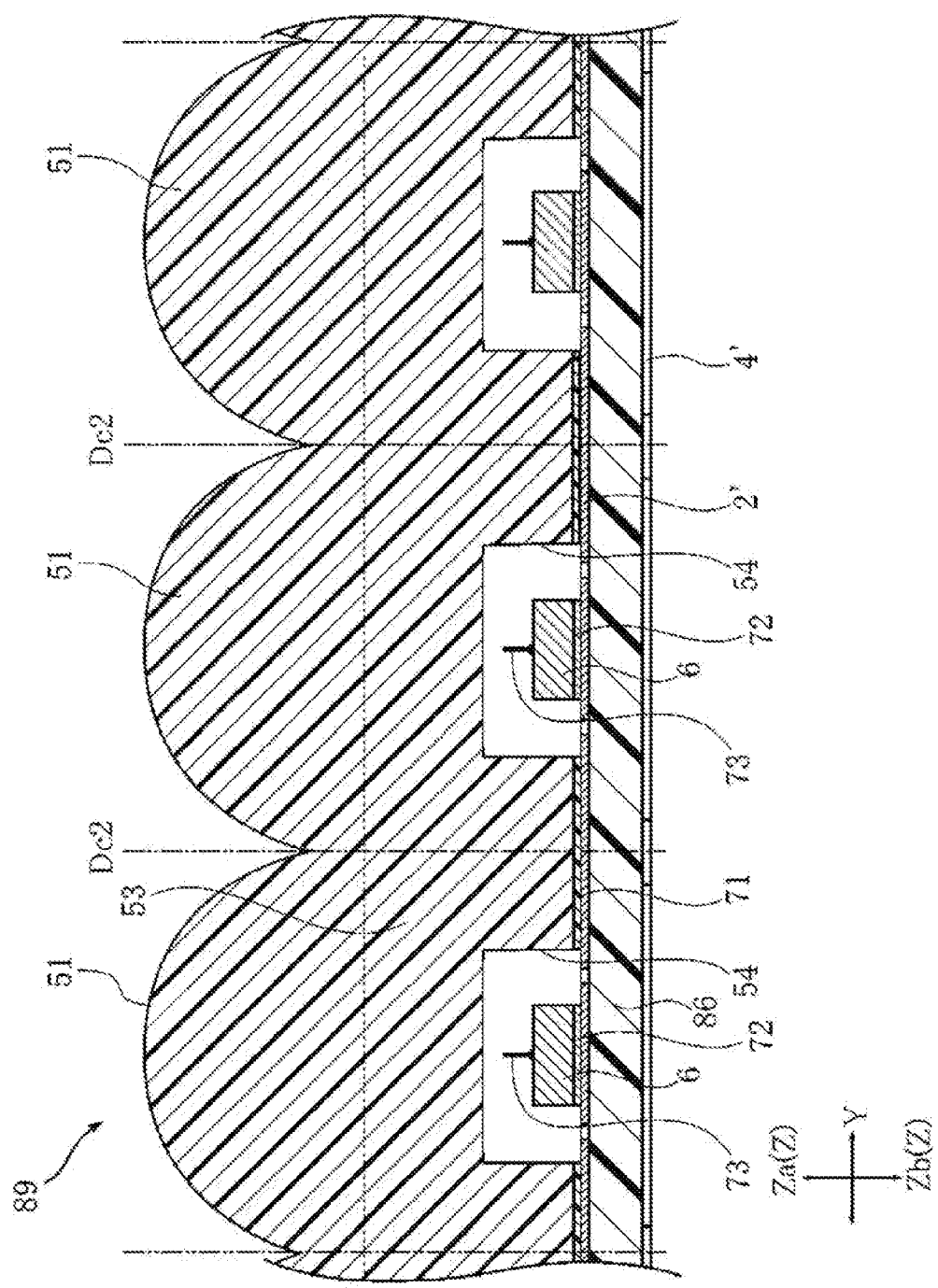
FIG. 45 is a sectional view of the main portion taken along lines γ-γ of FIG. 44.

As illustrated in FIGS. 44 and 45, a lens base 89 with a plurality of convex parts 51 is formed in advance. Then the lens base 89 is bonded to the base material 86. In the present embodiment, pluralities of the lens cavities 54 are formed on the lens base 89 before bonding the lens base 89 and the base material 86. The bonding of the lens base 89 and the base material 86 is performed on condition of superimposing each of the convex parts 51 on each of the LED chips 6 in XY vertical view and keeping a gap between each of the LED chips 6 and the lens base 89.

Next, the base material 86, the front conductor layer 2', the lateral conductor layer 3', the back conductor layer 4' and the lens base 89 are cut at a time along a cutting surface Dc2 intersecting the direction Y to complete the manufacturing of the light emitting device 201. By cutting the base material 86, the front conductor layer 2', the lateral conductor layer 3', the back conductor layer 4' and the lens base 89, the laterals 143 and 145 of the substrate 1, the end surfaces 217, 218, 227, 228 of the front conductor layer 2, the end surfaces 311, 312, 321, 322 of the lateral conductor layer 3 and the end surfaces 411, 412, 421, 422 of the back conductor layer 4 can be formed, respectively.

The operating method of the optical device 802 (referring to FIG. 31) with the light emitting device 201 is the same as the first embodiment, thereby omitting its descriptions.

The effect of the present embodiment is described below.

The light emitting device 201 comprises a lens 5. The lens 5 has a light output surface 511 which bulges in the direction Za that is defined from the substrate 1 toward the LED chip 6 and is contained in the thickness direction Z of the substrate 1 to transmit the light emitted from the LED chip 6. This enables the light emitted from the LED chip 6 to refract through the light output surface 511, the radiant intensity in the direction Za to be enhanced and the angle of spread of the light emitted from the light emitting device 201 to be reduced.

If the radiant intensity in the direction Za is enhanced and/or the angle of spread of the light emitted from the light emitting device 201 is reduced, the intensity of the light reflected from the sensing target 993 and received by the light detecting component of the light receiving device 107 will be increased. Therefore, the sensing target 993 can be sensed factually while the sensing target 993 is opposite to the optical device 802. In this way, it can accurately know about whether the sensing target 993 is opposite to the optical device 802.

As illustrated in FIG. 36, in the light emitting device 201, the LED chip 6 is exposed in the gap 789 and is clipped between the substrate 1 and the lens 5. This is suitable way to reduce the contact area of the LED chip 6 and the lens 5. If the contact area of the LED chip 6 and the lens 5 can be reduced, the stress on the LED chip 6 induced by the lens 5 can be decreased. Therefore, the light emitting device 201 can prevent the LED chip 6 from being damaged due to the stress induced by the lens 5.

In the light emitting device 201, the light incident surface 541 is spaced apart from the LED chip 6 in the direction Za (upward-direction of FIG. 36) that is defined from the substrate 1 toward the LED chip 6 and is contained in the thickness direction Z. In this way, the LED chip 6 is not experiencing stress induced by the lens 5. Therefore, the light emitting device 201 can further prevent the LED chip 6 from being damaged due to the stress induced by the lens 5.

In the light emitting device 201, the lens 5 has a light incident surface 541 which is located between the light output surface 511 and the LED chip 6 to receive the light emitted from the LED chip 6. The light incident surface 541 is planar in shape that extends toward the XY plane (perpendicular to the optical axis of the lens 5). The light emitting from the LED chip 6 and entering the light incident surface 541 at an incident angle of θ3 (that it is not shown in the drawings and formed with the direction Z in the present embodiment) refracts through the light incident surface 541 and travels at an angle of refraction θ4 smaller than the incident angle of θ3 within the lens 5 toward the direction Za. Consequently, by enabling the light emitted from the LED chip 6 to refract through the light incident surface 541, the radiant intensity in the direction Za can be enhanced and the angle of spread of the light emitted from the light emitting device 201 can be reduced.

The light emitting device 201 forms a vent hole 781 which communicates with a space (the exterior space of the light emitting device 201) corresponding to the gap 789 and the light output surface 511. Since this is the same as the first embodiment, it is suitable to restrain a breakdown induced by the lens 5 separating from the substrate 1 due to the pressure inside the gap 789 when risen.

While the bonding layer 71 contains bonding sheet material, the light emitting device 201 can restrain the radiant intensity in the direction Za from being reduced and easily dispose the lens 5 on the substrate 1 since it is the same as the first embodiment.

While the bonding layer 71 uses the thermosetting sheet material, a breakdown induced by the lens 5 is separated from the substrate 1 can be restrained in the reflow step since it is the same as the first embodiment.

While the bonding layer 71 contains liquid adhesive, an anchor effect can be used to bond the front conductor layer 2 and the lens 5 tightly.

The light emitting device 201 is suitable to restrain the deckle edge on the end surfaces 411, 412, 421, 422 from being produced since it is the same as the first embodiment.

In the light emitting device 201, the light incident surface 541 is planar in shape. Since it is the same as the first embodiment, it's not likely to produce the breakdown induced by the displacement of the LED chip 6.

First special example of the light emitting device according to the second embodiment is described below with reference to FIG. 46.

Figure 46:
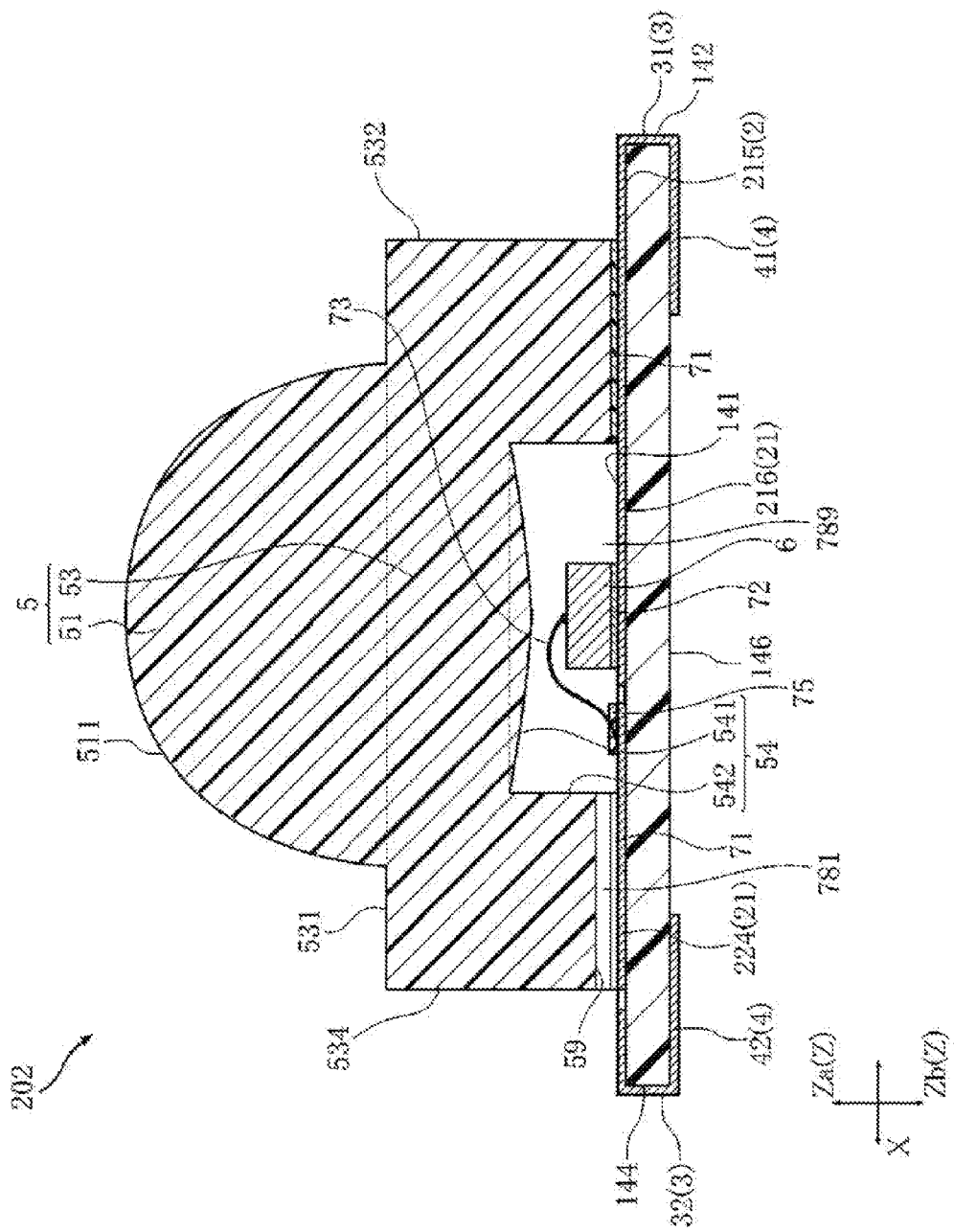
FIG. 46 is a sectional view illustrating a first special example of the light emitting device according to the second embodiment of the present disclosure.

FIG. 46 is a sectional view illustrating a first special example of the light emitting device according to the second embodiment of the present disclosure.

The difference between the light emitting device 202 showing in FIG. 46 and the light emitting device 201 mentioned above is that the light incident surface 541 becomes a convex surface which bulges in the opposite side (the same applies to the first cavity 11 in the present embodiment) as the direction Za. The light incident surface 541 is rotationally symmetrical in shape while the line extended along the direction Z is used as the axis. According to the light emitting device 202, by enabling the light emitted from the LED chip 6 to refract through the light incident surface 541 as a convex surface, the radiant intensity in the direction Za can be enhanced and the angle of spread of the light emitted from the light emitting device 202 can be reduced.

Second special example of the light emitting device according to the second embodiment is described below with reference to FIG. 47.

Figure 47:
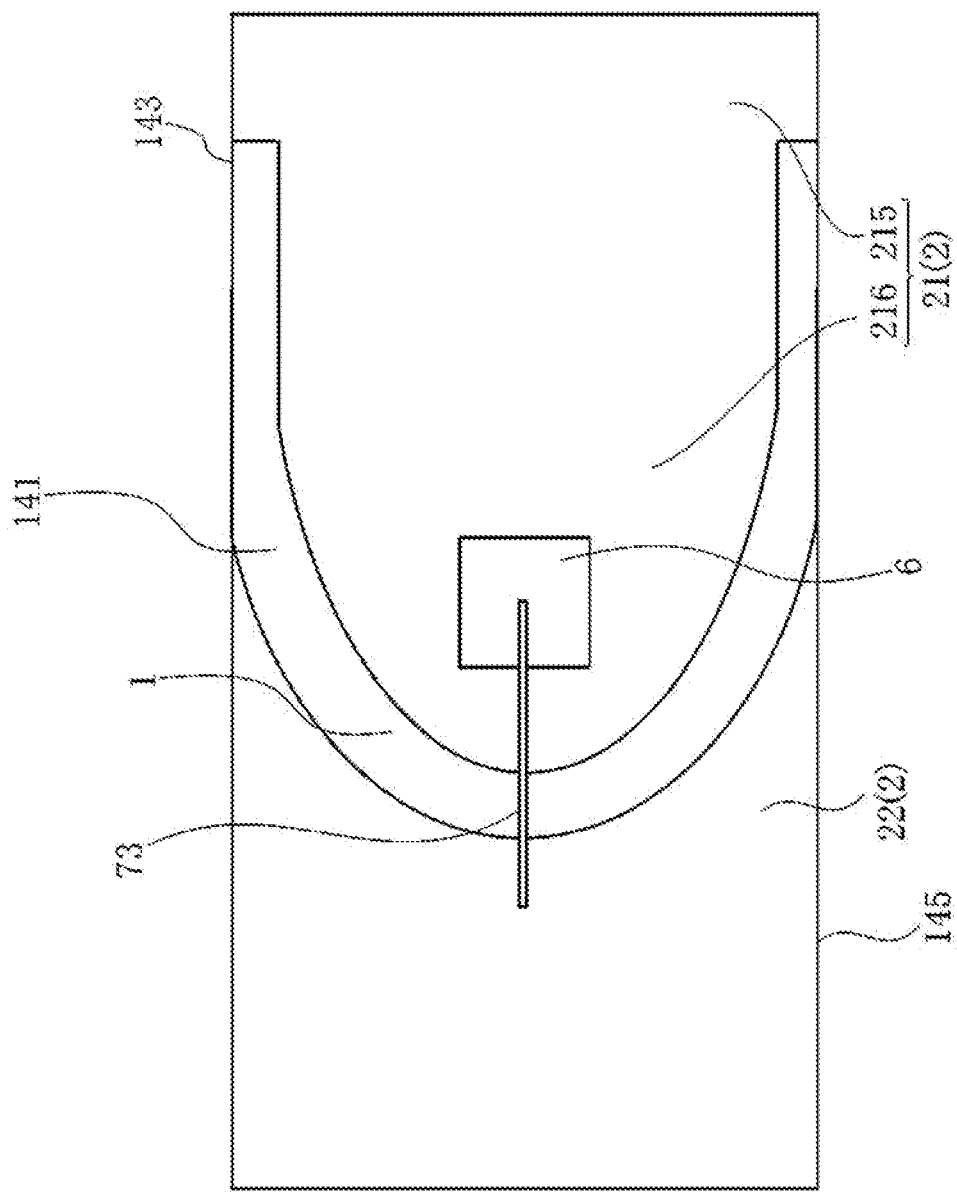
FIG. 47 is a plane view illustrating a second special example of the light emitting device according to the second embodiment of the present disclosure, with the illustration of the lens and the bonding layer omitted.

FIG. 47 is a plane view illustrating a second special example of the light emitting device according to the second embodiment of the present disclosure, with the illustration of the lens and the bonding layer omitted.

The difference between this special example and the light emitting device 201 mentioned above is that the bonding pad portion 216 has a semi-circular portion and is not rectangular in shape. The bonding pad portion 216 can better reflect the light emitted from the LED chip 6. Consequently, the radiant intensity in the direction Za can be enhanced and the angle of spread of the light emitted from the light emitting device 203 can be reduced.

Third special example of the light emitting device according to the second embodiment is described below with reference to FIG. 48.

Figure 48:
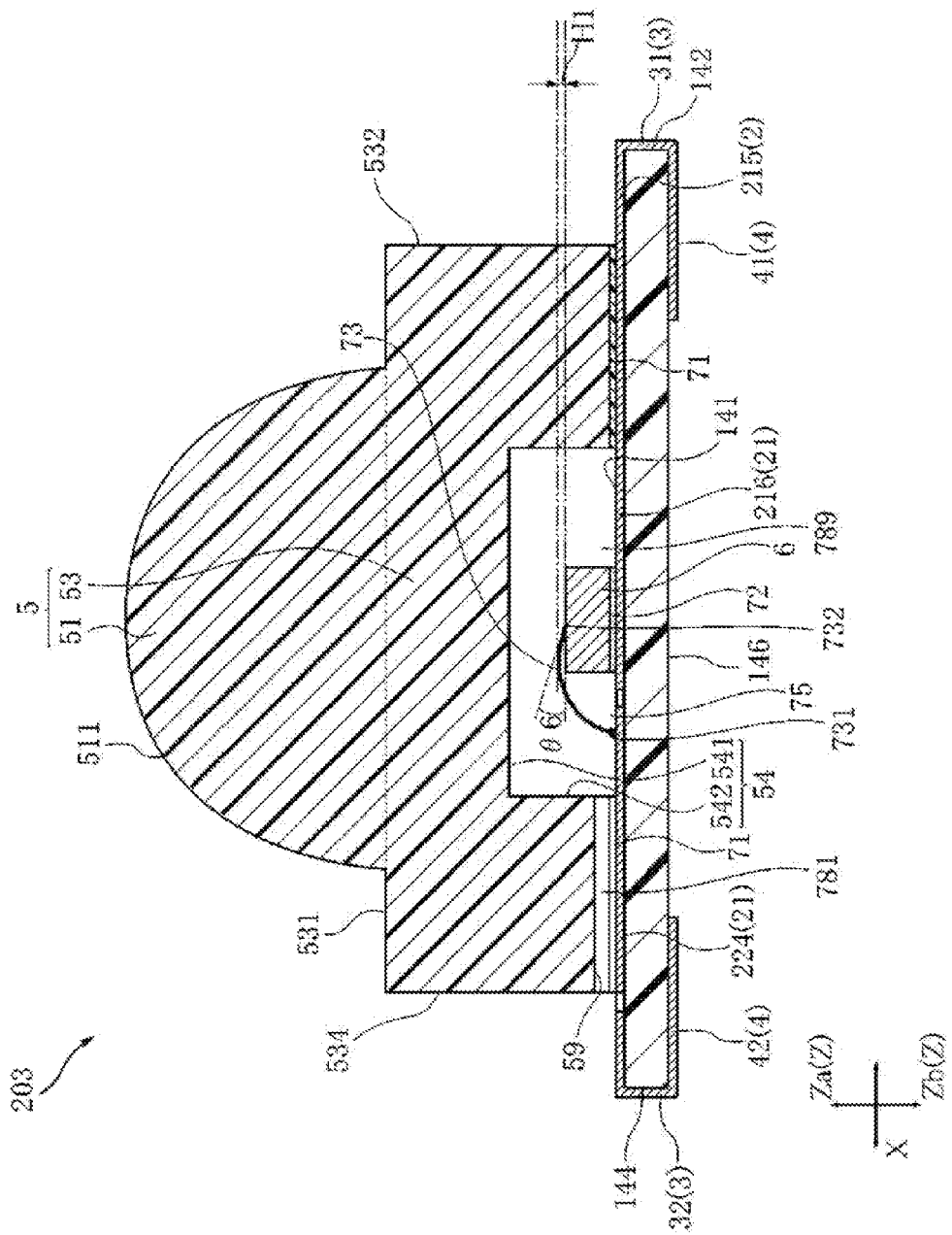
FIG. 48 is a sectional view illustrating a third special example of the light emitting device according to the second embodiment of the present disclosure.
Figure 49:
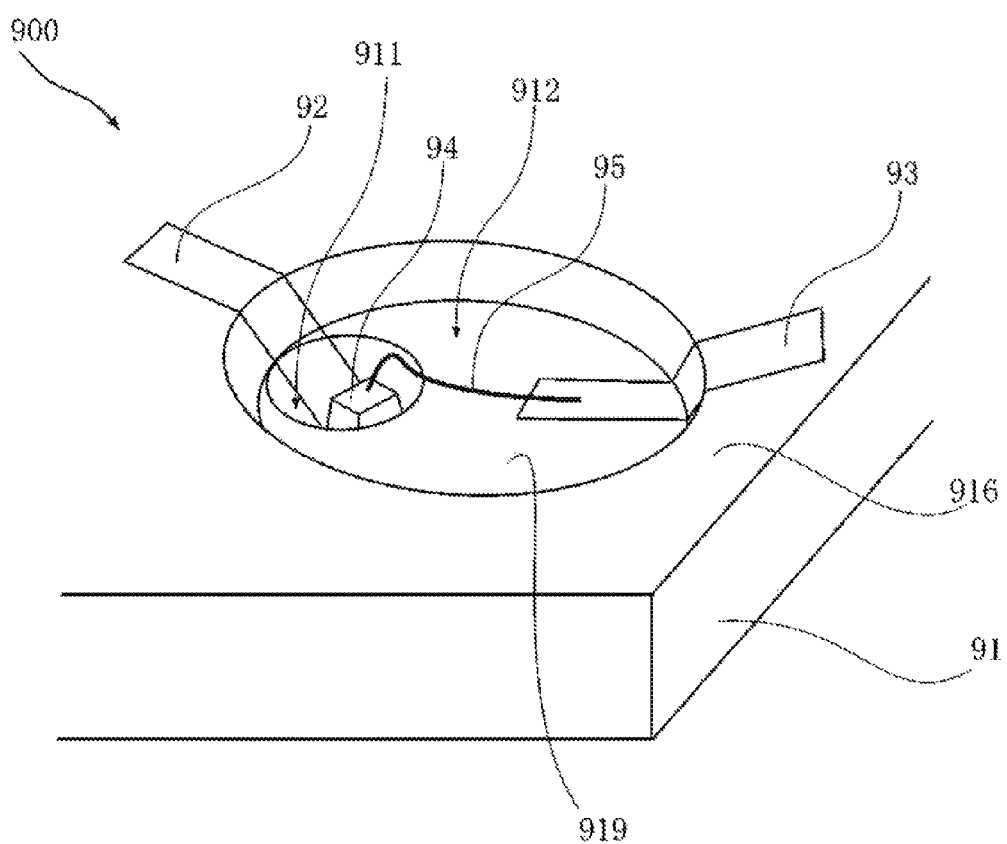
FIG. 49 is a perspective view illustrating an example of the existing light emitting device.
Figure 50:
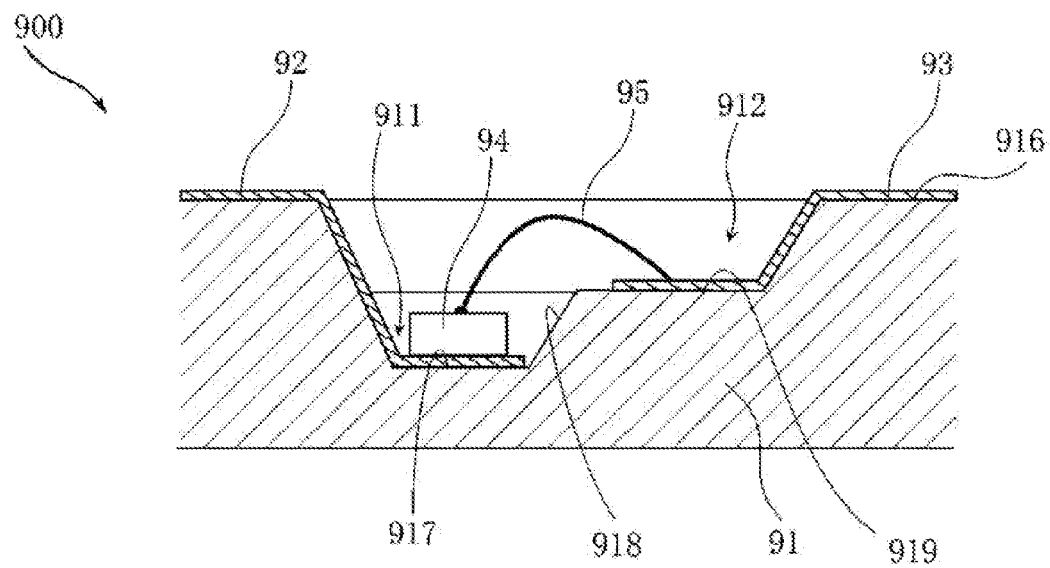
FIG. 50 is a sectional view of a main portion of the light emitting device shown in FIG. 49.

FIG. 48 is a sectional view illustrating a third special example of the light emitting device according to the second embodiment of the present disclosure.

The difference between the light emitting device 203 showing in FIG. 48 and the light emitting device 201 mentioned above is that the metal wire 73 has a first bonding portion 731 connecting to the front conductor layer 2 and a second bonding portion 732 connecting to the LED chip 6. While manufacturing the light emitting device 203, one end of the metal wire 73 connects to the front conductor layer 2 first and then the other end of the metal wire 73 connects to the LED chip 6. Moreover, in the above light emitting devices 101 and 201, one end of the metal wire 73 connects to the LED chip 6 first, and then the other end of the metal wire 73 connects to the front conductor layer 2.

While the metal wire 73 connects to the LED chip 6 in this special example, the angle of θ6 formed between the metal wire 73 near the second bonding portion 732 and the XY plane becomes smaller. Therefore, the height H1 showing in FIG. 48 and the spacing distance between the LED chip 6 and the light incident surface 541 can be further reduced. If the spacing distance is smaller, more of the light emitted from the LED chip 6 can enter the light incident surface 541. Consequently, the radiant intensity in the direction Za can be enhanced.

Moreover, the lens 5 of the light emitting device 201 can have the conical portion 52 as the lens 5 used in the above light emitting device 103.

While several embodiments of the present disclosure have been illustrated and described, various modifications and improvements can be made by those skilled in the art. The embodiments of the present disclosure are therefore described in an illustrative but not in a restrictive sense. It is intended that the present disclosure should not be limited to the particular forms as illustrated and that all modifications which maintain the spirit and scope of the present invention are within the scope defined in the appended claims.

What is claimed is:

1. A light emitting device, comprising:
   an integrally molded substrate having an upper surface, a concave part defined in the upper surface, and a first substrate lateral facing one side of an orthogonal direction with respect to the direction that is defined from the substrate toward the LED chip and is contained in the thickness direction of the substrate;
   a wiring pattern at least formed on the upper surface and the concave part;
   an LED chip bonded to the concave part;
   a metal wire connecting to the LED chip;

a back conductor layer formed on one side of the substrate that is opposite to the side of disposing the LED chip and comprising an end surface facing the same side as the first substrate lateral, and the end surface having a portion spaced apart from the first substrate lateral and another portion located on the same plane as the first substrate lateral; and a back covering portion covering the back conductor layer;

wherein the substrate has a first cavity formed thereon having a first bottom surface for disposing the LED chip and a first lateral connecting to the first bottom surface, and the substrate has a second cavity formed thereon having a second bottom surface for bonding the metal wire and a second lateral connecting to the second bottom surface; and the first lateral has a notch formed thereon, which connects to the second bottom surface and the second lateral, and an area of the second bottom surface of the second cavity is smaller than that of the first bottom surface of the first cavity.

2. The light emitting device as claimed in claim 1, wherein the substrate comprises a second substrate lateral facing the opposite side as the first substrate lateral.

3. The light emitting device as claimed in claim 1, further comprising a front conductor layer formed on the substrate, which has a spacing formed thereon for defining a vent hole.

4. The light emitting device as claimed in claim 1, wherein the end surface comprises another portion located on the same plane as the first substrate lateral.

5. The light emitting device as claimed in claim 1, further comprising:

a front conductor layer formed on the substrate;
the metal wire bonded to the front conductor layer and the LED chip; and
a protective layer covered a bonding position of the metal wire and the front conductor layer.

6. The light emitting device as claimed in claim 1, further comprising:

a front conductor layer formed on the substrate;
wherein the metal wire has a first bonding portion connecting to the front conductor layer and a second bonding portion connecting to the LED chip.

7. The light emitting device as claimed in claim 1, wherein the LED chip emits infrared light.

8. The light emitting device as claimed in claim 1, wherein the LED chip includes a first end directly bonded to a first bottom electrode formed on the first bottom surface and a second end wire-bonded, via the metal wire, to a second bottom electrode formed on the second bottom surface.

9. The light emitting device as claimed in claim 1, wherein the first and second cavities are positioned side by side, the first cavity has a paraboloidal or pyramidal shape and the first bottom surface has a circular shape, and the second cavity has a shape of pyramidal holder or conical holder and the second bottom surface has a rectangular shape.

10. An optical device, comprising:
a light emitting device as claimed in claim 1;
a circuit substrate; and
a solder layer used to bond the light emitting device and the circuit substrate together.

11. The optical device as claimed in claim 10, further comprising a light receiving device installed on the circuit substrate.

* * * * *